US010153439B2

(12) United States Patent
Nakaie et al.

(10) Patent No.: US 10,153,439 B2
(45) Date of Patent: Dec. 11, 2018

(54) CHARGE TRANSPORT MATERIAL

(71) Applicant: NISSAN CHEMICAL INDUSTRIES, LTD., Tokyo (JP)

(72) Inventors: Naoki Nakaie, Funabashi (JP); Taichi Nakazawa, Funabashi (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 0 days.

(21) Appl. No.: 15/328,405

(22) PCT Filed: Jul. 21, 2015

(86) PCT No.: PCT/JP2015/070637
§ 371 (c)(1),
(2) Date: Jan. 23, 2017

(87) PCT Pub. No.: WO2016/013533
PCT Pub. Date: Jan. 28, 2016

(65) Prior Publication Data
US 2017/0213986 A1 Jul. 27, 2017

(30) Foreign Application Priority Data

Jul. 23, 2014 (JP) .................................. 2014-150227
Feb. 17, 2015 (JP) .................................. 2015-028392

(51) Int. Cl.
| | | |
|---|---|---|
| H01L 51/00 | (2006.01) |
| H01L 51/50 | (2006.01) |
| H01L 51/56 | (2006.01) |
| C09K 11/06 | (2006.01) |
| C09D 5/24 | (2006.01) |
| H05B 33/10 | (2006.01) |

(52) U.S. Cl.
CPC ............ *H01L 51/0072* (2013.01); *C09D 5/24* (2013.01); *C09K 11/06* (2013.01); *H01L 51/0061* (2013.01); *H01L 51/0068* (2013.01); *H01L 51/0094* (2013.01); *H01L 51/50* (2013.01); *H05B 33/10* (2013.01); *C09K 2211/1007* (2013.01); *C09K 2211/1059* (2013.01); *C09K 2211/185* (2013.01); *H01L 51/0003* (2013.01); *H01L 51/5088* (2013.01); *H01L 51/56* (2013.01); *H01L 2251/558* (2013.01)

(58) Field of Classification Search
CPC .. C09D 5/24; C09K 11/06; C09K 2211/1007; C09K 2211/1059; C09K 2211/185; H01L 2251/558; H01L 51/0003; H01L 51/0061; H01L 51/0068; H01L 51/0072; H01L 51/0094; H01L 51/5088; H01L 51/56
See application file for complete search history.

(56) References Cited

U.S. PATENT DOCUMENTS

| | | |
|---|---|---|
| 2002/0158242 A1 | 10/2002 | Son et al. |
| 2008/0029742 A1 | 2/2008 | Yoshimoto et al. |
| 2010/0159279 A1 | 6/2010 | Kato et al. |
| 2010/0230639 A1 | 9/2010 | Yamada et al. |
| 2011/0195355 A1 | 8/2011 | Nakaie et al. |
| 2011/0233531 A1 | 9/2011 | Ko et al. |
| 2013/0112951 A1 | 5/2013 | Xia et al. |
| 2014/0183494 A1 | 7/2014 | Kam et al. |
| 2014/0319507 A1 | 10/2014 | Yamamoto et al. |
| 2016/0020406 A1 | 1/2016 | Pu et al. |

FOREIGN PATENT DOCUMENTS

| | | | |
|---|---|---|---|
| JP | 2003-519432 A | 6/2003 | |
| JP | 2013-527557 | * 6/2013 | ............. C09K 11/06 |
| JP | 2013-527557 A | 6/2013 | |
| JP | 2014-33008 A | 2/2014 | |
| JP | 2014-131057 A | 7/2014 | |
| JP | 2015-153864 A | 8/2015 | |
| WO | WO 2006/025342 A1 | 3/2006 | |
| WO | WO 2008/032616 A1 | 3/2008 | |
| WO | WO 2008/129947 A1 | 10/2008 | |
| WO | WO 2010/041701 A1 | 4/2010 | |

(Continued)

OTHER PUBLICATIONS

International Search Report for PCT/JP2015/070637 (PCT/ISA/210) dated Sep. 29, 2015.

(Continued)

*Primary Examiner* — Erich A Leeser
(74) *Attorney, Agent, or Firm* — Birch, Stewart, Kolasch & Birch, LLP

(57) ABSTRACT

A charge transport material containing a charge transport substance that is composed of a compound represented by formula (1) and another charge transport substance that is composed of a charge transport compound having a molecular weight of 200-9,000 exhibits good solubility in an organic solvent. A charge transport varnish, from which a charge transport thin film having excellent charge transport properties, flatness and uniformity is formed with good reproducibility, is able to be prepared by dissolving the above-described charge transport material in an organic solvent.

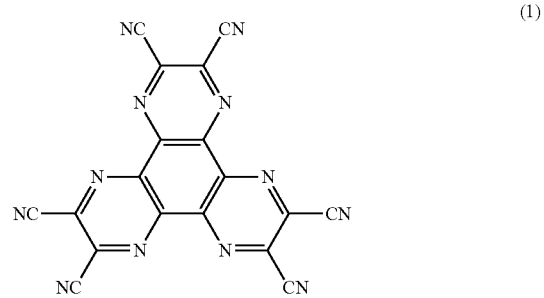

(1)

9 Claims, 3 Drawing Sheets

(56) References Cited

FOREIGN PATENT DOCUMENTS

| WO | WO 2010/058777 | A1 | | 5/2010 | | |
|----|----------------|----|---|--------|---|---|
| WO | WO 2013/077344 |    | * | 5/2013 | ............. | H01L 51/50 |
| WO | WO 2013/077344 | A1 |   | 5/2013 | | |
| WO | WO 2013/122182 | A1 |   | 8/2013 | | |
| WO | WO 2014/097813 | A1 |   | 6/2014 | | |

OTHER PUBLICATIONS

Extended European Search Report dated Jan. 31, 2018, in European Patent Application No. 15825133.0.

* cited by examiner

CHARGE TRANSPORT MATERIAL

TECHNICAL FIELD

This invention relates to a charge-transporting material.

BACKGROUND ART

Charge-transporting thin films made of organic compounds are used as light-emitting layers and charge-injecting layers in organic electroluminescent (EL) devices. In particular, a hole-injecting layer is responsible for transferring charge between an anode and a hole-transporting layer or a light-emitting layer, and thus serves an important function in achieving low-voltage driving and high brightness in organic EL devices.

Processes for forming the hole-injecting layer are broadly divided into dry processes such as vapor deposition and wet processes such as spin coating. Comparing these different processes, wet processes are better able to efficiently produce thin films having a high flatness over a large area. Hence, with the progress currently underway toward larger-area organic EL displays, there exists a desire for hole-injecting layers that can be formed by wet processes.

In view of these circumstances, the inventors have developed charge-transporting materials which can be used in various wet processes and which, when used to form hole-injecting layers for organic EL devices, are capable of achieving excellent EL device characteristics. The inventors have also developed compounds of good solubility in organic solvents for use in such charge-transporting materials (see, for example, Patent Documents 1 to 4).

However, improvements in wet process materials for hole-injection layers are constantly being demanded. In particular, there is a desire for wet process materials which give thin films having excellent charge transportability.

PRIOR ART DOCUMENTS

Patent Documents

Patent Document 1: WO 2008/032616
Patent Document 2: WO 2008/129947
Patent Document 3: WO 2006/025342
Patent Document 4: WO 2010/058777
Patent Document 5: JP-A 2014-33008

SUMMARY OF THE INVENTION

Problems to be Solved by the Invention

It is therefore an object of this invention to provide a charge-transporting material which has a good solubility in organic solvents and which, by being dissolved in an organic solvent, can be prepared into a charge-transporting varnish that reproducibly provides charge-transporting thin films of excellent charge transportability, flatness and uniformity.

Means for Solving the Problems

The inventors have conducted extensive investigations, as a result of which they have discovered that a charge-transporting material containing a charge-transporting substance consisting of dipyrazino[2,3-f:2',3'-h]quinoxaline-2,3,6,7,10,11-hexacarbonitrile and a charge-transporting substance consisting of a charge-transporting compound having a molecular weight of 200 to 9,000 exhibits a good solubility in organic solvents; that charge-transporting thin films of excellent charge transportability, flatness and uniformity can be reproducibly obtained from a varnish obtained by dissolving this charge-transporting material in an organic solvent; and that by using this thin film as a hole-injecting layer, organic EL devices of excellent brightness characteristics can be obtained.

Also, although Patent Document 5 discloses a coating liquid for organic EL devices in which dipyrazino[2,3-f:2',3'-h]quinoxaline-2,3,6,7,10,11-hexacarbonitrile is dissolved, a charge-transporting material containing a charge-transporting substance consisting of dipyrazino[2,3-f:2',3'-h]quinoxaline-2,3,6,7,10,11-hexacarbonitrile and a charge-transporting substance consisting of a charge-transporting compound having a molecular weight of 200 to 9,000 is not specifically disclosed.

Nor does this document contain any language which teaches or suggests that charge-transporting thin films having excellent charge transportability, flatness and uniformity can be reproducibly obtained from a varnish prepared by dissolving such a charge-transporting material in an organic solvent.

Accordingly, the invention provides:

1. A charge-transporting material which comprises a charge-transporting substance consisting of a compound of formula (1)

[Chemical Formula 1]

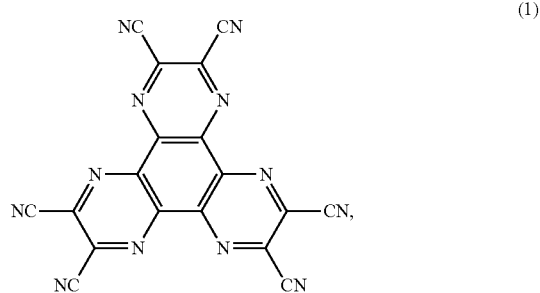 [SMILES: N#Cc1nc2c3nc(C#N)c(C#N)nc3c3nc(C#N)c(C#N)nc3c2nc1C#N]

and a charge-transporting substance consisting of a charge-transporting compound having a molecular weight of 200 to 9,000 (exclusive of a compound of formula (1));

2. The charge-transporting material of 1 above, wherein the charge-transporting compound is at least one compound selected from the group consisting of arylamine derivatives, thiophene derivatives and pyrrole derivatives;

3. The charge-transporting material of 1 or 2 above which further comprises a dopant substance;

4. A charge-transporting varnish which comprises the charge-transporting material of any one of 1 to 3 above and an organic solvent, wherein the charge-transporting material is dissolved in the organic solvent;

5. The charge-transporting varnish of 4 above which further comprises an organosilane compound;

6. A charge-transporting thin film produced using the charge-transporting varnish of 4 or 5 above;

7. An organic electroluminescent device comprising the charge-transporting thin film of 6 above;

8. A method of producing a charge-transporting thin film, which method is characterized by applying the charge-transporting varnish of 4 or 5 above onto a substrate, and drying the applied varnish;

9. A method for increasing the flatness of a charge-transporting thin film formed using a compound of formula (1)

[Chemical Formula 2]

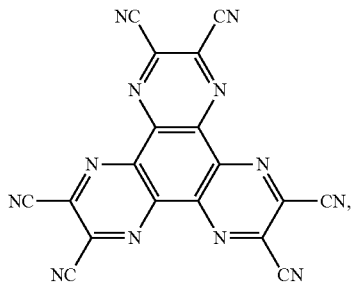

(1)

the method being characterized by using a charge-transporting varnish that includes a charge-transporting material containing a charge-transporting substance consisting of a compound of formula (1) and a charge-transporting substance consisting of a charge-transporting compound having a molecular weight of 200 to 9,000 (exclusive of a compound of formula (1)) and includes also an organic solvent, wherein the charge-transporting material is dissolved in the organic solvent; and 10. A method for reducing the driving voltage of an organic electroluminescent device having an anode, a cathode, and a plurality of functional layers situated between these electrodes that include a light-emitting layer, a hole-injecting layer and a hole-transporting layer, the method being characterized by using a charge-transporting varnish that includes a charge-transporting material containing a charge-transporting substance consisting of a compound of formula (1)

[Chemical Formula 3]

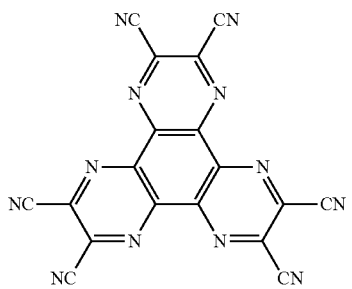

(1)

and a charge-transporting substance consisting of a charge-transporting compound having a molecular weight of 200 to 9,000 (exclusive of a compound of formula (1)) and includes also an organic solvent, wherein the charge-transporting material is dissolved in the organic solvent.

Advantageous Effects of the Invention

The charge-transporting material of the invention not only has a good solubility in organic solvents, it also exhibits an excellent charge transportability. Hence, by dissolving this charge-transporting material in an organic solvent, a charge-transporting varnish that provides charge-transporting thin films having excellent charge transportability, flatness and uniformity can easily be prepared.

Also, because a thin film obtained from a charge-transporting varnish thus prepared has excellent charge transportability, flatness and uniformity, it can be suitably used as a thin film for organic EL devices and other electronic devices. In particular, by employing this thin film as a hole-injecting layer in an organic EL device, an organic EL device having a low driving voltage can be obtained.

A charge-transporting varnish prepared in this way can reproducibly form thin films of excellent charge transportability even when various wet processes capable of film formation over a large area, such as spin coating or slit coating, are used, and therefore is capable of fully accommodating recent advances in the field of organic EL devices.

Given that thin films obtained from the charge-transporting varnish of the invention have an excellent charge transportability, they are also expected to see use as, for example, protective anode buffer layers in organic thin-film solar cells, and antistatic films.

Although it is unclear why thin films of excellent charge transportability, flatness and uniformity can be reproducibly obtained using the charge-transporting varnish of the invention, when a varnish is prepared by dissolving in an organic solvent a substance having a relatively low crystallinity together with dipyrazino[2,3-f:2',3'-h]quinoxaline-2,3,6,7,10,11-hexacarbonitrile—which has a relatively high crystallinity, the crystallinity of the solid film obtained when the solvent is removed from this varnish decreases. It is presumably as a result of this that a film having excellent charge transportability, flatness and uniformity, which could not have been achieved from a varnish obtained by dissolving only dipyrazino[2,3-f:2',3'-h]quinoxaline-2,3,6,7,10,11-hexacarbonitrile, becomes achievable.

BRIEF DESCRIPTION OF DIAGRAMS

Figure 4:
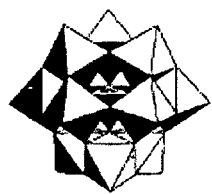
Figure 4:
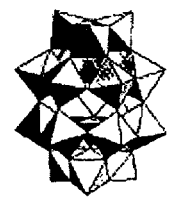

FIG. 4(A) refers to the Keggin-type chemical structure (H1).

FIG. 4(B) refers to the Dawson-type chemical structure (H2).

EMBODIMENT FOR CARRYING OUT THE INVENTION

The invention is described more fully below.

The charge-transporting material according to this invention includes a charge-transporting substance consisting of a compound of formula (1), and a charge-transporting compound having a molecular weight of 200 to 9,000 (exclusive of a compound of formula (1)), which compound is sometimes referred to below simply as the "charge-transporting compound."

The compound of formula (1) is dipyrazino[2,3-f:2',3'-h]quinoxaline-2,3,6,7,10,11-hexacarbonitrile, for which the CAS Number is 105598-27-4.

As used herein, "charge transportability" is synonymous with electrical conductivity, and is also synonymous with hole transportability. The charge-transporting varnish of the invention may itself have charge transportability, or a solid film obtained using the varnish may have charge transportability.

[Chemical Formula 4]

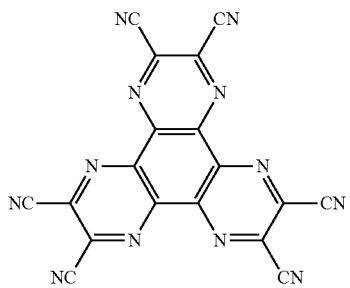

(1)

In the invention, the charge-transporting compound has a molecular weight which, from the standpoint of preparing a uniform varnish that gives thin films having a high flatness, is from 200 to 9,000. From the standpoint of obtaining a charge-transporting thin film having a high solvent resistance, the molecular weight is preferably at least 300, and more preferably at least 400. From the standpoint of preparing a uniform varnish that more reproducibly gives a thin film having a high flatness, the molecular weight is preferably not more than 8,000, more preferably not more than 7,000, even more preferably not more than 6,000, and still more preferably not more than 5,000.

To prevent separation of the charge-transporting substances when forming thin films, it is preferable for the charge-transporting compound to have no molecular weight distribution (a polydispersity of 1), i.e., for the charge-transporting compound to have a single molecular weight.

The charge-transporting compound used here may be any that has hitherto been used in, for example, the field of organic electroluminescence.

The charge-transporting compound is exemplified by various hole-transporting substances, including arylamine derivatives such as oligoaniline derivatives, N,N'-diarylbenzidine derivatives and N,N,N',N'-tetraarylbenzidine derivatives; thiophene derivatives such as oligothiophene derivatives, thienothiophene derivatives and thienobenzothiophene derivatives; and pyrrole derivatives such as oligopyrroles. Of these, arylamine derivatives and thiophene derivatives are preferred, arylamine derivatives are more preferred, and aniline derivatives of formula (2) or (3) are even more preferred.

[Chemical Formula 5]

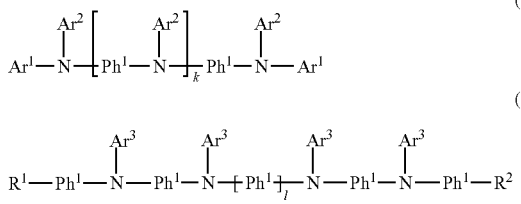

In formula (3), $R^1$ and $R^2$ are each independently a hydrogen atom, a halogen atom, a nitro group, a cyano group, or an alkyl group of 1 to 20 carbon atoms, alkenyl group of 2 to 20 carbon atoms, alkynyl group of 2 to 20 carbon atoms, aryl group of 6 to 20 carbon atoms or heteroaryl group of 2 to 20 carbon atoms which may be substituted with a halogen atom.

Examples of the halogen atom include fluorine, chlorine, bromine and iodine atoms, with a fluorine atom being preferred.

The alkyl group of 1 to 20 carbon atoms may be linear, branched or cyclic. Examples include linear or branched alkyl groups of 1 to 20 carbon atoms, such as methyl, ethyl, n-propyl, isopropyl, n-butyl, isobutyl, s-butyl, t-butyl, n-pentyl, n-hexyl, n-heptyl, n-octyl, n-nonyl and n-decyl groups; and cyclic alkyl groups of 3 to 20 carbon atoms, such as cyclopropyl, cyclobutyl, cyclopentyl, cyclohexyl, cycloheptyl, cyclooctyl, cyclononyl, cyclodecyl, bicyclobutyl, bicyclopentyl, bicyclohexyl, bicycloheptyl, bicyclooctyl, bicyclononyl and bicyclodecyl groups.

Examples of alkenyl groups of 2 to 20 carbon atoms include ethenyl, n-1-propenyl, n-2-propenyl, 1-methylethenyl, n-1-butenyl, n-2-butenyl, n-3-butenyl, 2-methyl-1-propenyl, 2-methyl-2-propenyl, 1-ethylethenyl, 1-methyl-1-propenyl, 1-methyl-2-propenyl, n-1-pentenyl, n-1-decenyl and n-1-eicosenyl groups.

Examples of alkynyl groups of 2 to 20 carbon atoms include ethynyl, n-1-propynyl, n-2-propynyl, n-1-butynyl, n-2-butynyl, n-3-butynyl, 1-methyl-2-propynyl, n-1-pentynyl, n-2-pentynyl, n-3-pentynyl, n-4-pentynyl, 1-methyl-n-butynyl, 2-methyl-n-butynyl, 3-methyl-n-butynyl, 1,1-dimethyl-n-propynyl, n-1-hexynyl, n-1-decynyl, n-1-pentadecynyl and n-1-eicosynyl groups.

Examples of aryl groups of 6 to 20 carbon atoms include phenyl, 1-naphthyl, 2-naphthyl, 1-anthryl, 2-anthryl, 9-anthryl, 1-phenanthryl, 2-phenanthryl, 3-phenanthryl, 4-phenanthryl and 9-phenanthryl groups.

Examples of heteroaryl groups of 2 to 20 carbon atoms include oxygen-containing heteroaryl groups such as 2-thienyl, 3-thienyl, 2-furanyl, 3-furanyl, 2-oxazolyl, 4-oxazolyl, 5-oxazolyl, 3-isooxazolyl, 4-isooxazolyl and 5-isooxazolyl groups; sulfur-containing heteroaryl groups such as 2-thiazolyl, 4-thiazolyl, 5-thiazolyl, 3-isothiazolyl, 4-isothiazolyl and 5-isothiazolyl groups; and nitrogen-containing heteroaryl groups such as 2-imidazolyl, 4-imidazolyl, 2-pyridyl, 3-pyridyl, 4-pyridyl, 2-pyrazyl, 3-pyrazyl, 5-pyrazyl, 6-pyrazyl, 2-pyrimidyl, 4-pyrimidyl, 5-pyrimidyl, 6-pyrimidyl, 3-pyridazyl, 4-pyridazyl, 5-pyridazyl, 6-pyridazyl, 1,2,3-triazin-4-yl, 1,2,3-triazin-5-yl, 1,2,4-triazin-3-yl, 1,2,4-triazin-5-yl, 1,2,4-triazin-6-yl, 1,3,5-triazin-2-yl, 1,2,4,5-tetrazin-3-yl, 1,2,3,4-tetrazin-5-yl, 2-quinolinyl, 3-quinolinyl, 4-quinolinyl, 5-quinolinyl, 6-quinolinyl, 7-quinolinyl, 8-quinolinyl, 1-isoquinolinyl, 3-isoquinolinyl, 4-isoquinolinyl, 5-isoquinolinyl, 6-isoquinolinyl, 7-isoquinolinyl, 8-isoquinolinyl, 2-quinoxanyl, 5-quinoxanyl, 6-quinoxanyl, 2-quinazolinyl, 4-quinozolinyl, 5-quinazolinyl, 6-quinazolinyl, 7-quinazolinyl, 8-quinazolinyl, 3-cinnolinyl, 4-cinnolinyl, 5-cinnolinyl, 6-cinnolinyl, 7-cinnolinyl and 8-cinnolinyl groups.

Of these, $R^1$ and $R^2$ are each preferably a hydrogen atom, a fluorine atom, a cyano group, an alkyl group of 1 to 20 carbon atoms which may be substituted with a halogen atom, an aryl group of 6 to 20 carbon atoms which may be substituted with a halogen atom, or a heteroaryl group of 2 to 20 carbon atoms which may be substituted with a halogen atom; more preferably a hydrogen atom, a fluorine atom, a cyano group, an alkyl group of 1 to 10 carbon atoms which may be substituted with a halogen atom, or a phenyl group which may be substituted with a halogen atom; even more preferably a hydrogen atom, a fluorine atom, a methyl group or a trifluoromethyl group; and most preferably a hydrogen atom.

In formulas (2) and (3), $Ph^1$ represents a group of the formula (P1).

[Chemical Formula 6]

(P1)

Here, $R^3$ to $R^6$ are each independently a hydrogen atom, a halogen atom, a nitro group, a cyano group, or an alkyl group of 1 to 20 carbon atoms, alkenyl group of 2 to 20 carbon atoms, alkynyl group of 2 to 20 carbon atoms, aryl group of 6 to 20 carbon atoms or heteroaryl group of 2 to 20 carbon atoms which may be substituted with a halogen atom. These are exemplified in the same way as described above for $R^1$ and $R^2$.

In particular, $R^3$ to $R^6$ are each preferably a hydrogen atom, a fluorine atom, a cyano group, an alkyl group of 1 to 20 carbon atoms which may be substituted with a halogen atom, an aryl group of 6 to 20 carbon atoms which may be substituted with a halogen atom, or a heteroaryl group of 2 to 20 carbon atoms which may be substituted with a halogen atom; more preferably a hydrogen atom, a fluorine atom, a cyano group, an alkyl group of 1 to 10 carbon atoms which may be substituted with a halogen atom, or a phenyl group which may be substituted with a halogen atom; even more preferably a hydrogen atom, a fluorine atom, a methyl group or a trifluoromethyl group; and most preferably a hydrogen atom.

A specific, non-limiting, example of a group that is suitable as $Ph^1$ is the following.

[Chemical Formula 7]

(P1-1)

In formula (2), each $Ar^1$ is independently a group represented by any of formulas (B1) to (B11), with a group represented by any of formulas (B1') to (B11') being especially preferred.

[Chemical Formula 8]

(B1)

(B2)

(B3)

(B4)

(B5)

(B6)

(B7) 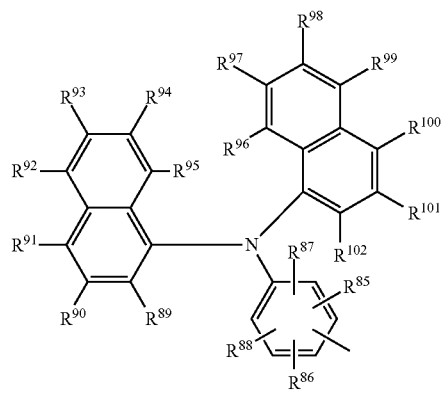
(B8) 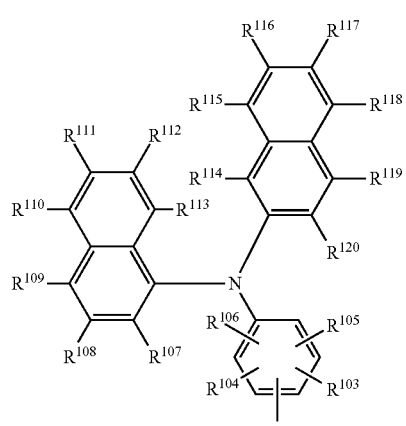
(B9) 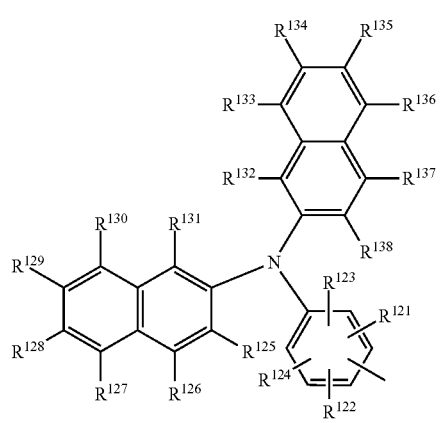
(B10) 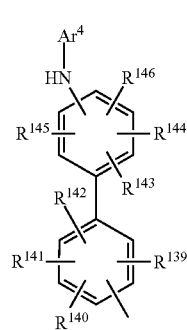
(B11) 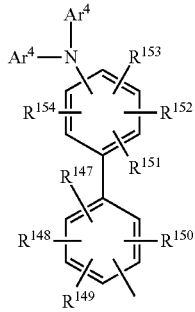
[Chemical Formula 9]
(B1′) 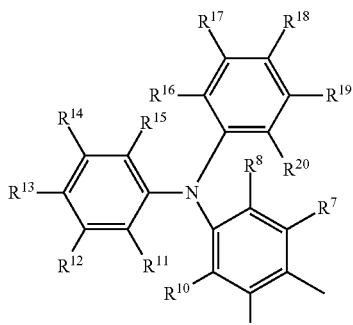
(B2′) 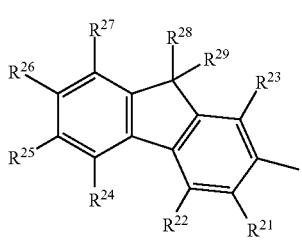
(B3′) 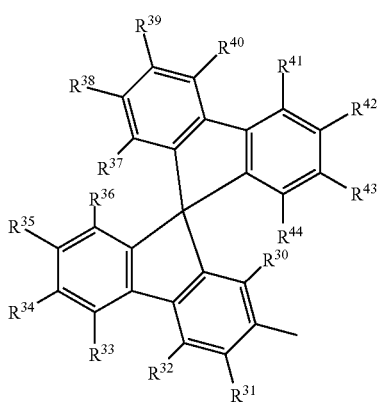
(B4′) 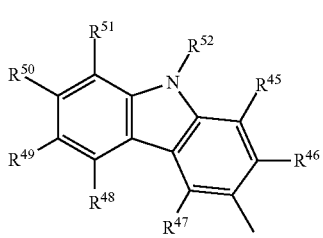

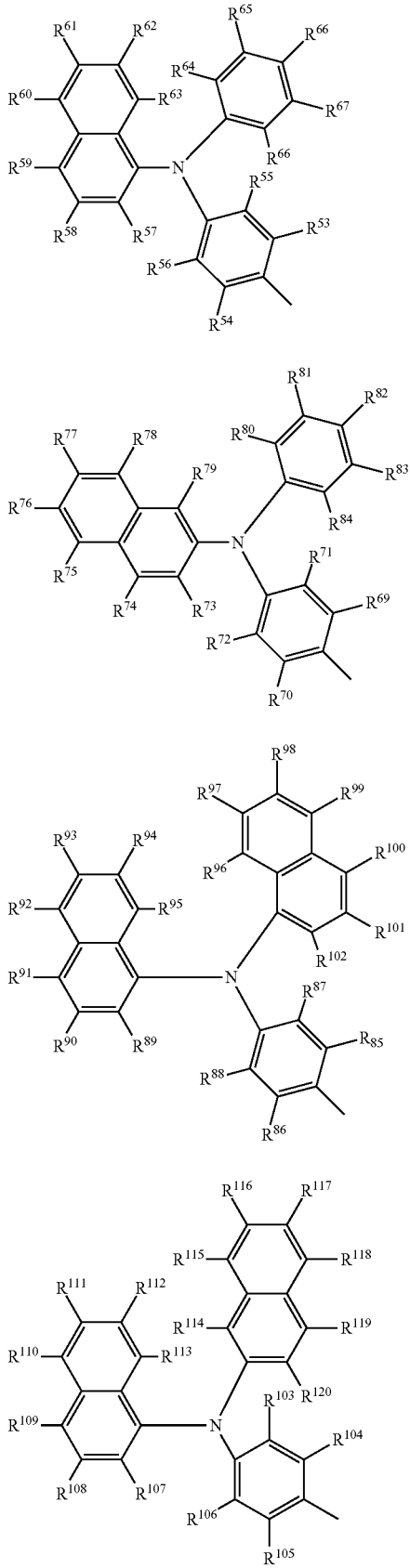
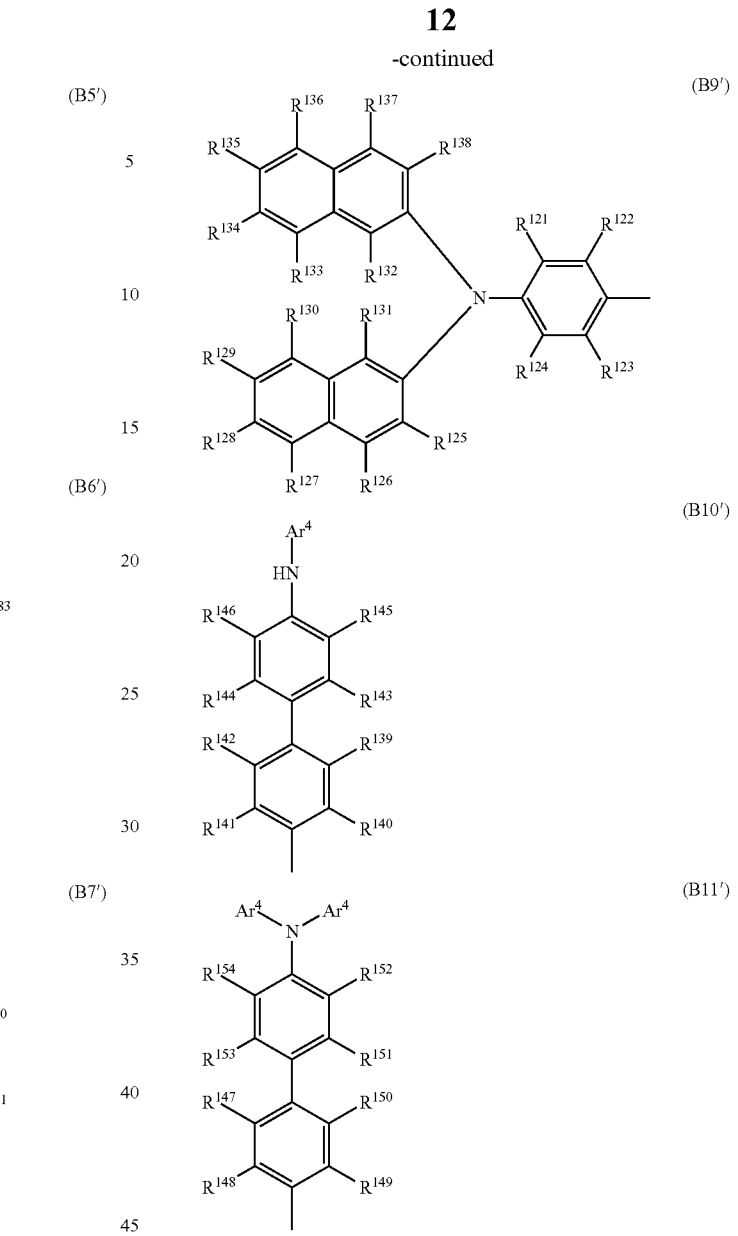

Here, $R^7$ to $R^{27}$, $R^{30}$ to $R^{51}$ and $R^{53}$ to $R^{154}$ are each independently a hydrogen atom, a halogen atom, a nitro group, a cyano group, or a diphenylamino group, alkyl group of 1 to 20 carbon atoms, alkenyl group of 2 to 20 carbon atoms, alkynyl group of 2 to 20 carbon atoms, aryl group of 6 to 20 carbon atoms or heteroaryl group of 2 to 20 carbon atoms which may be substituted with a halogen atom; $R^{28}$ and $R^{29}$ are each independently an aryl group of 6 to 20 carbon atoms or a heteroaryl group of 2 to 20 carbon atoms which may be substituted with $Z^1$; $R^{52}$ is a hydrogen atom, an alkyl group of 1 to 20 carbon atoms, alkenyl group of 2 to 20 carbon atoms or alkynyl group of 2 to 20 carbon atoms which may be substituted with $Z^4$, or an aryl group of 6 to 20 carbons or heteroaryl group of 2 to 20 carbon atoms which may be substituted with $Z^1$; $Z^1$ is a halogen atom, a nitro group, a cyano group, or an alkyl group of 1 to 20 carbon atoms, alkenyl group of 2 to 20 carbon atoms or alkynyl group of 2 to 20 carbon atoms which may be substituted with $Z^2$; $Z^2$ is a halogen atom, a nitro group, a cyano group, or an aryl group of 6 to 20 carbon atoms or heteroaryl group of 2 to 20 carbon atoms which may be substituted with $Z^3$; $Z^3$ is a halogen atom, a nitro group or a cyano group; $Z^4$ is a halogen atom, a nitro group, a cyano group, or an aryl group of 6 to 20 carbon atoms or heteroaryl group of 2 to 20 carbon atoms which may be substituted with $Z^5$; and $Z^5$ is a halogen atom, a nitro group, a cyano group, or an alkyl group of 1 to 20 carbon atoms, alkenyl group of 2 to 20 carbon atoms or alkynyl group of 2 to 20 carbon atoms which may be substituted with $Z^3$. These halogen atoms, alkyl groups of 1 to 20 carbon atoms, alkenyl groups of 2 to 20 carbon atoms, alkynyl groups of 2 to 20 carbon atoms, aryl groups of 6 to 20 carbon atoms and heteroaryl groups of 2 to 20 carbon atoms are exemplified in the same way as described above for $R^1$ and $R^2$.

In particular, $R^7$ to $R^{27}$, $R^{30}$ to $R^{51}$ and $R^{53}$ to $R^{154}$ are each preferably a hydrogen atom, a fluorine atom, a cyano group, a diphenylamino group which may be substituted with a halogen atom, an alkyl group of 1 to 20 carbon atoms which may be substituted with a halogen atom, an aryl group of 6 to 20 carbon atoms which may be substituted with a halogen atom, or a heteroaryl group of 2 to 20 carbon atoms which may be substituted with a halogen atom; more preferably a hydrogen atom, a fluorine atom, a cyano group, an alkyl group of 1 to 10 carbon atoms which may be substituted with a halogen atom, or a phenyl group which may be substituted with a halogen atom; even more preferably a hydrogen atom, a fluorine atom, a methyl group or a trifluoromethyl group; and most preferably a hydrogen atom.

$R^{28}$ and $R^{29}$ are each preferably an aryl group of 6 to 14 carbon atoms which may be substituted with $Z^1$ or a heteroaryl group of 2 to 14 carbon atoms which may be substituted with $Z^1$; more preferably an aryl group of 6 to 14 carbon atoms which may be substituted with $Z^1$; and even more preferably a phenyl group which may be substituted with $Z^1$, a 1-naphthyl group which may be substituted with $Z^1$, or a 2-naphthyl group which may be substituted with $Z^1$.

$R^{52}$ is preferably a hydrogen atom, an aryl group of 6 to 20 carbon atoms which may be substituted with $Z^1$, a heteroaryl group of 2 to 20 carbon atoms which may be substituted with $Z^1$ or an alkyl group of 1 to 20 carbon atoms which may be substituted with $Z^4$; more preferably a hydrogen atom, an aryl group of 6 to 14 carbon atoms which may be substituted with $Z^1$, a heteroaryl group of 2 to 14 carbon atoms which may be substituted with $Z^1$, or an alkyl group of 1 to 10 carbon atoms which may be substituted with $Z^4$; even more preferably a hydrogen atom, an aryl group of 6 to 14 carbon atoms which may be substituted with $Z^1$, a nitrogen-containing heteroaryl group of 2 to 14 carbons which may be substituted with $Z^1$, or an alkyl group of 1 to 10 carbon atoms which may be substituted with $Z^4$; and still more preferably a hydrogen atom, a phenyl group which may be substituted with $Z^1$, a 1-naphthyl group which may be substituted with $Z^1$, a 2-naphthyl group which may be substituted with $Z^1$, a 2-pyridyl group which may be substituted with $Z^1$, a 3-pyridyl group which may be substituted with $Z^1$, a 4-pyridyl group which may be substituted with $Z^1$, or a methyl group which may be substituted with $Z^4$.

Each $Ar^4$ independently represents an aryl group of 6 to 20 carbon atoms which may be substituted with a di($C_{6-20}$ aryl)amino group.

Specific examples of aryl groups of 6 to 20 carbon atoms include the same as those mentioned above for $R^1$ and $R^2$. Specific examples of di($C_{6-20}$ aryl)amino groups include diphenylamino, 1-naphthylphenylamino, di(1-naphthyl) amino, 1-naphthyl-2-naphthylamino and di(2-naphthyl) amino groups.

$Ar^4$ is preferably a phenyl, 1-naphthyl, 2-naphthyl, 1-anthryl, 2-anthryl, 9-anthryl, 1-phenanthryl, 2-phenanthryl, 3-phenanthryl, 4-phenanthryl, 9-phenanthryl, p-(diphenylamino)phenyl, p-(1-naphthylphenylamino)phenyl, p-(di (1-naphthyl)amino)phenyl, p-(1-naphthyl-2-naphthylamino) phenyl or p-(di(2-naphthyl)amino)phenyl group; and more preferably a p-(diphenylamino)phenyl group.

Suitable examples of $Ar^1$ include, but are not limited to, those shown below.

[Chemical Formula 10]

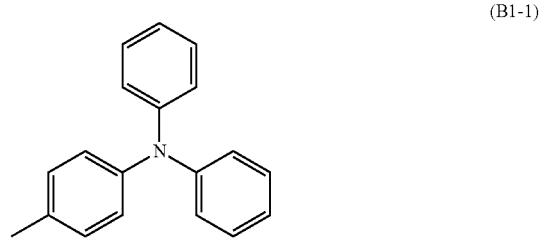
(B1-1)

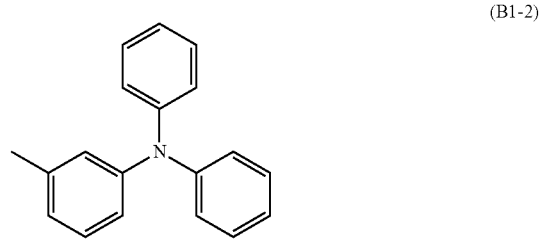
(B1-2)

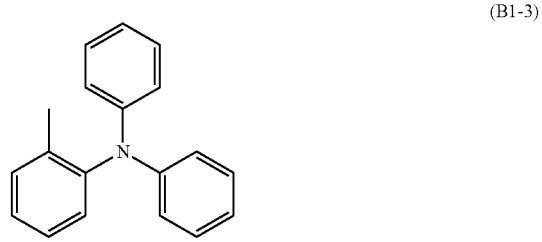
(B1-3)

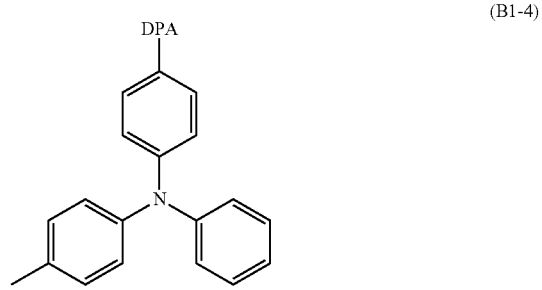
(B1-4)

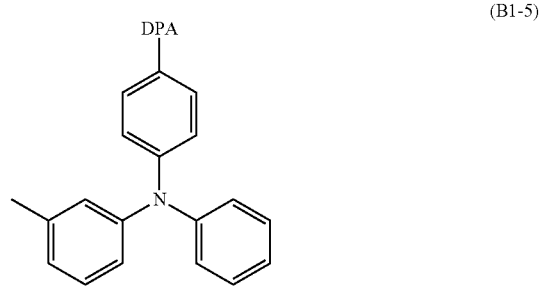
(B1-5)

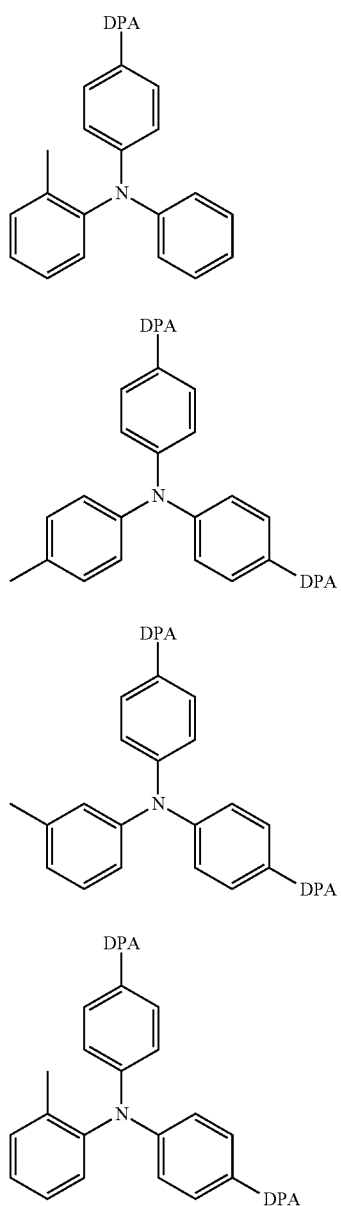
In these formulas, DPA stands for a diphenylamino group.
[Chemical Formula 11]
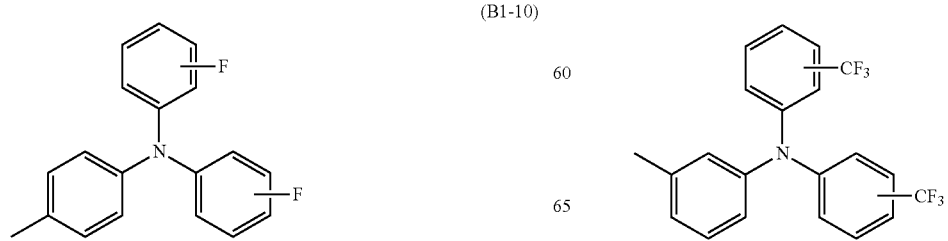

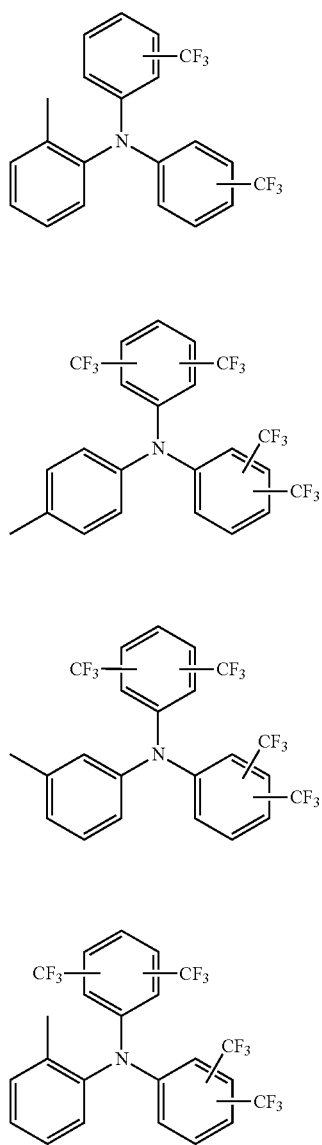
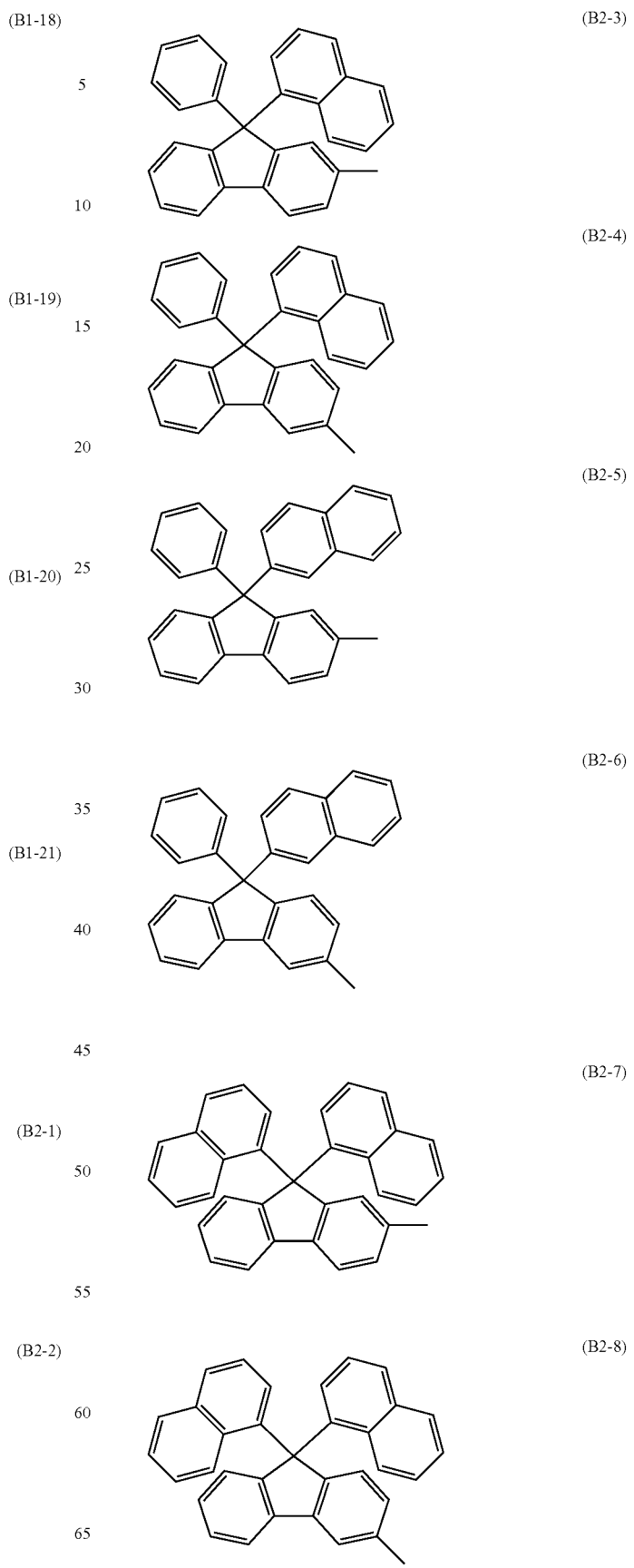

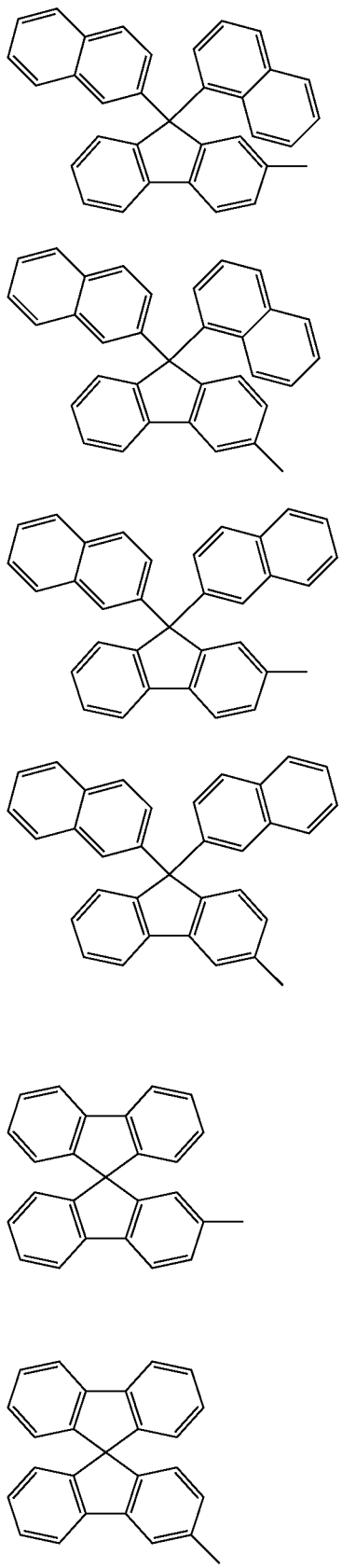
(B2-9)
(B2-10)
(B2-11)
(B2-12)
(B3-1)
(B3-2)
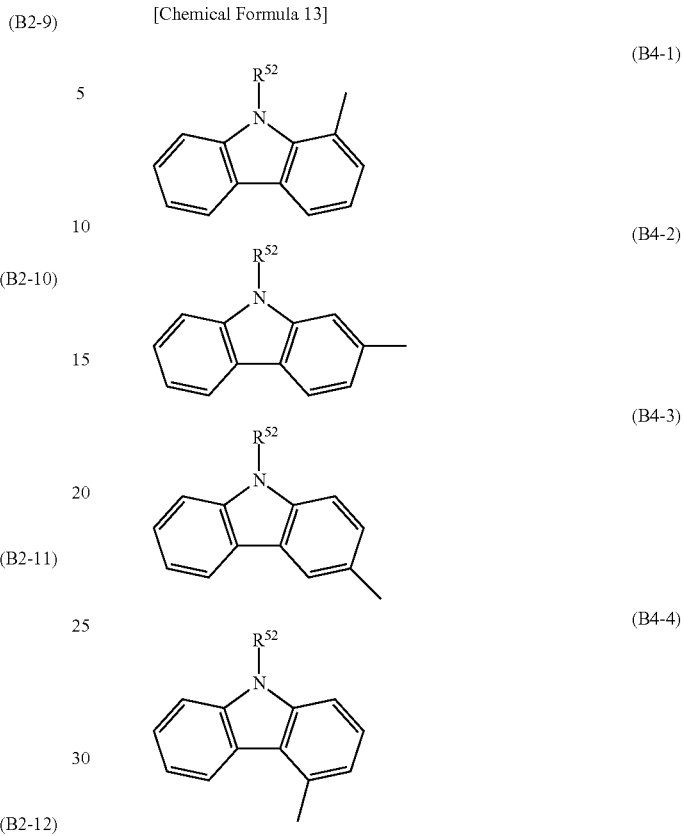
[Chemical Formula 13]
(B4-1)
(B4-2)
(B4-3)
(B4-4)
In these formulas, $R^{52}$ is as defined above.
[Chemical Formula 14]
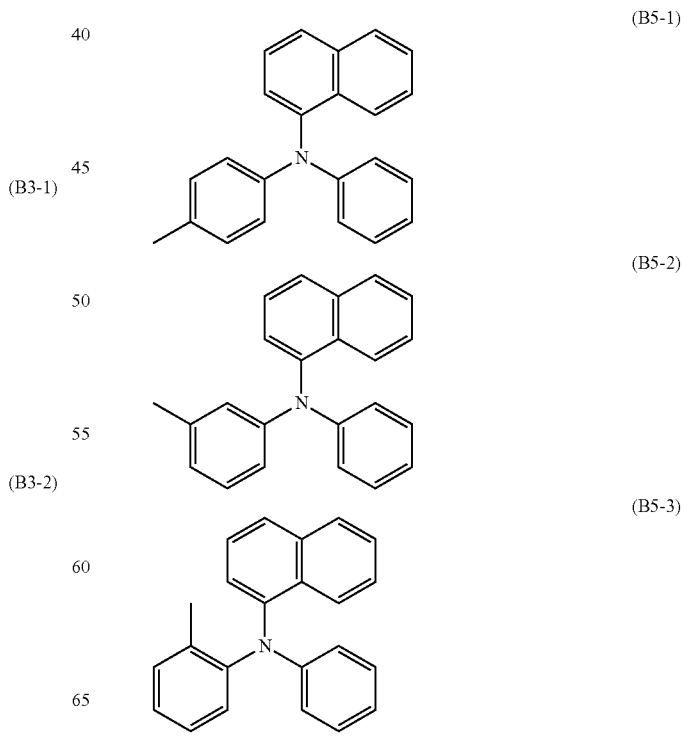
(B5-1)
(B5-2)
(B5-3)

(B6-1)
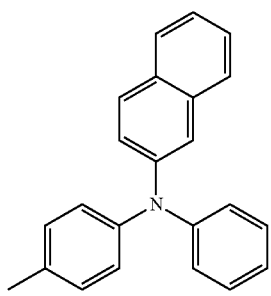
(B6-2)
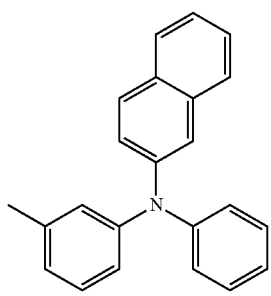
(B6-3)
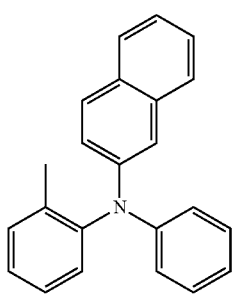
(B7-1)
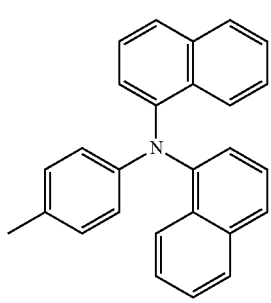
(B7-2)
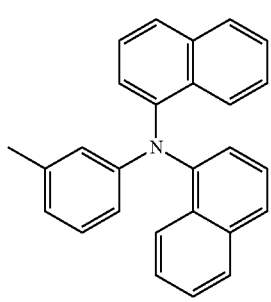
(B7-3)
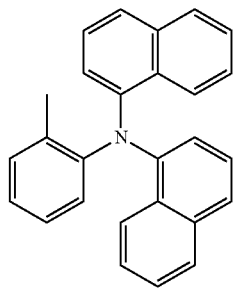
(B8-1)
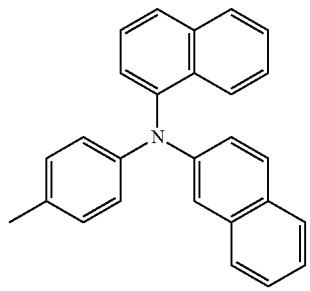
(B8-2)
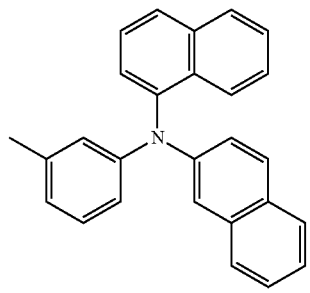
(B8-3)
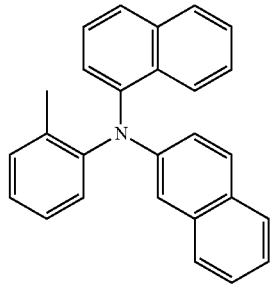
(B9-1)
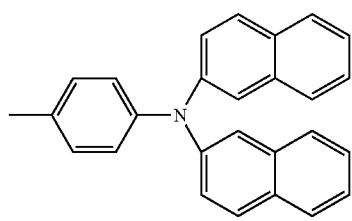
(B9-2)

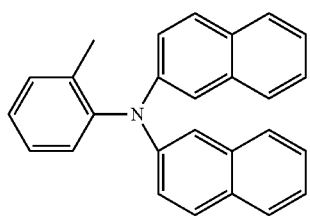
(B9-3)
[Chemical Formula 15]
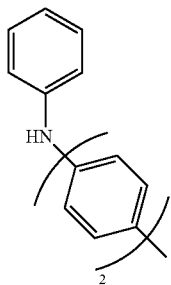
(B10-1)
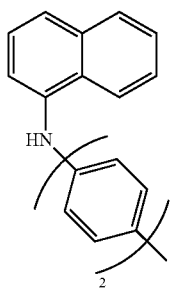
(B10-2)
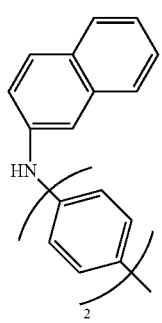
(B10-3)
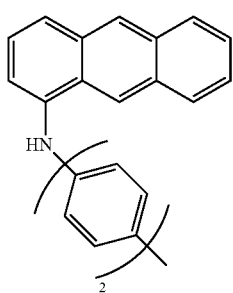
(B10-4)
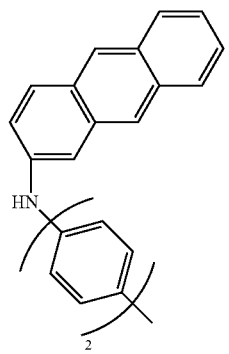
(B10-5)
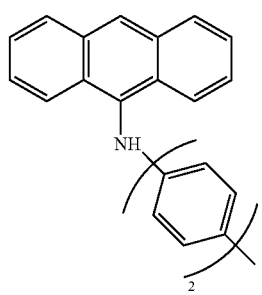
(B10-6)
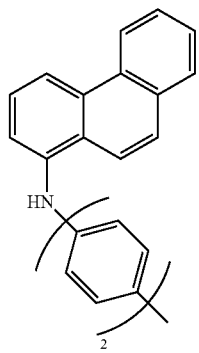
(B10-7)
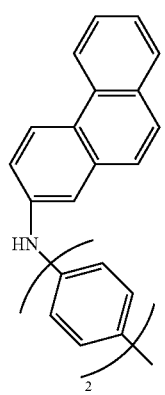
(B10-8)

-continued
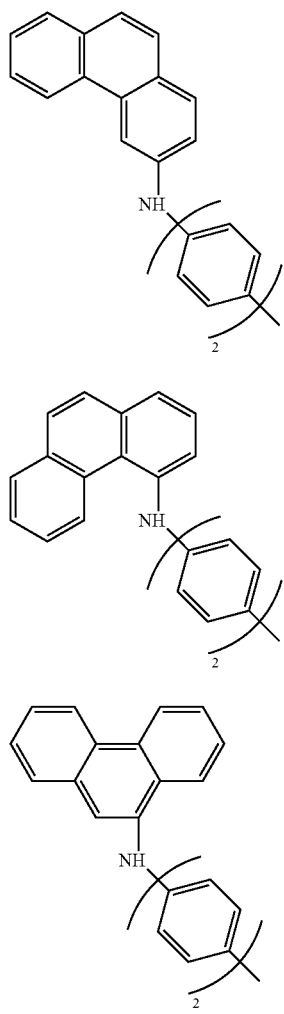
(B10-9)
(B10-10)
(B10-11)
[Chemical Formula 16]
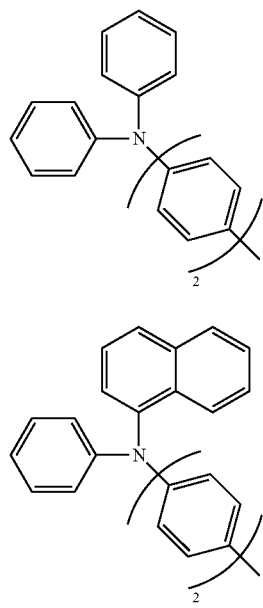
(B11-1)
(B11-2)
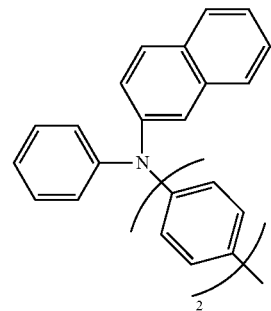
(B11-3)
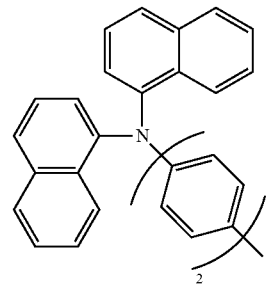
(B11-4)
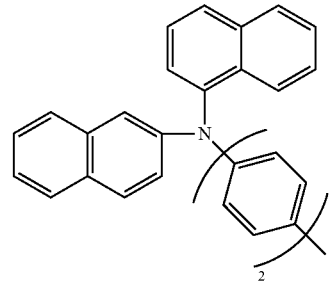
(B11-5)
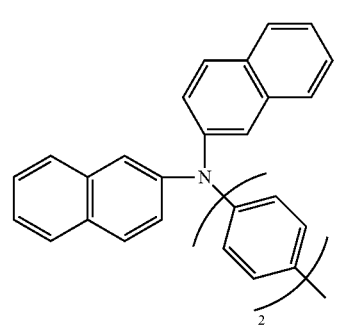
(B11-6)
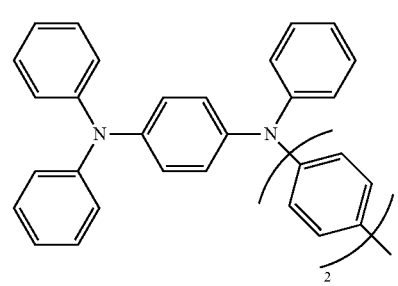
(B11-7)

(B11-8)
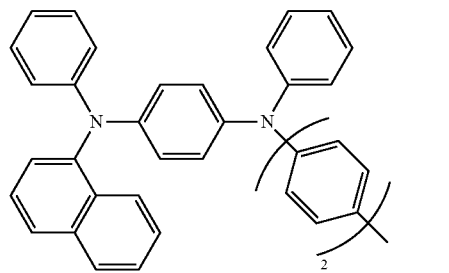
(B11-9)
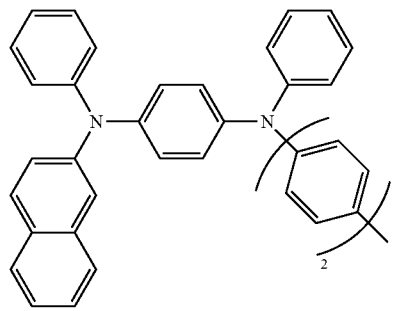
(B11-10)
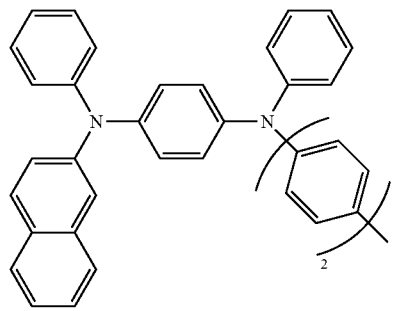
(B11-11)
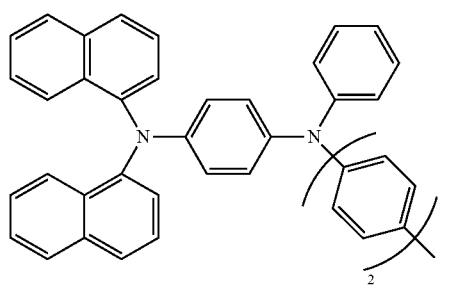
(B11-12)
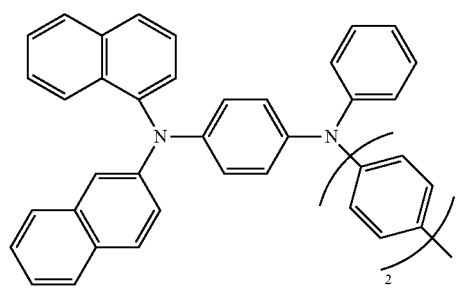
[Chemical Formula 17]
(B11-13)
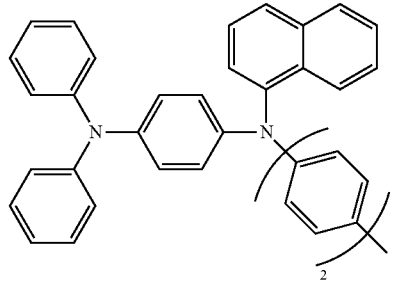
(B11-14)
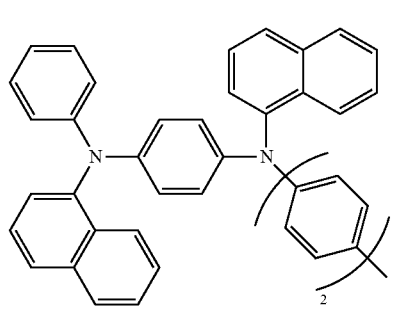
(B11-15)
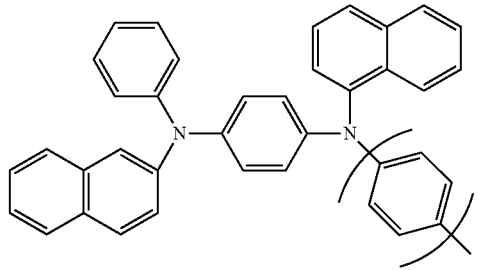
(B11-16)
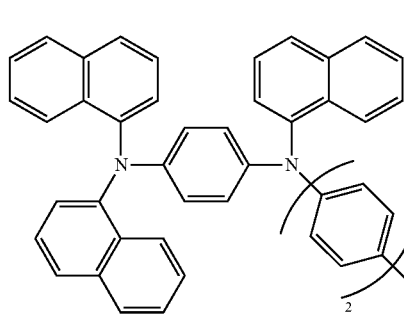
(B11-17)
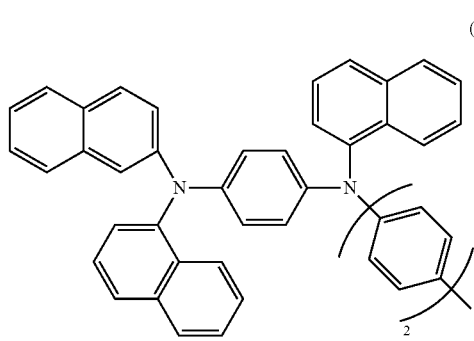

(B11-18)
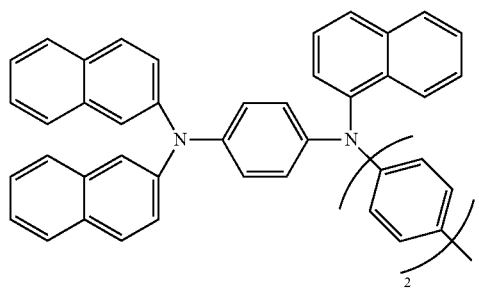
(B11-19)
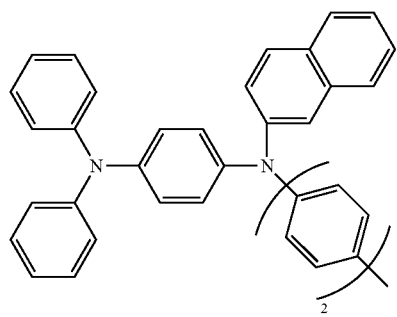
(B11-20)
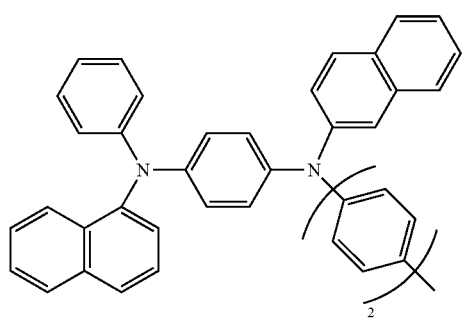
(B11-21)
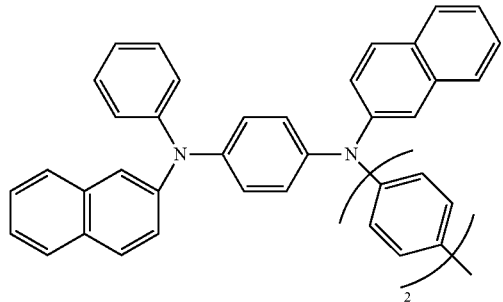
(B11-22)
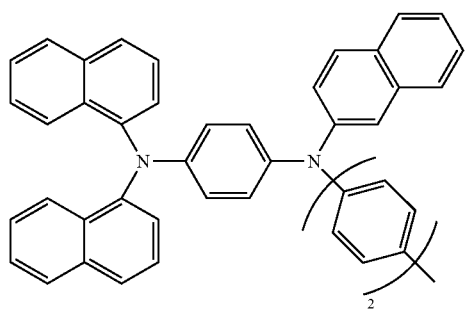
(B11-23)
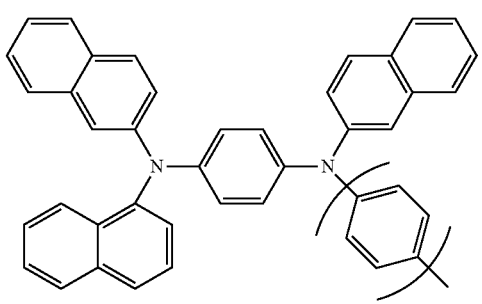
(B11-24)
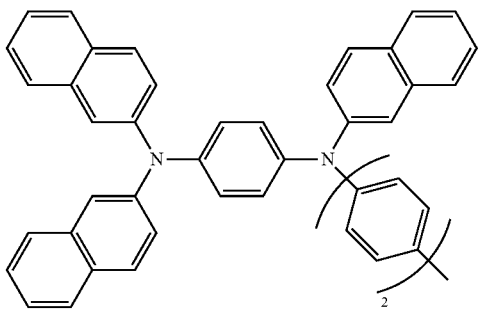
In formula (2), each $Ar^2$ is independently a group of any one of formulas (A1) to (A18).
[Chemical Formula 18]
(A1)
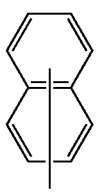
(A2)
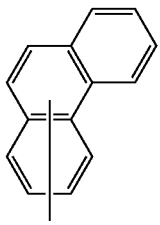
(A3)
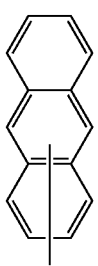

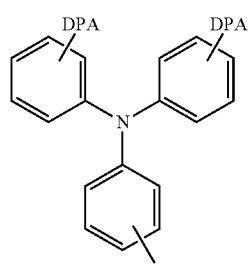 (A4)
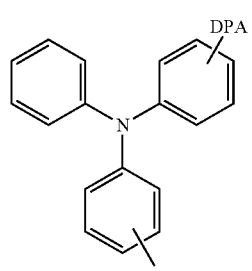 (A5)
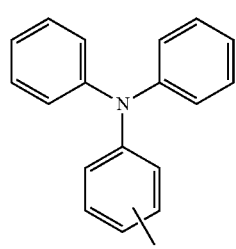 (A6)
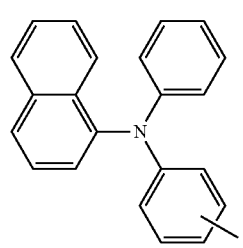 (A7)
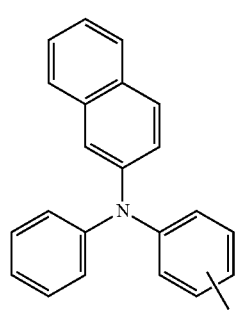 (A8)
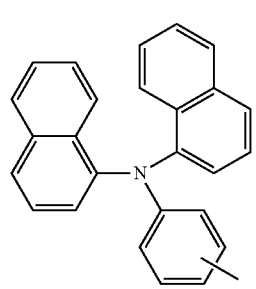 (A9)
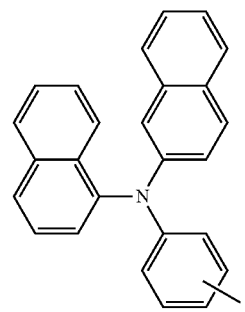 (A10)
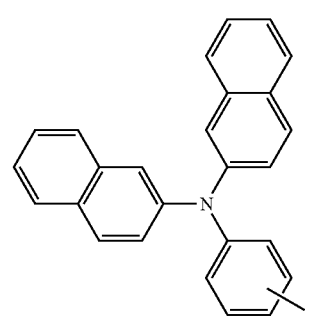 (A11)
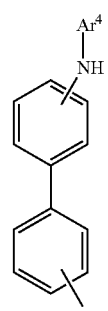 (A12)
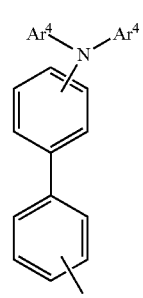 (A13)
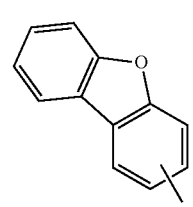 (A14)
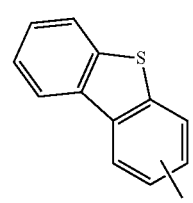 (A15)

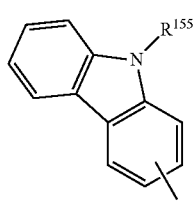 (A16)

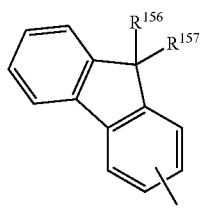 (A17)

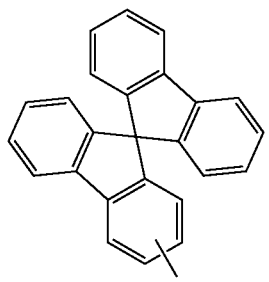 (A18)

In these formulas, $R^{155}$ is a hydrogen atom, an alkyl group of 1 to 20 carbon atoms, alkenyl group of 2 to 20 carbon atoms or alkynyl group of 2 to 20 carbon atoms which may be substituted with $Z^4$, or an aryl group of 6 to 20 carbons or heteroaryl group of 2 to 20 carbon atoms which may be substituted with $Z^1$; $R^{156}$ and $R^{157}$ are each independently an aryl group of 6 to 20 carbon atoms or heteroaryl group of 2 to 20 carbon atoms which may be substituted with $Z^1$; DPA is a diphenylamino group; and $Ar^4$, $Z^1$ and $Z^3$ to $Z^5$ are as defined above. These halogen atoms, alkyl groups of 1 to 20 carbon atoms, alkenyl groups of 2 to 20 carbon atoms, alkynyl group of 2 to 20 carbon atoms, aryl groups of 6 to 20 carbon atoms and heteroaryl groups of 2 to 20 carbon atoms are exemplified in the same way as described above for $R^1$ and $R^2$.

In particular, $R^{155}$ is preferably a hydrogen atom, an aryl group of 6 to 20 carbon atoms which may be substituted with $Z^1$, a heteroaryl group of 2 to 20 carbon atoms which may be substituted with $Z^1$, or an alkyl group of 1 to 20 carbon atoms which may be substituted with $Z^4$; more preferably a hydrogen atom, an aryl group of 6 to 14 carbon atoms which may be substituted with $Z^1$, a heteroaryl group of 2 to 14 carbon atoms which may be substituted with $Z^1$, or an alkyl group of 1 to 10 carbon atoms which may be substituted with $Z^4$; even more preferably a hydrogen atom, an aryl group of 6 to 14 carbon atoms which may be substituted with $Z^1$, a nitrogen-containing heteroaryl group of 2 to 14 carbon atoms which may be substituted with $Z^1$, or an alkyl group of 1 to 10 carbon atoms which may be substituted with $Z^4$; and still more preferably a hydrogen atom, a phenyl group which may be substituted with $Z^1$, a 1-naphthyl group which may be substituted with $Z^1$, a 2-napthyl group which may be substituted with $Z^1$, a 2-pyridyl group which may be substituted with $Z^1$, a 3-pyridyl group which may be substituted with $Z^1$, a 4-pyridyl group which may be substituted with $Z^1$, or a methyl group which may be substituted with $Z^4$.

$R^{156}$ and $R^{157}$ are each preferably an aryl group of 6 to 14 carbon atoms which may be substituted with $Z^1$ or a heteroaryl group of 2 to 14 carbon atoms which may be substituted with $Z^1$; more preferably an aryl group of 6 to 14 carbon atoms which may be substituted with $Z^1$; and even more preferably a phenyl group which may be substituted with $Z^1$, a 1-naphthyl group which may be substituted with $Z^1$, or a 2-naphthyl group which may be substituted with $Z^1$.

Specific examples of groups which are suitable as $Ar^2$ include, but are not limited to, those shown below.

[Chemical Formula 19]

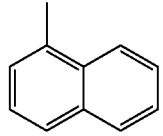 (A1-1)

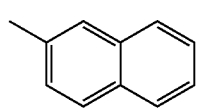 (A1-2)

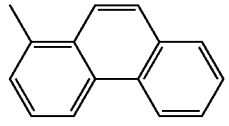 (A2-1)

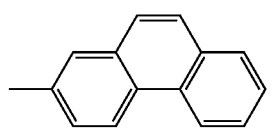 (A2-2)

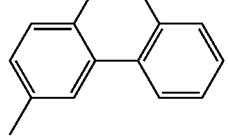 (A2-3)

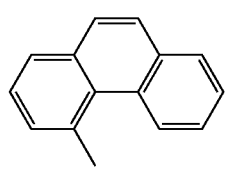 (A2-4)

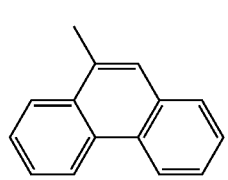 (A2-5)

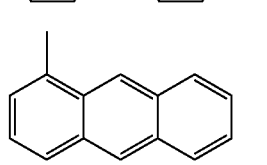 (A3-1)

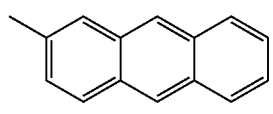 (A3-2)

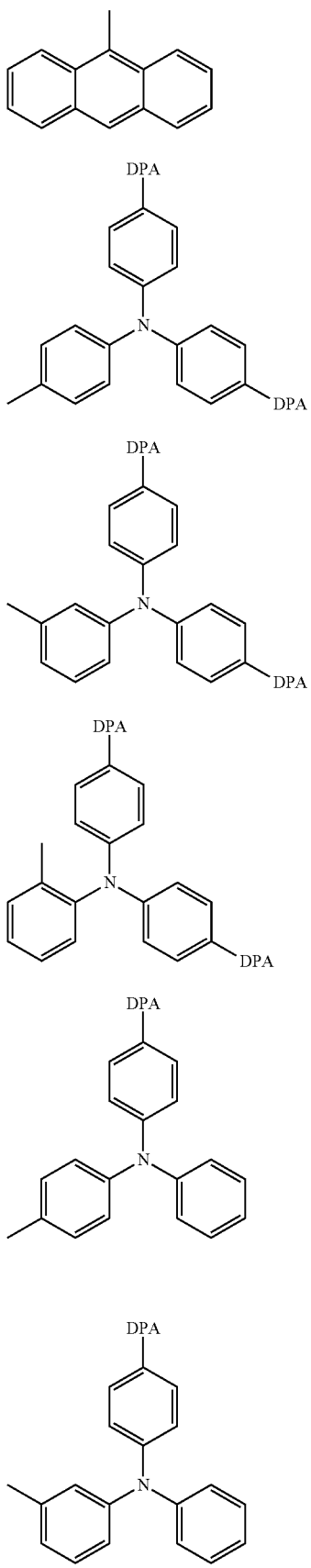
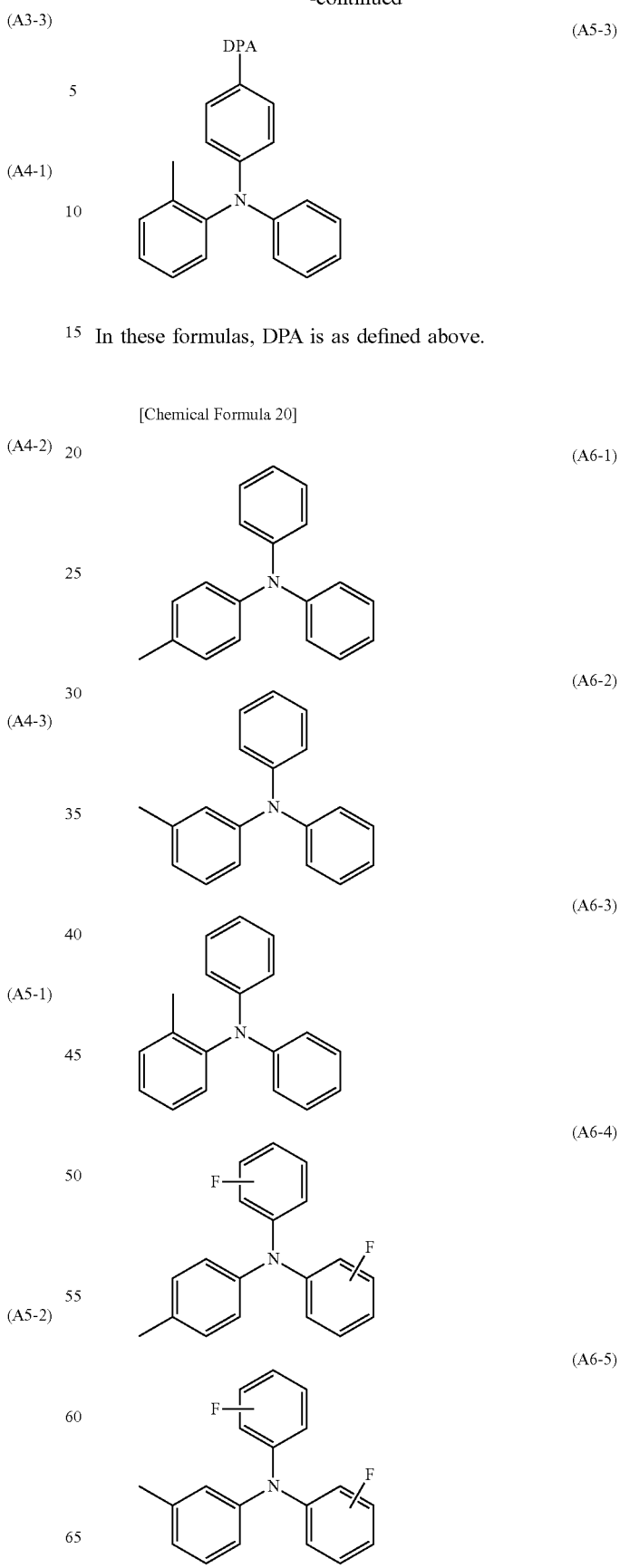
In these formulas, DPA is as defined above.
[Chemical Formula 20]

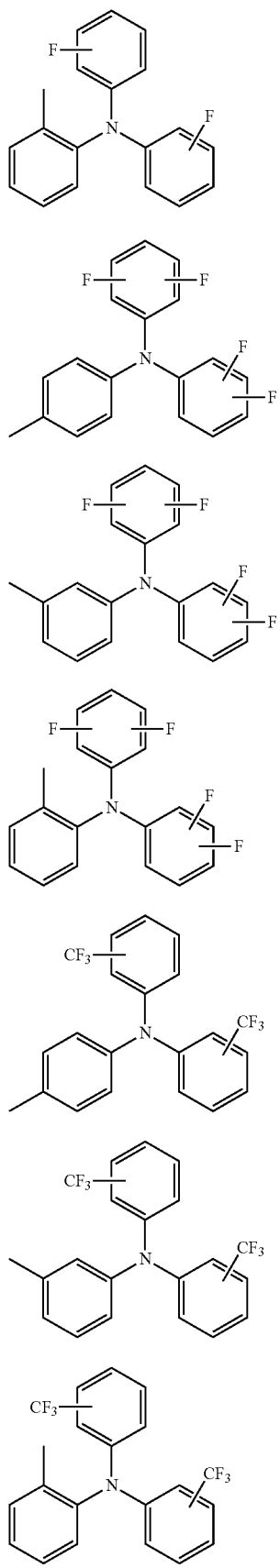
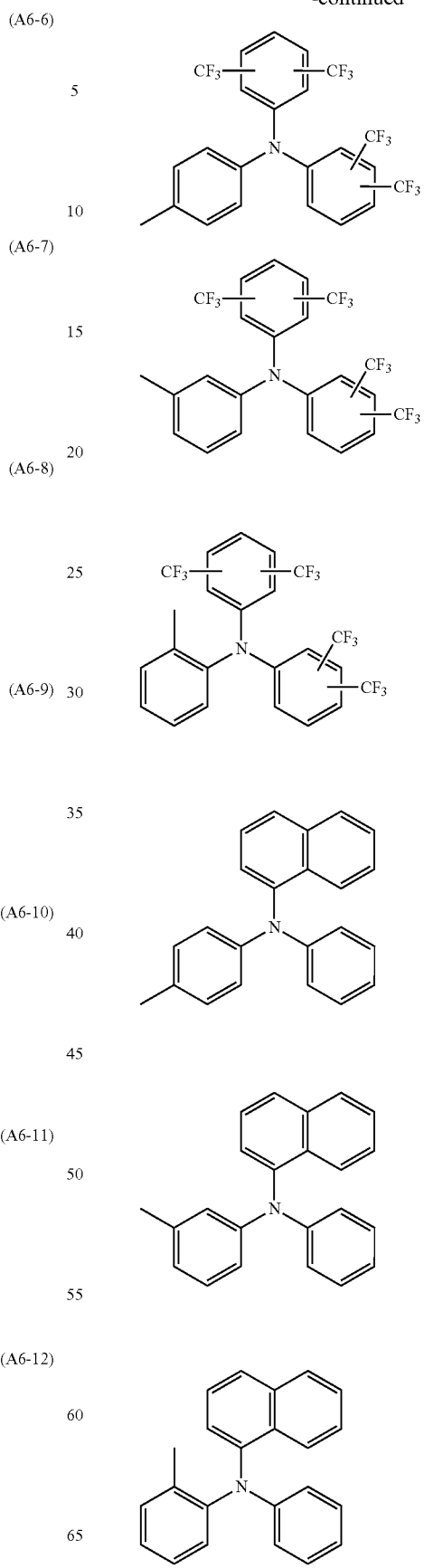

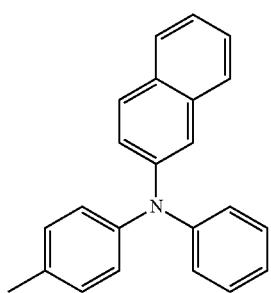 (A8-1)
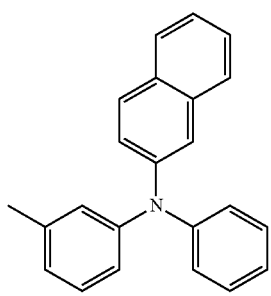 (A8-2)
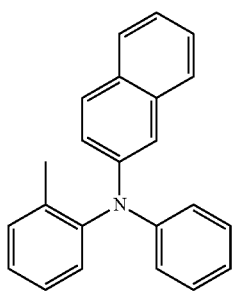 (A8-3)
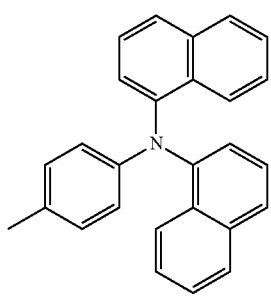 (A9-1)
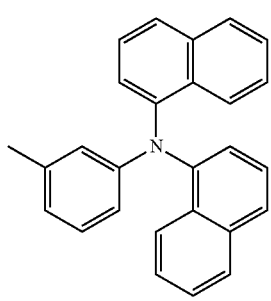 (A9-2)
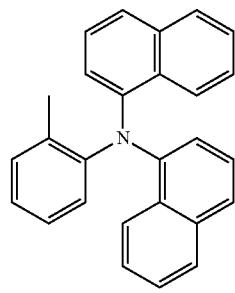 (A9-3)
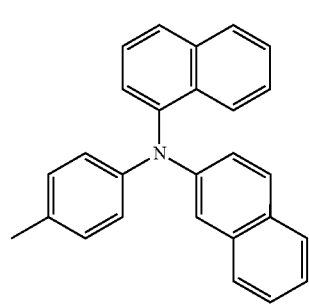 (A10-1)
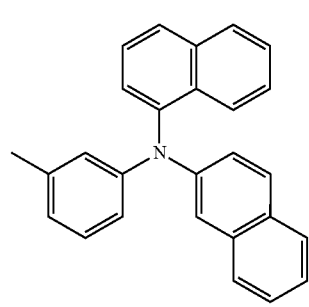 (A10-2)
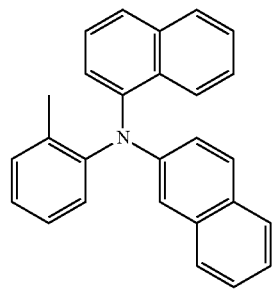 (A10-3)
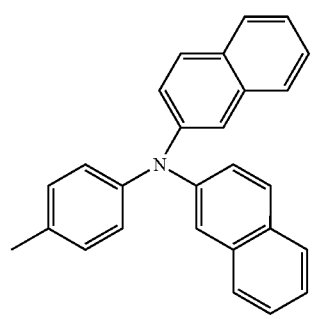 (A11-1)

(A11-2) 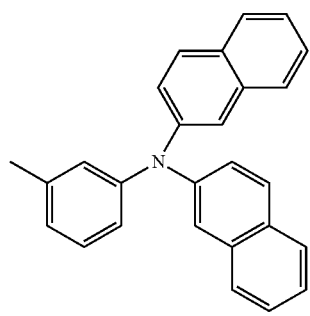
(A11-3) 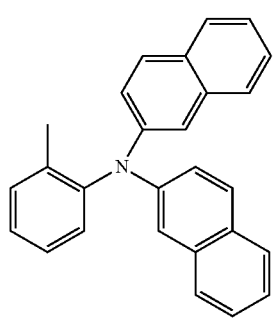
[Chemical Formula 21]
(A12-1) 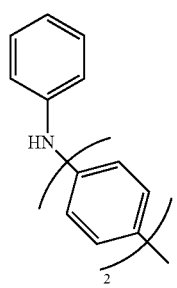
(A12-2) 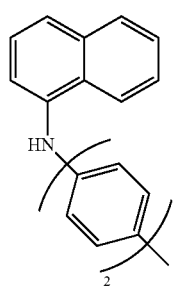
(A12-3) 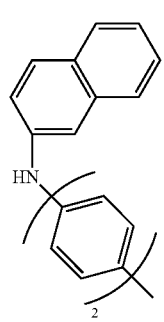
(A12-4) 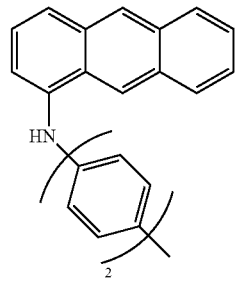
(A12-5) 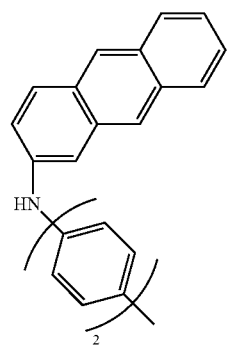
(A12-6) 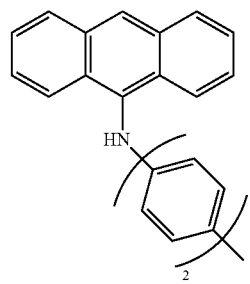
(A12-7) 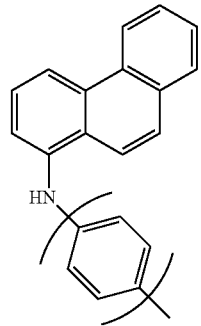
(A12-8) 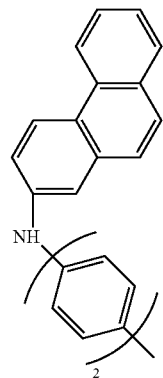

(A12-9) 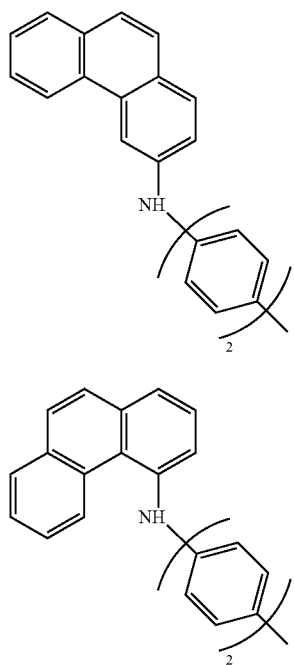
(A12-10) 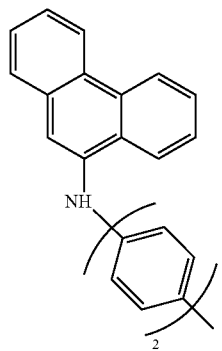
(A12-11) 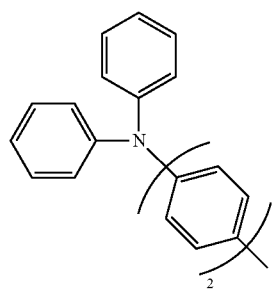
[Chemical Formula 22]
(A13-1) 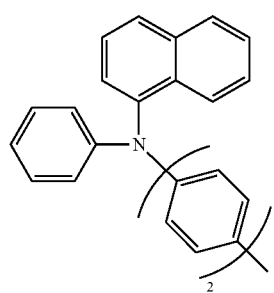
(A13-2)
(A13-3) 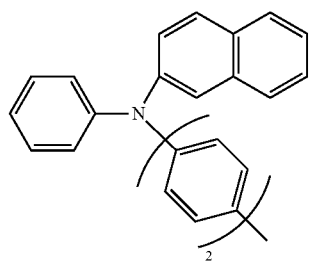
(A13-4) 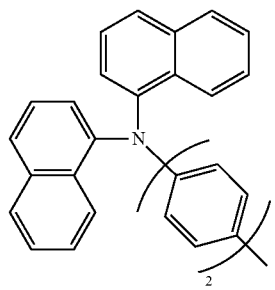
(A13-5) 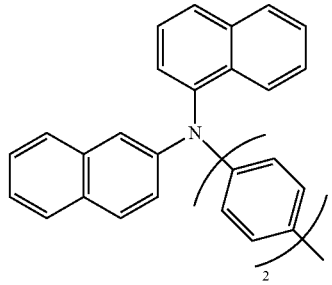
(A13-6) 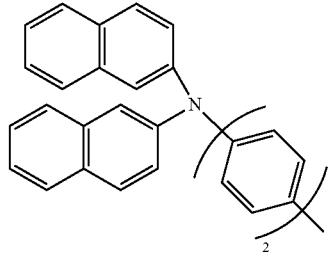
(A13-7) 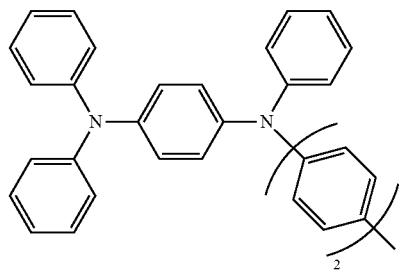

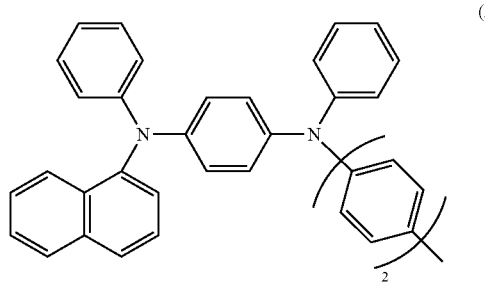
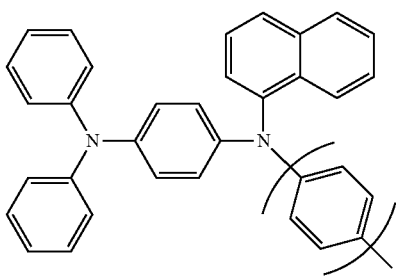

(A13-18) 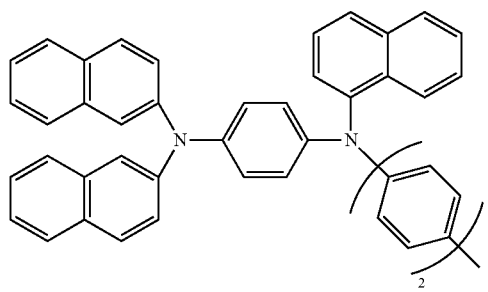
(A13-19) 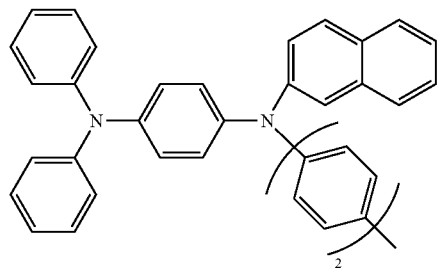
(A13-20) 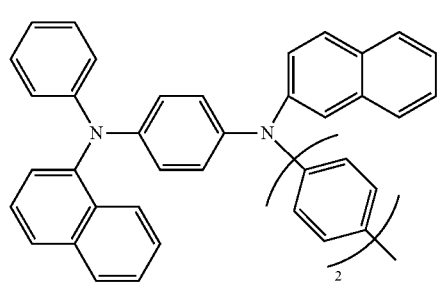
(A13-21) 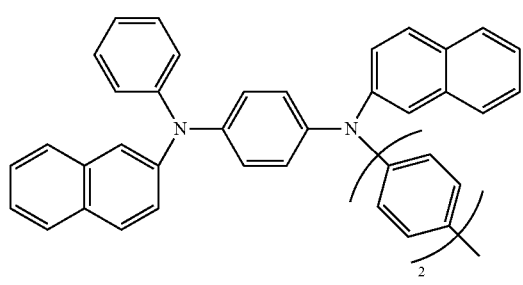
(A13-22) 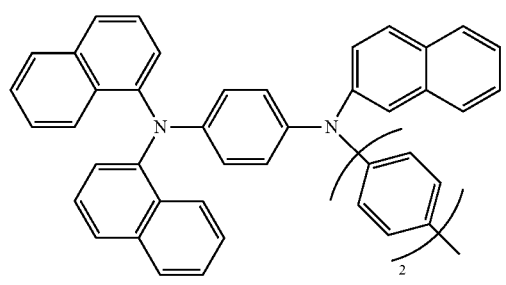
(A13-23) 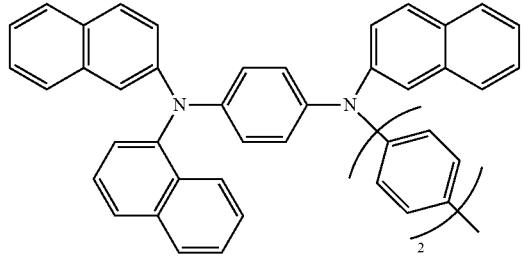
(A13-24) 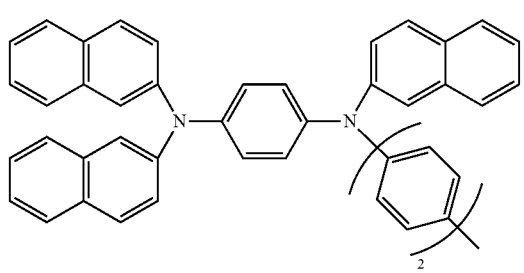
[Chemical Formula 24]
(A14-1) 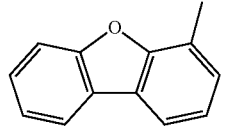
(A14-2) 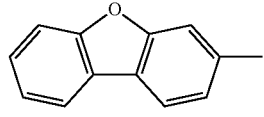
(A14-3) 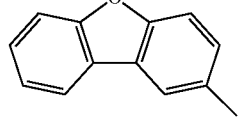
(A14-4) 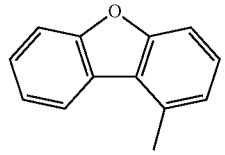
(A15-1) 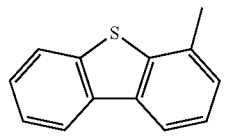
(A15-2) 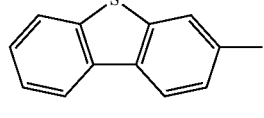
(A15-3) 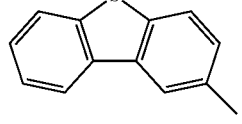

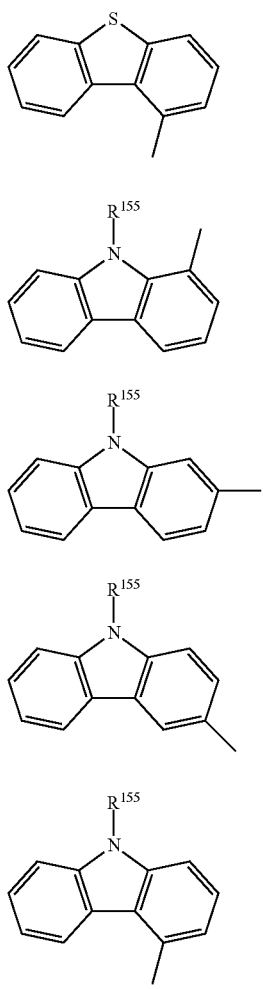
In these formulas, R¹⁵⁵ is as defined above.
[Chemical Formula 25]
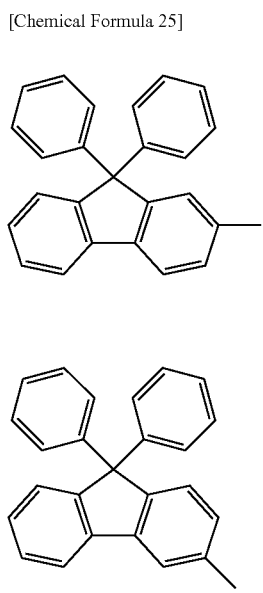
(A15-4)
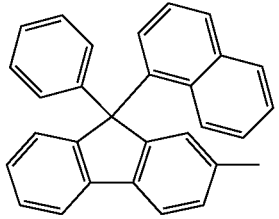
(A16-1)
(A16-2)
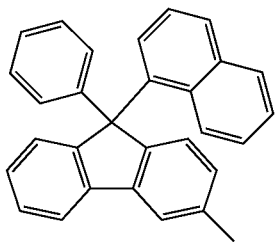
(A16-3)
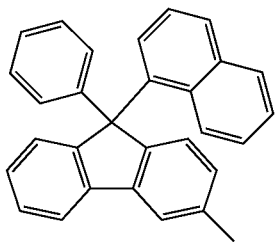
(A16-4)
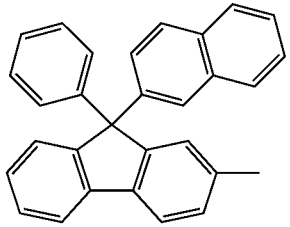
(A17-1)
(A17-2)
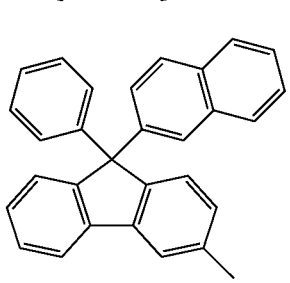
(A17-3)
(A17-4)
(A17-5)
(A17-6)
(A17-7)
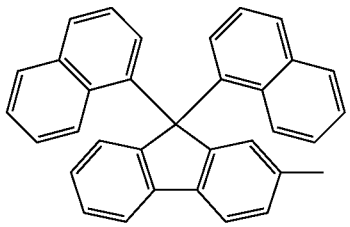
(A17-8)
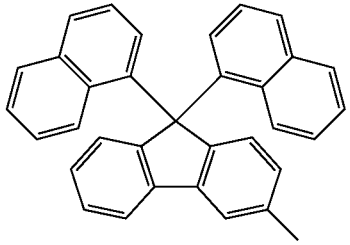

(A17-9)
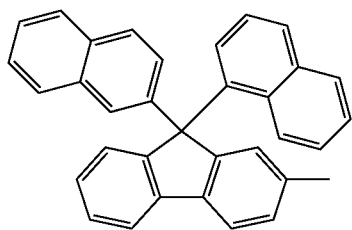

(A17-10)
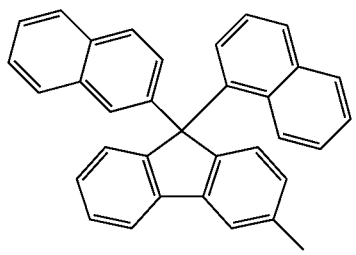

(A17-11)
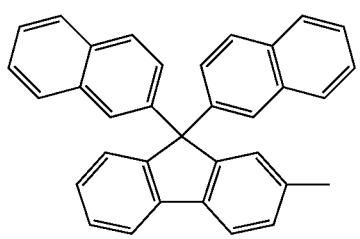

(A17-12)
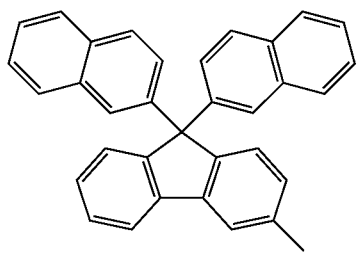

(A18-1)
(A18-2)
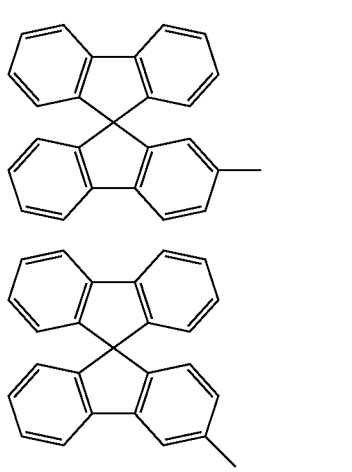

In formula (2), taking into account the ease of synthesizing the resulting aniline derivative, it is preferable for all the $Ar^1$ groups to be the same group and for all the $Ar^2$ groups to be the same group, and more preferable for all the $Ar^1$ and $Ar^2$ groups to be the same group. That is, the aniline derivative of formula (2) is more preferably an aniline derivative of formula (2-1) below.

Moreover, the aniline derivative of formula (2) is preferably an aniline derivative of formula (2-1), both because, as subsequently described, it can be synthesized with relative ease using the relatively inexpensive bis(4-aminophenyl)amine as the starting compound, and because the resulting aniline derivative has an excellent solubility in organic solvents.

[Chemical Formula 26]

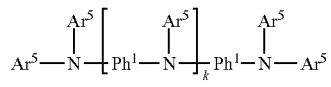
(2-1)

In formula (2-1), $Ph^1$ and k are as defined above and $Ar^5$ is at the same time a group having any of formulas (D1) to (D13) below, with a group having any of formulas (D1') to (D13') being preferred.

$Ar^5$ is exemplified by the same groups as those which are mentioned above as suitable examples of $Ar^1$.

[Chemical Formula 27]

(D1)
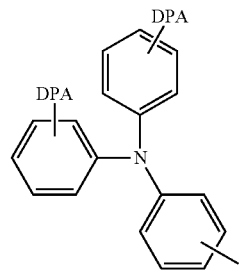

(D2)
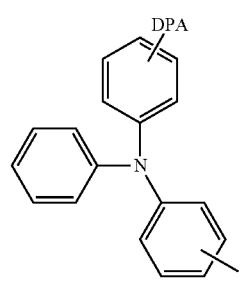

(D3)
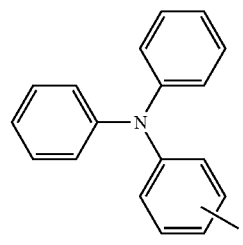

(D4)
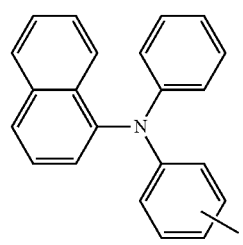

(D5) 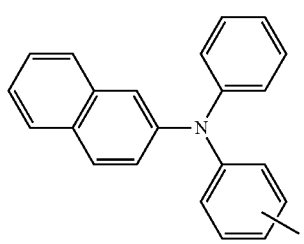
(D6) 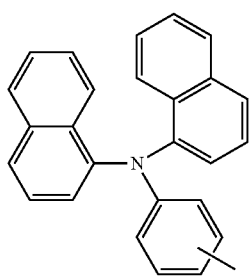
(D7) 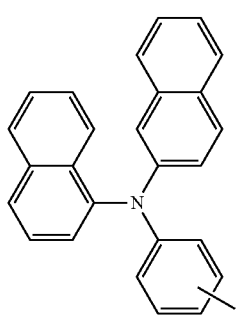
(D8) 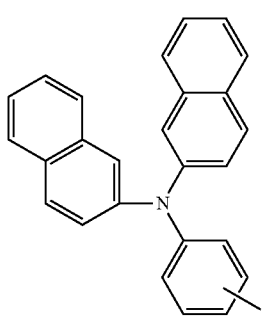
(D9) 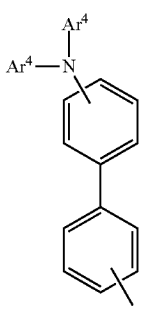
(D10) 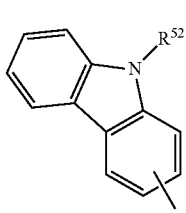
(D11) 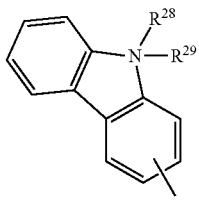
(D12) 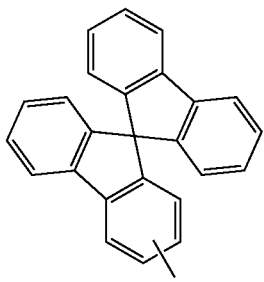
(D13) 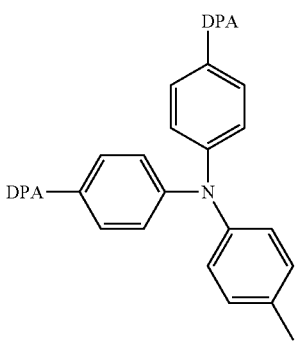
In these formulas, $R^{28}$, $R^{29}$, $R^{52}$, $Ar^4$ and DPA are as defined above.
[Chemical Formula 28]
(D1')

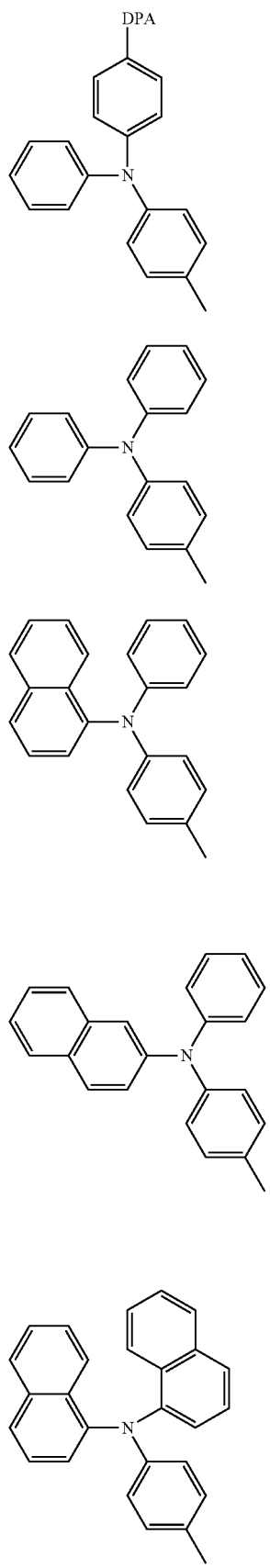
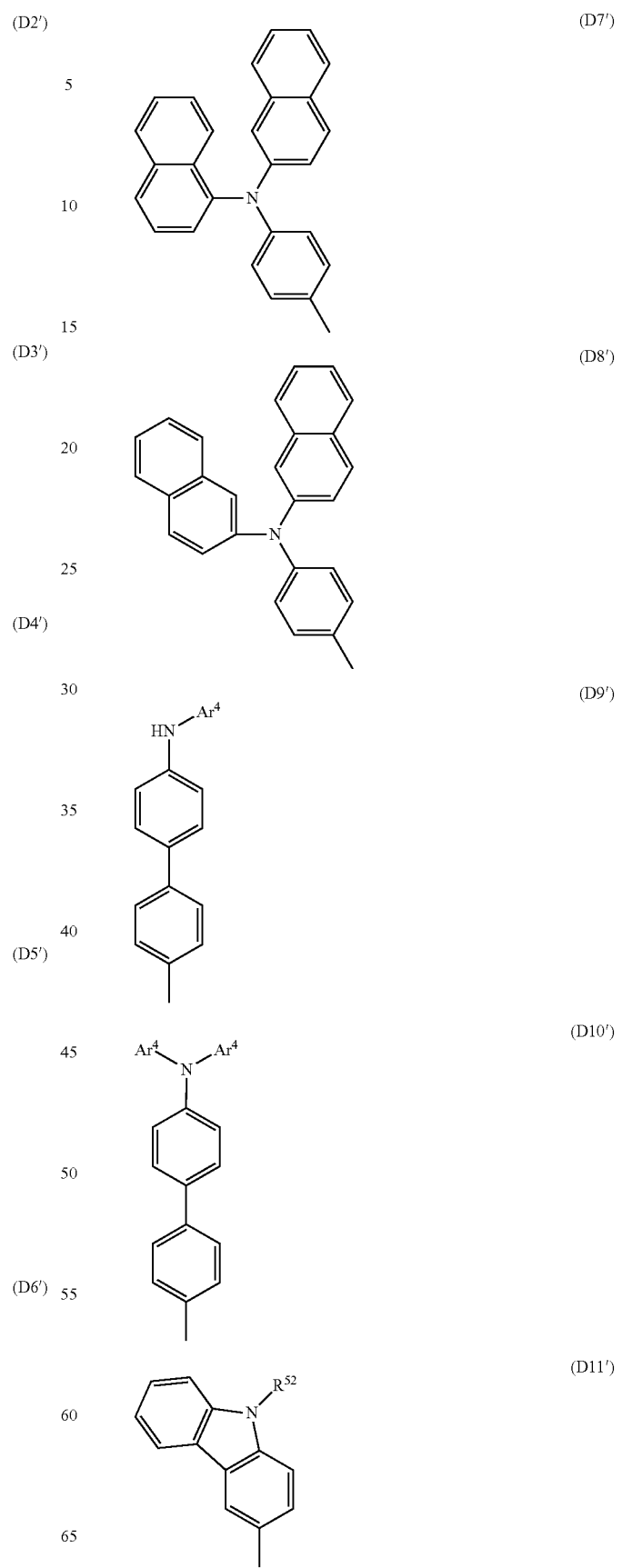

(D12') 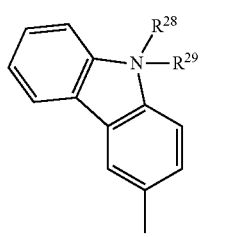

(D13') 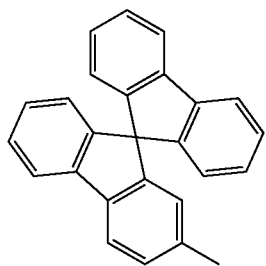

In these formulas, $R^{28}$, $R^{29}$, $R^{52}$, $Ar^4$ and DPA are as defined above.

The aniline derivative of formula (2) is preferably an aniline derivative of formula (2-2), both because, as subsequently described, it can be synthesized with relative ease using the relatively inexpensive bis(4-aminophenyl)amine as the starting compound, and because the resulting aniline derivative has an excellent solubility in organic solvents.

[Chemical Formula 29]

(2-2) 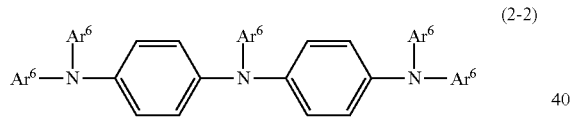

In the formula, $Ar^6$ at the same time represents a group having any of formulas (E1) to (E14).

[Chemical Formula 30]

(E1) 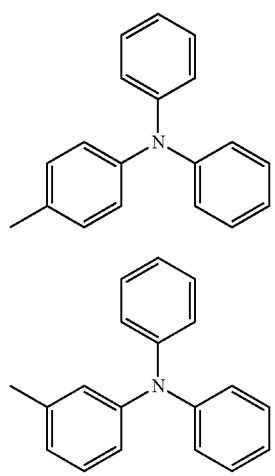

(E2)

(E3) 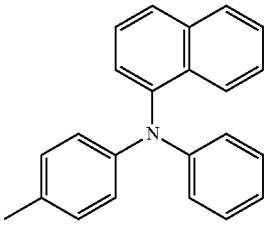

(E4) 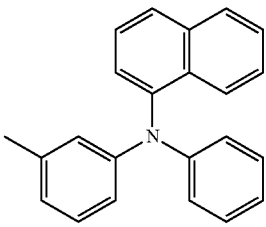

(E5) 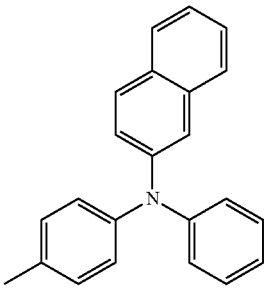

(E6) 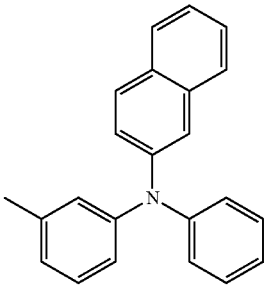

(E7) 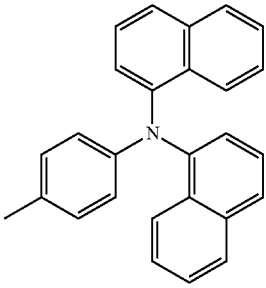

(E8) 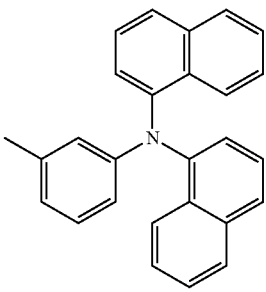

-continued
(E9) 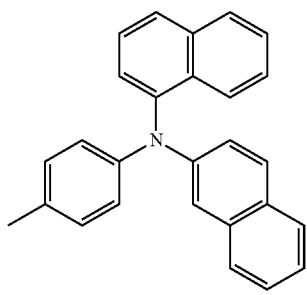
(E10) 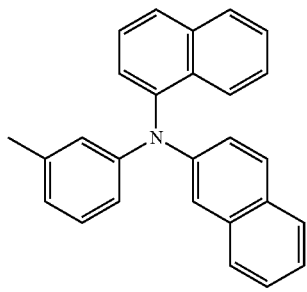
(E11) 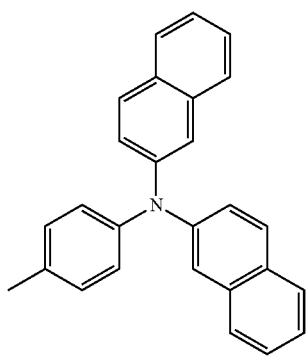
(E12) 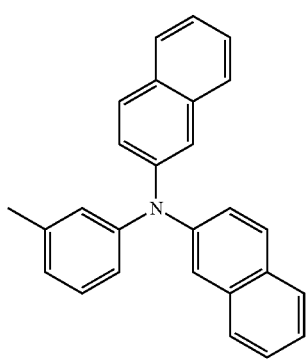
(E13) 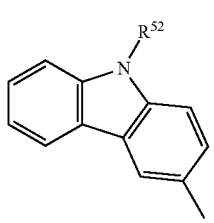
-continued
(E14) 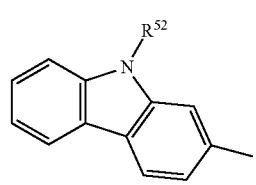
In these formulas, $R^{52}$ is as defined above.
In formula (3), $Ar^3$ is a group having any of formulas (C1) to (C8), with a group of any of formulas (C1') to (C8') being especially preferred.
[Chemical Formula 31]
(C1) 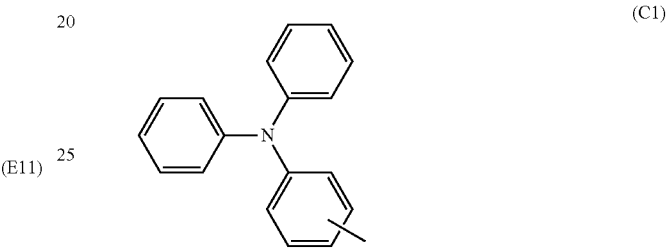
(C2) 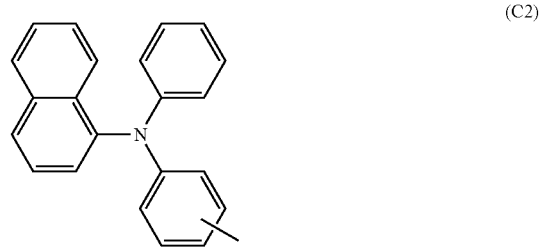
(C3) 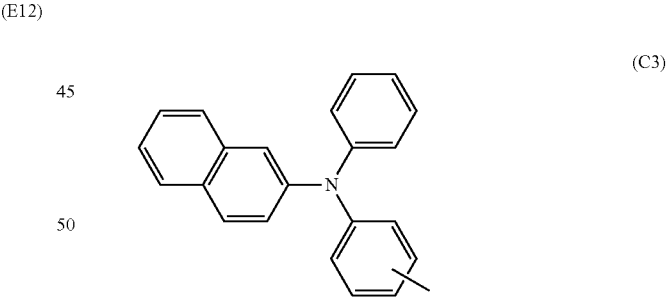
(C4) 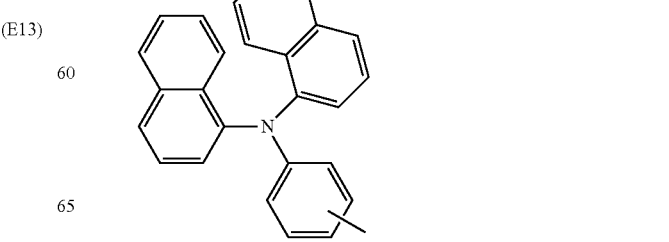

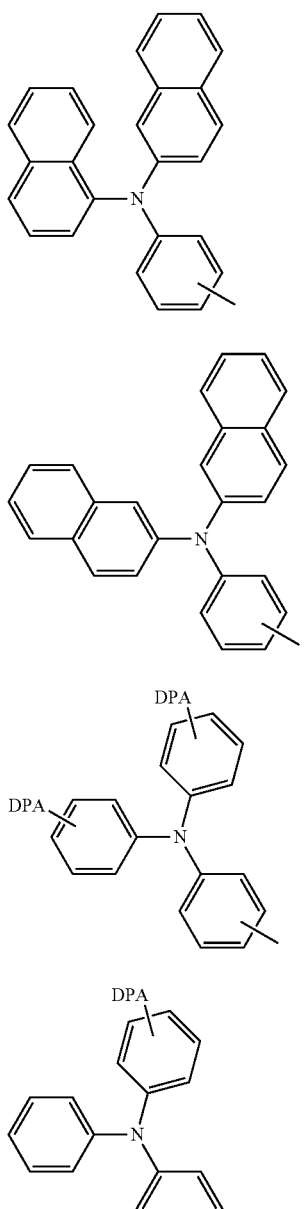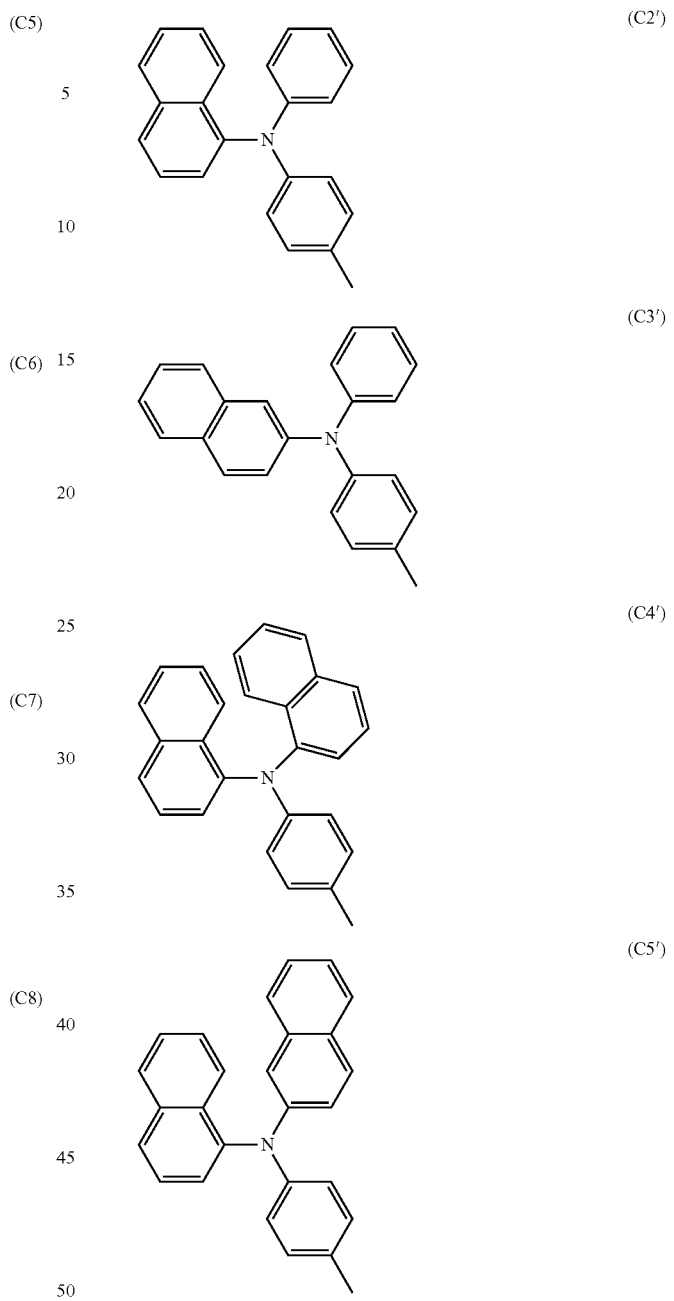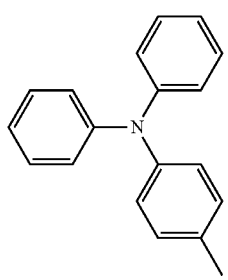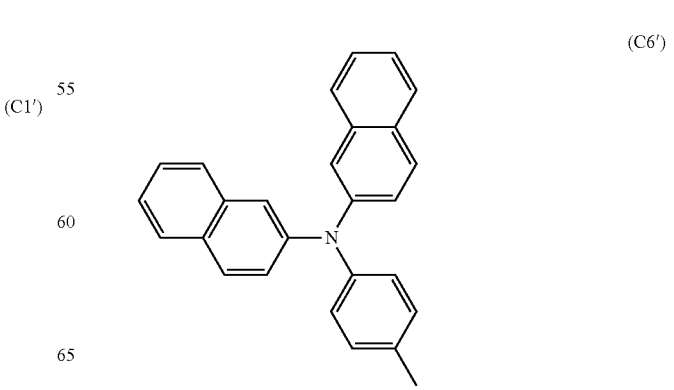

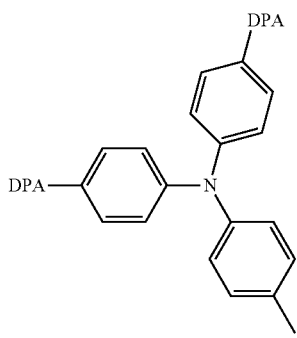
(C7')

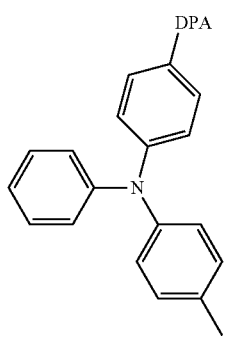
(C8')

In formula (2), k is an integer from 1 to 10. However, from the standpoint of increasing the solubility of the compound in the organic solvent, k is preferably from 1 to 5, more preferably from 1 to 3, even more preferably 1 or 2, and most preferably 1.

In formula (3), the letter "l" represents 1 or 2.

In $R^{28}$, $R^{29}$, $R^{52}$ and $R^{155}$ to $R^{157}$, $Z^1$ is preferably a halogen atom, a nitro group, a cyano group, an alkyl group of 1 to 10 carbon atoms which may be substituted with $Z^2$, an alkenyl group of 2 to 10 carbon atoms which may be substituted with $Z^2$, or an alkynyl group of 2 to 10 carbon atoms which may be substituted with $Z^2$; more preferably a halogen atom, a nitro group, a cyano group, an alkyl group of 1 to 3 carbon atoms which may be substituted with $Z^2$, an alkenyl group of 2 or 3 carbon atoms which may be substituted with $Z^2$, or an alkynyl group of 2 or 3 carbon atoms which may be substituted with $Z^2$; and even more preferably a fluorine atom, an alkyl group of 1 to 3 carbon atoms which may be substituted with $Z^2$, an alkenyl group of 2 or 3 carbon atoms which may be substituted with $Z^2$, or an alkynyl group of 2 or 3 carbon atoms which may be substituted with $Z^2$.

In $R^{28}$, $R^{29}$, $R^{52}$ and $R^{155}$ to $R^{157}$, $Z^4$ is preferably a halogen atom, a nitro group, a cyano group, or an aryl group of 6 to 14 carbon atoms which may be substituted with $Z^5$; more preferably a halogen atom, a nitro group, a cyano group, or an aryl group of 6 to 10 carbon atoms which may be substituted with $Z^5$; even more preferably a fluorine atom or an aryl group of 6 to 10 carbon atoms which may be substituted with $Z^5$; and yet more preferably a fluorine atom or a phenyl group which may be substituted with $Z^5$.

In $R^{28}$, $R^{29}$, $R^{52}$ and $R^{155}$ to $R^{157}$, $Z^2$ is preferably a halogen atom, a nitro group, a cyano group, or an aryl group of 6 to 14 carbon atoms which may be substituted with $Z^3$; more preferably a halogen atom, a nitro group, a cyano group, or an aryl group of 6 to 10 carbon atoms which may be substituted with $Z^3$; even more preferably a fluorine atom or an aryl group of 6 to 10 carbon atoms which may be substituted with $Z^3$; and still more preferably a fluorine atom or a phenyl group which may be substituted with $Z^3$.

In $R^{26}$, $R^{29}$, $R^{52}$ and $R^{155}$ to $R^{157}$, $Z^5$ is preferably a halogen atom, a nitro group, a cyano group, an alkyl group of 1 to 10 carbon atoms which may be substituted with $Z^3$, an alkenyl group of 2 to 10 carbon atoms which may be substituted with $Z^3$, or an alkynyl group of 2 to 10 carbon atoms which may be substituted with $Z^3$; more preferably a halogen atom, a nitro group, a cyano group, an alkyl group of 1 to 3 carbon atoms which may be substituted with $Z^3$, an alkenyl group of 2 or 3 carbon atoms which may be substituted with $Z^3$, or an alkynyl group of 2 or 3 carbon atoms which may be substituted with $Z^3$; and even more preferably a fluorine atom, an alkyl group of 1 to 3 carbon atoms which may be substituted with $Z^3$, an alkenyl group of 2 or 3 carbon atoms which may be substituted with $Z^3$, or an alkynyl group of 2 or 3 carbon atoms which may be substituted with $Z^3$.

In $R^{28}$, $R^{29}$, $R^{52}$ and $R^{155}$ to $R^{157}$, $Z^3$ is preferably a halogen atom, and more preferably a fluorine atom.

In $R^7$ to $R^{27}$, $R^{30}$ to $R^{51}$ and $R^{53}$ to $R^{154}$, $Z^1$ is preferably a halogen atom, a nitro group, a cyano group, an alkyl group of 1 to 3 carbon atoms which may be substituted with $Z^2$, an alkenyl group of 2 or 3 carbon atoms which may be substituted with $Z^2$, or an alkynyl group of 2 or 3 carbon atoms which may be substituted with $Z^2$; more preferably a halogen atom or an alkyl group of 1 to 3 carbon atoms which may be substituted with $Z^2$; and even more preferably a fluorine atom or a methyl group which may be substituted with $Z^2$.

In $R^7$ to $R^{27}$, $R^{30}$ to $R^{51}$ and $R^{53}$ to $R^{154}$, $Z^4$ is preferably a halogen atom, a nitro group, a cyano group, or an aryl group of 6 to 10 carbon atoms which may be substituted with $Z^5$; more preferably a halogen atom or an aryl group of 6 to 10 carbon atoms which may be substituted with $Z^5$; and even more preferably a fluorine atom or a phenyl group which may be substituted with $Z^5$.

In $R^7$ to $R^{27}$, $R^{30}$ to $R^{51}$ and $R^{53}$ to $R^{154}$, $Z^2$ is preferably a halogen atom, a nitro group, a cyano group, or an aryl group of 6 to 10 carbon atoms which may be substituted with $Z^3$; more preferably a halogen atom or an aryl group of 6 to 10 carbon atoms which may be substituted with $Z^3$; and even more preferably a fluorine atom or a phenyl group which may be substituted with $Z^3$.

In $R^7$ to $R^{27}$, $R^{30}$ to $R^{51}$ and $R^{53}$ to $R^{154}$, $Z^5$ is preferably a halogen atom, a nitro group, a cyano group, an alkyl group of 1 to 3 carbon atoms which may be substituted with $Z^3$, an alkenyl group of 2 or 3 carbon atoms which may be substituted with $Z^3$, or an alkynyl group of 2 or 3 carbon atoms which may be substituted with $Z^3$; more preferably a halogen atom or an alkyl group of 1 to 3 carbon atoms which may be substituted with $Z^3$; and even more preferably a fluorine atom or a methyl group which may be substituted with $Z^3$.

In $R^7$ to $R^{27}$, $R^{30}$ to $R^{51}$ and $R^{53}$ to $R^{154}$, $Z^3$ is preferably a halogen atom, and more preferably a fluorine atom.

Specific examples of groups that are suitable as $R^{52}$ and $R^{155}$ include, but are not limited to, those shown below.

[Chemical Formula 33]

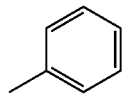
(N1)

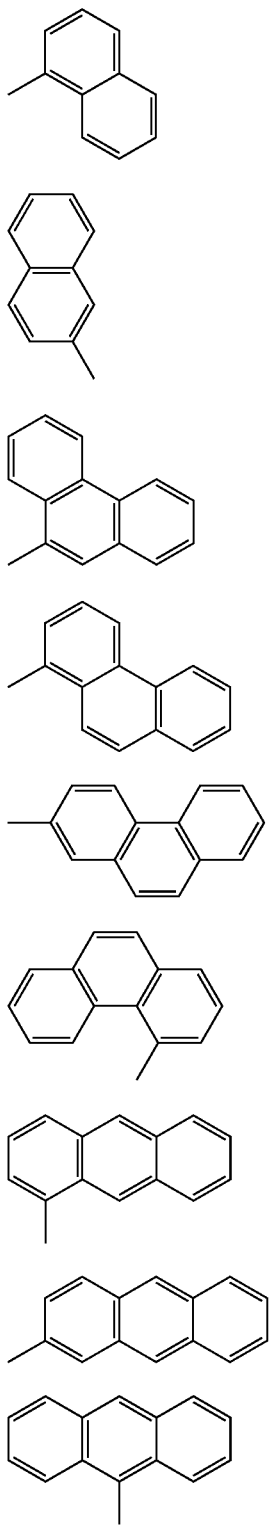
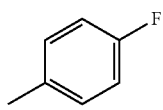
[Chemical Formula 34]
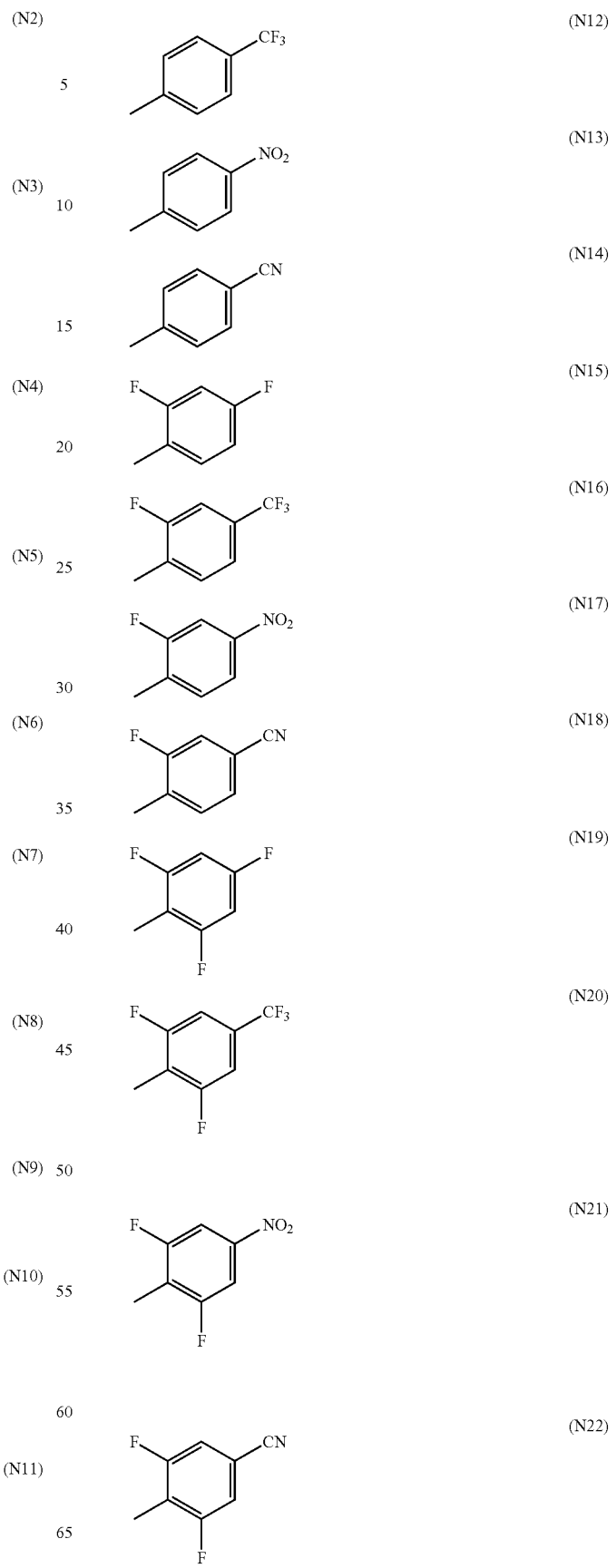

(N23) 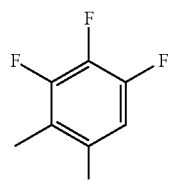
(N24) 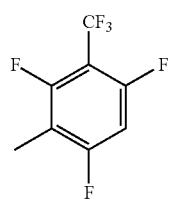
(N25) 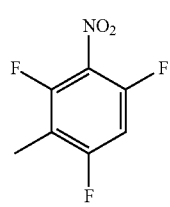
(N26) 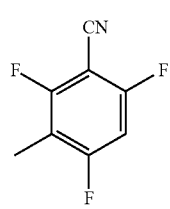
(N27) 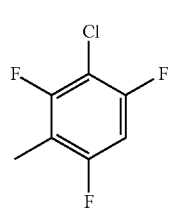
(N28) 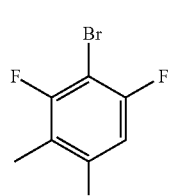
(N29) 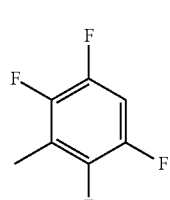
(N30) 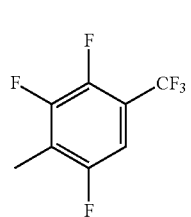
(N31) 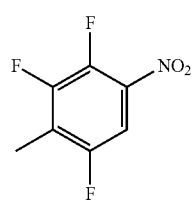
(N32) 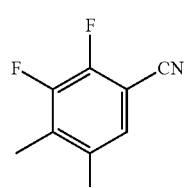
[Chemical Formula 35]
(N33) 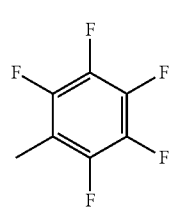
(N34) 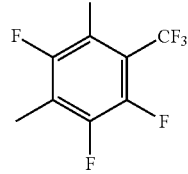
(N35) 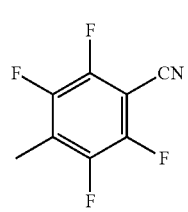
(N36) 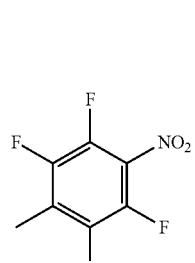
(N37) 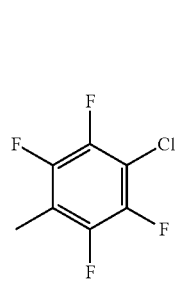

(N38) 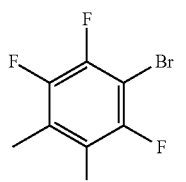
(N39) 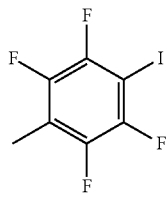
(N40) 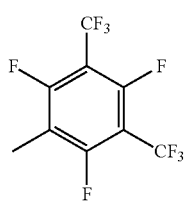
(N41) 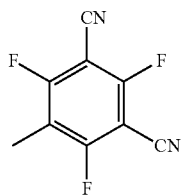
(N42) 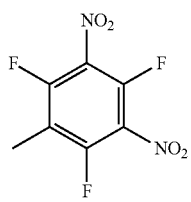
(N43) 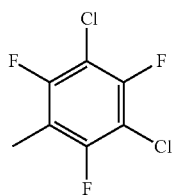
(N44) 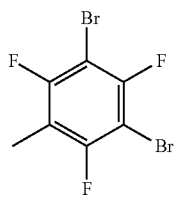
(N45) 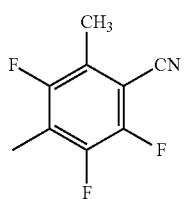
(N46) 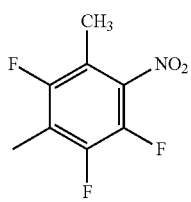
(N47) 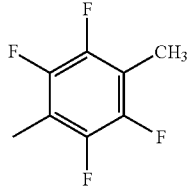
(N48) 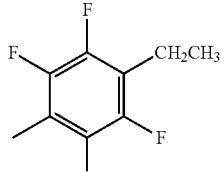
(N49) 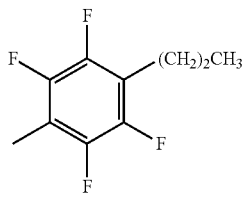
(N50) 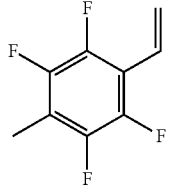
(N51) 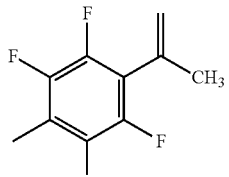
(N52) 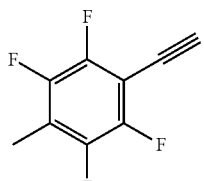
(N53) 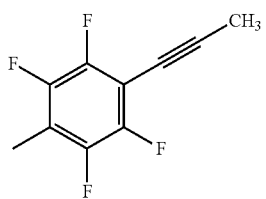

-continued

[Chemical Formula 36]

(N54)

[Chemical Formula 37]

(N55)

(N56)

(N57)

(N58)

(N59)

(N60)

(N61)

(N62)

(N63)

-continued (N64)

(N65)

(N66)

(N67)

(N68)

(N69)

(N70)

[Chemical Formula 38]

(N71)

(N72)

(N73)

(N74)

(N75)

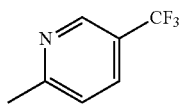
(N76)

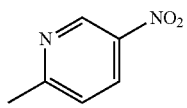
(N77)

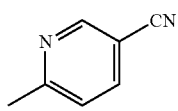
(N78)

The number of carbon atoms on the above alkyl, alkenyl and alkynyl groups is preferably not more than 10, more preferably not more than 6, and even more preferably not more than 4.

The number of carbon atoms on the above aryl groups and heteroaryl groups is preferably not more than 14, more preferably not more than 10, and even more preferably not more than 6.

Aniline derivatives of formula (2) can be prepared by reacting an amine compound of formula (4) with an aryl compound of formula (5) in the presence of a catalyst.

[Chemical Formula 39]

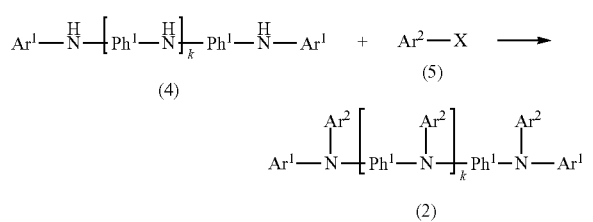

In these formulas, X is a halogen atom or a pseudo-halogen group; and $Ar^1$, $Ar^2$, $Ph^1$ and k are as defined above.

In particular, aniline derivatives of formula (2-1) can be prepared by reacting an amine compound of formula (6) with an aryl compound of formula (7) in the presence of a catalyst.

[Chemical Formula 40]

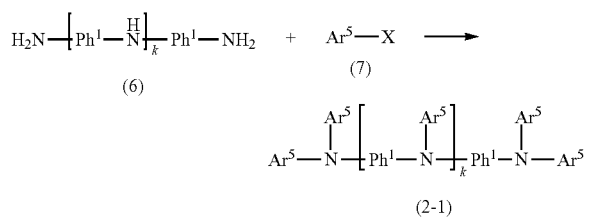

Here, X, $Ar^5$, $Ph^1$ and k are as defined above.

Aniline derivatives of formula (2-2) can be prepared by reacting bis(4-aminophenyl)amine with an aryl compound of formula (8) in the presence of a catalyst.

[Chemical Formula 41]

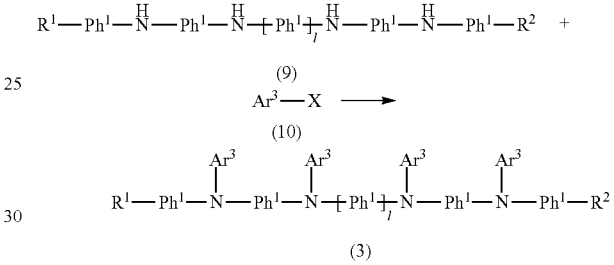

Here, X and $Ar^6$ are as defined above.

Aniline derivatives of formula (3) can be prepared by reacting an amine compound of formula (9) with an aryl compound of formula (10) in the presence of a catalyst.

[Chemical Formula 42]

$$R^1-Ph^1-\overset{H}{N}-Ph^1-\overset{H}{N}+Ph^1+\overset{H}{N}-Ph^1-\overset{H}{N}-Ph^1-R^2 +$$
(9)

$$Ar^3-X \longrightarrow$$
(10)

$$R^1-Ph^1-\overset{Ar^3}{N}-Ph^1-\overset{Ar^3}{N}+Ph^1+\overset{Ar^3}{N}-Ph^1-\overset{Ar^3}{N}-Ph^1-R^2$$
(3)

Here, X, $R^1$, $R^2$, $Ar^3$, $Ph^1$ and the letter "l" are as defined above.

Examples of the halogen atom include the same as those mentioned above.

Examples of pseudo-halogen groups include (fluoro)alkylsulfonyloxy groups such as methanesulfonyloxy, trifluoromethanesulfonyloxy and nonafluorobutanesulfonyloxy groups; and aromatic sulfonyloxy groups such as benzenesulfonyloxy and toluenesulfonyloxy groups.

The charging ratio of the amine compound of formula (4), (6) or (9) or bis(4-aminophenyl)amine to the aryl compound of formula (5), (7), (8) or (10) may be set so as to make the amount of the aryl compound at least 1 equivalent, and preferably about 1 to 1.2 equivalents, with respect to the molar amount of all NH groups on the amine compound or bis(4-aminophenyl)amine.

The catalyst used in the reaction is exemplified by copper catalysts such as copper chloride, copper bromide and copper iodide; and palladium catalysts such as $Pd(PPh_3)_4$ (tetrakis(triphenylphosphine)palladium), $Pd(PPh_3)_2Cl_2$ (bis(triphenylphosphine)dichloropalladium), $Pd(dba)_2$ (bis(dibenzylideneacetone)palladium, $Pd_2(dba)_3$ (tris(dibenzylideneacetone)palladium), $Pd(P-t-Bu_3)_2$ (bis(tri(t-butylphosphine))palladium), and $Pd(OAc)_2$ (palladium acetate). These catalysts may be used singly, or two or more may be used in combination. Also, these catalysts may be used together with suitable known ligands.

Illustrative examples of such ligands include tertiary phosphines such as triphenylphosphine, tri-o-tolylphosphine, diphenylmethylphosphine, phenyldimethylphosphine, trimethylphosphine, triethylphosphine, tributylphosphine, tri-tert-butylphosphine, di-t-butyl(phenyl)phosphine, di-tert-butyl(4-dimethylaminophenyl)phosphine, 1,2-bis(diphenylphosphino)ethane, 1,3-bis(diphenylphosphino)propane, 1,4-bis(diphenylphosphino)butane and 1,1'-bis(diphenylphosphino)ferrocene; and tertiary phosphites such as trimethylphosphite, triethylphosphite and triphenylphosphite.

The amount of catalyst used may be set to about 0.2 mole per mole of the aryl compound of formula (5), (7), (8) or (10), with about 0.15 mole being preferred.

When ligands are used, the amount thereof may be set to from 0.1 to 5 equivalents, and preferably from 1 to 2 equivalents, with respect to the metal catalyst used.

When the starting compounds are all solids, or from the standpoint of efficiently obtaining the target aniline derivative, it is preferable for each of the above reactions to be carried out in a solvent. When a solvent is used, the type of solvent is not particularly limited, provided it does not have an adverse effect on the reaction. Illustrative examples include aliphatic hydrocarbons (pentane, n-hexane, n-octane, n-decane, decalin, etc.), halogenated aliphatic hydrocarbons (chloroform, dichloromethane, dichloroethane, carbon tetrachloride, etc.), aromatic hydrocarbons (benzene, nitrobenzene, toluene, o-xylene, m-xylene, p-xylene, mesitylene, etc.), halogenated aromatic hydrocarbons (chlorobenzene, bromobenzene, o-dichlorobenzene, m-dichlorobenzene, p-dichlorobenzene, etc.), ethers (diethyl ether, diisopropyl ether, t-butyl methyl ether, tetrahydrofuran, dioxane, 1,2-dimethoxyethane, 1,2-diethoxyethane, etc.), ketones (acetone, methyl ethyl ketone, methyl isobutyl ketone, di-n-butyl ketone, cyclohexanone, etc.), amides (N,N-dimethylformamide, N,N-dimethylacetamide, etc.), lactams and lactones (N-methylpyrrolidone, γ-butyrolactone, etc.), ureas (N,N-dimethylimidazolidinone, tetramethylurea, etc.), sulfoxides (dimethylsulfoxide, sulfolane, etc.), and nitriles (acetonitrile, propionitrile, butyronitrile, etc.). These solvents may be used singly, or two or more may be used in admixture.

The reaction temperature may be suitably set in the range of the melting point to the boiling point of the solvent used, with a temperature of about 0° C. to 200° C. being preferred, and a temperature of 20 to 150° C. being more preferred.

Following reaction completion, the target aniline derivative can be obtained by work-up in the usual manner.

In the method of preparing an aniline derivative of formula (2) above, the amine compound of formula (4') that may be used as a starting material can be efficiently prepared by reacting an amine compound of formula (11) with an aryl compound of formula (12) in the presence of a catalyst.

[Chemical Formula 43]

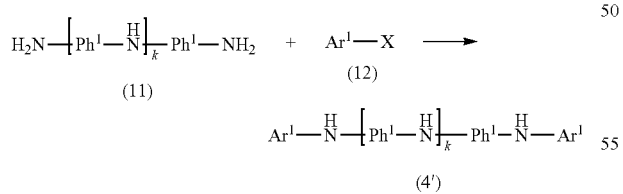

Here, X, $Ar^1$, $Ph^1$ and k are as defined above, provided that the two $Ar^1$ groups are not both groups of formula (B1).

The above method for preparing an amine compound of formula (4') involves carrying out a coupling reaction between an amine compound of formula (11) and an aryl compound of formula (12). The amine compound of formula (11) and the aryl compound of formula (12) are charged in a molar ratio of preferably about 2 to 2.4 moles of the aryl compound per mole of the amine compound.

In addition, various conditions relating to, for example, the catalyst, ligands, solvent and reaction temperature in the above coupling reaction are the same as the conditions described above for the method of preparing the aniline derivative of formula (2).

When preparing an aniline derivative wherein, in formula (2), $Ar^1$ is a group of the formula (B4) in which $R^{52}$ represents a hydrogen atom or is a group of formula (B10), or $Ar^2$ is a group of formula (A12) or a group of formula (A16) in which $R^{155}$ (including $R^{52}$ in formula (2-1)) represents a hydrogen atom, an aryl compound having a known protective group on the amino group may be used in the above reaction.

The aniline derivative of formula (2) or (3) can be synthesized by the method of WO 2015/050253.

Specific examples of aniline derivatives of formula (2) or (3) include, but are not limited to, those shown below. In the formulas and tables, "Me" stands for a methyl group, "Et" for an ethyl group, "Pr$^n$" for an n-propyl group, "Pr$^i$" for an i-propyl group, "Bu$^n$" for an n-butyl group, "Bu$^i$" for an i-butyl group, "Bu$^s$" for an s-butyl group, "Bu$^t$" for a t-butyl group, "DPA" for a diphenylamino group, and "SBF" for a 9,9'-spirobi[9H-fluoren]-2-yl group.

TABLE 1

(J1)

| Compound | $Ar^2$ |
|---|---|
| (J1-1) | (A1-1) |
| (J1-2) | (A1-2) |
| (J1-3) | (A2-1) |
| (J1-4) | (A2-2) |
| (J1-5) | (A2-3) |
| (J1-6) | (A2-4) |
| (J1-7) | (A2-5) |
| (J1-8) | (A3-1) |
| (J1-9) | (A3-2) |
| (J1-10) | (A3-3) |
| (J1-11) | (A4-1) |
| (J1-12) | (A4-2) |
| (J1-13) | (A4-3) |
| (J1-14) | (A5-1) |
| (J1-15) | (A5-2) |
| (J1-16) | (A5-3) |
| (J1-17) | (A6-1) |
| (J1-18) | (A6-2) |
| (J1-19) | (A6-3) |
| (J1-20) | (A6-4) |
| (J1-21) | (A6-5) |
| (J1-22) | (A6-6) |
| (J1-23) | (A6-7) |
| (J1-24) | (A6-8) |
| (J1-25) | (A6-9) |
| (J1-26) | (A6-10) |
| (J1-27) | (A6-11) |
| (J1-28) | (A6-12) |
| (J1-29) | (A6-13) |
| (J1-30) | (A6-14) |
| (J1-31) | (A6-15) |
| (J1-32) | (A7-1) |
| (J1-33) | (A7-2) |
| (J1-34) | (A7-3) |
| (J1-35) | (A8-1) |
| (J1-36) | (A8-2) |
| (J1-37) | (A8-3) |
| (J1-38) | (A9-1) |
| (J1-39) | (A9-2) |
| (J1-40) | (A9-3) |
| (J1-41) | (A10-1) |
| (J1-42) | (A10-2) |

TABLE 1-continued

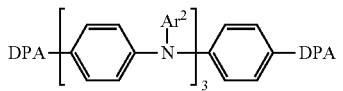
(J1)

| Compound | Ar² |
|---|---|
| (J1-43) | (A10-3) |
| (J1-44) | (A11-1) |
| (J1-45) | (A11-2) |
| (J1-46) | (A11-3) |
| (J1-47) | (A12-1) |
| (J1-48) | (A12-2) |
| (J1-49) | (A12-3) |
| (J1-50) | (A12-4) |
| (J1-51) | (A12-5) |
| (J1-52) | (A12-6) |
| (J1-53) | (A12-7) |
| (J1-54) | (A12-8) |
| (J1-55) | (A12-9) |
| (J1-56) | (A12-10) |
| (J1-57) | (A12-11) |
| (J1-58) | (A13-1) |
| (J1-59) | (A13-2) |
| (J1-60) | (A13-3) |
| (J1-61) | (A13-4) |
| (J1-62) | (A13-5) |
| (J1-63) | (A13-6) |
| (J1-64) | (A13-7) |
| (J1-65) | (A13-8) |
| (J1-66) | (A13-9) |
| (J1-67) | (A13-10) |
| (J1-68) | (A13-11) |
| (J1-69) | (A13-12) |
| (J1-70) | (A13-13) |
| (J1-71) | (A13-14) |
| (J1-72) | (A13-15) |
| (J1-73) | (A13-16) |
| (J1-74) | (A13-17) |
| (J1-75) | (A13-18) |
| (J1-76) | (A13-19) |
| (J1-77) | (A13-20) |
| (J1-78) | (A13-21) |
| (J1-79) | (A13-22) |
| (J1-80) | (A13-23) |
| (J1-81) | (A13-24) |
| (J1-82) | (A14-1) |
| (J1-83) | (A14-2) |
| (J1-84) | (A14-3) |
| (J1-85) | (A14-4) |
| (J1-86) | (A15-1) |
| (J1-87) | (A15-2) |
| (J1-88) | (A15-3) |
| (J1-89) | (A15-4) |
| (J1-90) | (A17-1) |
| (J1-91) | (A17-2) |
| (J1-92) | (A17-3) |
| (J1-93) | (A17-4) |
| (J1-94) | (A17-5) |
| (J1-95) | (A17-6) |
| (J1-96) | (A17-7) |
| (J1-97) | (A17-8) |
| (J1-98) | (A17-9) |
| (J1-99) | (A17-10) |
| (J1-100) | (A17-11) |
| (J1-101) | (A17-12) |
| (J1-102) | (A18-1) |
| (J1-103) | (A18-2) |

TABLE 2

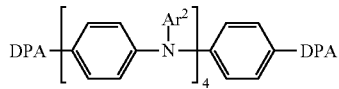
(J2)

| Compound | Ar² |
|---|---|
| (J2-1) | (A1-1) |
| (J2-2) | (A1-2) |
| (J2-3) | (A2-1) |
| (J2-4) | (A2-2) |
| (J2-5) | (A2-3) |
| (J2-6) | (A2-4) |
| (J2-7) | (A2-5) |
| (J2-8) | (A3-1) |
| (J2-9) | (A3-2) |
| (J2-10) | (A3-3) |
| (J2-11) | (A4-1) |
| (J2-12) | (A4-2) |
| (J2-13) | (A4-3) |
| (J2-14) | (A5-1) |
| (J2-15) | (A5-2) |
| (J2-16) | (A5-3) |
| (J2-17) | (A6-1) |
| (J2-18) | (A6-2) |
| (J2-19) | (A6-3) |
| (J2-20) | (A6-4) |
| (J2-21) | (A6-5) |
| (J2-22) | (A6-6) |
| (J2-23) | (A6-7) |
| (J2-24) | (A6-8) |
| (J2-25) | (A6-9) |
| (J2-26) | (A6-10) |
| (J2-27) | (A6-11) |
| (J2-28) | (A6-12) |
| (J2-29) | (A6-13) |
| (J2-30) | (A6-14) |
| (J2-31) | (A6-15) |
| (J2-32) | (A7-1) |
| (J2-33) | (A7-2) |
| (J2-34) | (A7-3) |
| (J2-35) | (A8-1) |
| (J2-36) | (A8-2) |
| (J2-37) | (A8-3) |
| (J2-38) | (A9-1) |
| (J2-39) | (A9-2) |
| (J2-40) | (A9-3) |
| (J2-41) | (A10-1) |
| (J2-42) | (A10-2) |
| (J2-43) | (A10-3) |
| (J2-44) | (A11-1) |
| (J2-45) | (A11-2) |
| (J2-46) | (A11-3) |
| (J2-47) | (A12-1) |
| (J2-48) | (A12-2) |
| (J2-49) | (A12-3) |
| (J2-50) | (A12-4) |
| (J2-51) | (A12-5) |
| (J2-52) | (A12-6) |
| (J2-53) | (A12-7) |
| (J2-54) | (A12-8) |
| (J2-55) | (A12-9) |
| (J2-56) | (A12-10) |
| (J2-57) | (A12-11) |
| (J2-58) | (A13-1) |
| (J2-59) | (A13-2) |
| (J2-60) | (A13-3) |
| (J2-61) | (A13-4) |
| (J2-62) | (A13-5) |
| (J2-63) | (A13-6) |
| (J2-64) | (A13-7) |
| (J2-65) | (A13-8) |
| (J2-66) | (A13-9) |
| (J2-67) | (A13-10) |
| (J2-68) | (A13-11) |
| (J2-69) | (A13-12) |
| (J2-70) | (A13-13) |
| (J2-71) | (A13-14) |

TABLE 2-continued (J2)

DPA—[—⟨phenyl⟩—N(Ar²)—⟨phenyl⟩—]₄—DPA

| Compound | Ar² |
|---|---|
| (J2-72) | (A13-15) |
| (J2-73) | (A13-16) |
| (J2-74) | (A13-17) |
| (J2-75) | (A13-18) |
| (J2-76) | (A13-19) |
| (J2-77) | (A13-20) |
| (J2-78) | (A13-21) |
| (J2-79) | (A13-22) |
| (J2-80) | (A13-23) |
| (J2-81) | (A13-24) |
| (J2-82) | (A14-1) |
| (J2-83) | (A14-2) |
| (J2-84) | (A14-3) |
| (J2-85) | (A14-4) |
| (J2-86) | (A15-1) |
| (J2-87) | (A15-2) |
| (J2-88) | (A15-3) |
| (J2-89) | (A15-4) |
| (J2-90) | (A17-1) |
| (J2-91) | (A17-2) |
| (J2-92) | (A17-3) |
| (J2-93) | (A17-4) |
| (J2-94) | (A17-5) |
| (J2-95) | (A17-6) |
| (J2-96) | (A17-7) |
| (J2-97) | (A17-8) |
| (J2-98) | (A17-9) |
| (J2-99) | (A17-10) |
| (J2-100) | (A17-11) |
| (J2-101) | (A17-12) |
| (J2-102) | (A18-1) |
| (J2-103) | (A18-2) |

TABLE 3

(J3)

| Compound | $R^{155}$ |
|---|---|
| (J3-1) | (N1) |
| (J3-2) | (N2) |
| (J3-3) | (N3) |
| (J3-4) | (N4) |
| (J3-5) | (N5) |
| (J3-6) | (N6) |
| (J3-7) | (N7) |
| (J3-8) | (N8) |
| (J3-9) | (N9) |
| (J3-10) | (N10) |
| (J3-11) | (N11) |
| (J3-12) | (N12) |
| (J3-13) | (N13) |
| (J3-14) | (N14) |
| (J3-15) | (N15) |
| (J3-16) | (N16) |
| (J3-17) | (N17) |
| (J3-18) | (N18) |
| (J3-19) | (N19) |
| (J3-20) | (N20) |
| (J3-21) | (N21) |

TABLE 3-continued (J3)

| Compound | $R^{155}$ |
|---|---|
| (J3-22) | (N22) |
| (J3-23) | (N23) |
| (J3-24) | (N24) |
| (J3-25) | (N25) |
| (J3-26) | (N26) |
| (J3-27) | (N27) |
| (J3-28) | (N28) |
| (J3-29) | (N29) |
| (J3-30) | (N30) |
| (J3-31) | (N31) |
| (J3-32) | (N32) |
| (J3-33) | (N33) |
| (J3-34) | (N34) |
| (J3-35) | (N35) |
| (J3-36) | (N36) |
| (J3-37) | (N37) |
| (J3-38) | (N38) |
| (J3-39) | (N39) |
| (J3-40) | (N40) |
| (J3-41) | (N41) |
| (J3-42) | (N42) |
| (J3-43) | (N43) |
| (J3-44) | (N44) |
| (J3-45) | (N45) |
| (J3-46) | (N46) |
| (J3-47) | (N47) |
| (J3-48) | (N48) |
| (J3-49) | (N49) |
| (J3-50) | (N50) |
| (J3-51) | (N51) |
| (J3-52) | (N52) |
| (J3-53) | (N53) |
| (J3-54) | (N54) |
| (J3-55) | (N55) |
| (J3-56) | (N56) |
| (J3-57) | (N57) |
| (J3-58) | (N58) |
| (J3-59) | (N59) |
| (J3-60) | (N60) |
| (J3-61) | (N61) |
| (J3-62) | (N62) |
| (J3-63) | (N63) |
| (J3-64) | (N64) |
| (J3-65) | (N65) |
| (J3-66) | (N66) |
| (J3-67) | (N67) |
| (J3-68) | (N68) |
| (J3-69) | (N69) |
| (J3-70) | (N70) |
| (J3-71) | (N71) |
| (J3-72) | (N72) |
| (J3-73) | (N73) |
| (J3-74) | (N74) |
| (J3-75) | (N75) |
| (J3-76) | (N76) |
| (J3-77) | (N77) |
| (J3-78) | (N78) |
| (J3-79) | —H |
| (J3-80) | —Me |
| (J3-81) | —Et |
| (J3-82) | —Pr$^n$ |
| (J3-83) | —Pr$^i$ |
| (J3-84) | —Bu$^n$ |

TABLE 3-continued

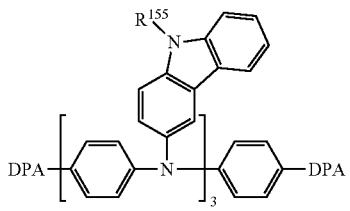
(J3)

| Compound | R¹⁵⁵ |
|---|---|
| (J3-85) | —Buⁱ |
| (J3-86) | —Buˢ |
| (J3-87) | —Buᵗ |

TABLE 4

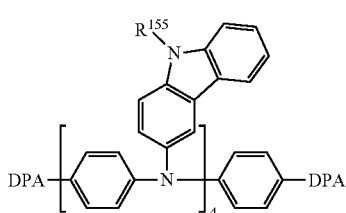
(J4)

| Compound | R¹⁵⁵ |
|---|---|
| (J4-1) | (N1) |
| (J4-2) | (N2) |
| (J4-3) | (N3) |
| (J4-4) | (N4) |
| (J4-5) | (N5) |
| (J4-6) | (N6) |
| (J4-7) | (N7) |
| (J4-8) | (N8) |
| (J4-9) | (N9) |
| (J4-10) | (N10) |
| (J4-11) | (N11) |
| (J4-12) | (N12) |
| (J4-13) | (N13) |
| (J4-14) | (N14) |
| (J4-15) | (N15) |
| (J4-16) | (N16) |
| (J4-17) | (N17) |
| (J4-18) | (N18) |
| (J4-19) | (N19) |
| (J4-20) | (N20) |
| (J4-21) | (N21) |
| (J4-22) | (N22) |
| (J4-23) | (N23) |
| (J4-24) | (N24) |
| (J4-25) | (N25) |
| (J4-26) | (N26) |
| (J4-27) | (N27) |
| (J4-28) | (N28) |
| (J4-29) | (N29) |
| (J4-30) | (N30) |
| (J4-31) | (N31) |
| (J4-32) | (N32) |
| (J4-33) | (N33) |
| (J4-34) | (N34) |
| (J4-35) | (N35) |
| (J4-36) | (N36) |
| (J4-37) | (N37) |
| (J4-38) | (N38) |
| (J4-39) | (N39) |
| (J4-40) | (N40) |
| (J4-41) | (N41) |
| (J4-42) | (N42) |
| (J4-43) | (N43) |
| (J4-44) | (N44) |

TABLE 4-continued

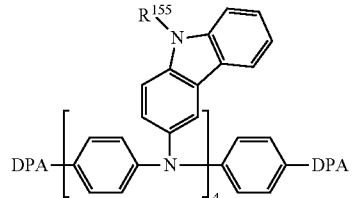
(J4)

| Compound | R¹⁵⁵ |
|---|---|
| (J4-45) | (N45) |
| (J4-46) | (N46) |
| (J4-47) | (N47) |
| (J4-48) | (N48) |
| (J4-49) | (N49) |
| (J4-50) | (N60) |
| (J4-51) | (N51) |
| (J4-52) | (N52) |
| (J4-53) | (N53) |
| (J4-54) | (N54) |
| (J4-55) | (N55) |
| (J4-56) | (N56) |
| (J4-57) | (N57) |
| (J4-58) | (N58) |
| (J4-59) | (N59) |
| (J4-60) | (N60) |
| (J4-61) | (N61) |
| (J4-62) | (N62) |
| (J4-63) | (N63) |
| (J4-54) | (N64) |
| (J4-65) | (N65) |
| (J4-66) | (N66) |
| (J4-67) | (N67) |
| (J4-68) | (N68) |
| (J4-69) | (N69) |
| (J4-70) | (N70) |
| (J4-71) | (N71) |
| (J4-72) | (N72) |
| (J4-73) | (N73) |
| (J4-74) | (N74) |
| (J4-75) | (N75) |
| (J4-76) | (N76) |
| (J4-77) | (N77) |
| (J4-78) | (N78) |
| (J4-79) | —H |
| (J4-80) | —Me |
| (J4-81) | —Et |
| (J4-82) | —Prⁿ |
| (J4-83) | —Prⁱ |
| (J4-84) | —Buⁿ |
| (J4-85) | —Buⁱ |
| (J4-86) | —Buˢ |
| (J4-87) | —Buᵗ |

TABLE 5

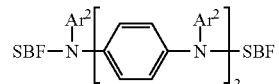
(J5)

| Compound | Ar² |
|---|---|
| (J5-1) | (A1-1) |
| (J5-2) | (A1-2) |
| (J5-3) | (A2-1) |
| (J5-4) | (A2-2) |
| (J5-5) | (A2-3) |
| (J5-6) | (A2-4) |
| (J5-7) | (A2-5) |
| (J5-8) | (A3-1) |
| (J5-9) | (A3-2) |
| (J5-10) | (A3-3) |

TABLE 5-continued (J5)

SBF—N(Ar²)—[C₆H₄]—N(Ar²)—SBF ]₂

| Compound | Ar² |
|---|---|
| (J5-11) | (A4-1) |
| (J5-12) | (A4-2) |
| (J5-13) | (A4-3) |
| (J5-14) | (A5-1) |
| (J5-15) | (A5-2) |
| (J5-16) | (A5-3) |
| (J5-17) | (A6-1) |
| (J5-18) | (A6-2) |
| (J5-19) | (A6-3) |
| (J5-20) | (A6-4) |
| (J5-21) | (A6-5) |
| (J5-22) | (A6-6) |
| (J5-23) | (A6-7) |
| (J5-24) | (A6-8) |
| (J5-25) | (A6-9) |
| (J5-26) | (A6-10) |
| (J5-27) | (A6-11) |
| (J5-28) | (A6-12) |
| (J5-29) | (A6-13) |
| (J5-30) | (A6-14) |
| (J5-31) | (A6-15) |
| (J5-32) | (A7-1) |
| (J5-33) | (A7-2) |
| (J5-34) | (A7-3) |
| (J5-35) | (A8-1) |
| (J5-36) | (A8-2) |
| (J5-37) | (A8-3) |
| (J5-38) | (A9-1) |
| (J5-39) | (A9-2) |
| (J5-40) | (A9-3) |
| (J5-41) | (A10-1) |
| (J5-42) | (A10-2) |
| (J5-43) | (A10-3) |
| (J5-44) | (A11-1) |
| (J5-45) | (A11-2) |
| (J5-46) | (A11-3) |
| (J5-47) | (A12-1) |
| (J5-48) | (A12-2) |
| (J5-49) | (A12-3) |
| (J5-50) | (A12-4) |
| (J5-51) | (A12-5) |
| (J5-52) | (A12-6) |
| (J5-53) | (A12-7) |
| (J5-54) | (A12-8) |
| (J5-55) | (A12-9) |
| (J5-56) | (A12-10) |
| (J5-57) | (A12-11) |
| (J5-58) | (A13-1) |
| (J5-59) | (A13-2) |
| (J5-60) | (A13-3) |
| (J5-61) | (A13-4) |
| (J5-62) | (A13-5) |
| (J5-63) | (A13-6) |
| (J5-64) | (A13-7) |
| (J5-65) | (A13-8) |
| (J5-66) | (A13-9) |
| (J5-67) | (A13-10) |
| (J5-68) | (A13-11) |
| (J5-69) | (A13-12) |
| (J5-70) | (A13-13) |
| (J5-71) | (A13-14) |
| (J5-72) | (A13-15) |
| (J5-73) | (A13-16) |
| (J5-74) | (A13-17) |
| (J5-75) | (A13-18) |
| (J5-76) | (A13-19) |
| (J5-77) | (A13-20) |
| (J5-78) | (A13-21) |
| (J5-79) | (A13-22) |
| (J5-80) | (A13-23) |
| (J5-81) | (A13-24) |

TABLE 5-continued (J5)

SBF—N(Ar²)—[C₆H₄]—N(Ar²)—SBF ]₂

| Compound | Ar² |
|---|---|
| (J5-82) | (A14-1) |
| (J5-83) | (A14-2) |
| (J5-84) | (A14-3) |
| (J5-85) | (A14-4) |
| (J5-86) | (A15-1) |
| (J5-87) | (A15-2) |
| (J5-88) | (A15-3) |
| (J5-89) | (A15-4) |
| (J5-90) | (A17-1) |
| (J5-91) | (A17-2) |
| (J5-92) | (A17-3) |
| (J5-93) | (A17-4) |
| (J5-94) | (A17-5) |
| (J5-95) | (A17-6) |
| (J5-96) | (A17-7) |
| (J5-97) | (A17-8) |
| (J5-98) | (A17-9) |
| (J5-99) | (A17-10) |
| (J5-100) | (A17-11) |
| (J5-101) | (A17-12) |
| (J5-102) | (A18-1) |
| (J5-103) | (A18-2) |

TABLE 6

(J6)

SBF—N(Ar²)—[C₆H₄]—N(Ar²)—SBF ]₃

| Compound | Ar² |
|---|---|
| (J6-1) | (A1-1) |
| (J6-2) | (A1-2) |
| (J6-3) | (A2-1) |
| (J6-4) | (A2-2) |
| (J6-5) | (A2-3) |
| (J6-6) | (A2-4) |
| (J6-7) | (A2-5) |
| (J6-8) | (A3-1) |
| (J6-9) | (A3-2) |
| (J6-10) | (A3-3) |
| (J6-11) | (A4-1) |
| (J6-12) | (A4-2) |
| (J6-13) | (A4-3) |
| (J6-14) | (A5-1) |
| (J6-15) | (A5-2) |
| (J6-16) | (A5-3) |
| (J6-17) | (A6-1) |
| (J6-18) | (A6-2) |
| (J6-19) | (A6-3) |
| (J6-20) | (A6-4) |
| (J6-21) | (A6-5) |
| (J6-22) | (A6-6) |
| (J6-23) | (A6-7) |
| (J6-24) | (A6-8) |
| (J6-25) | (A6-9) |
| (J6-26) | (A6-10) |
| (J6-27) | (A6-11) |
| (J6-28) | (A6-12) |
| (J6-29) | (A6-13) |
| (J6-30) | (A6-14) |
| (J6-31) | (A6-15) |
| (J6-32) | (A7-1) |
| (J6-33) | (A7-2) |
| (J6-34) | (A7-3) |
| (J6-35) | (A8-1) |
| (J6-36) | (A8-2) |

TABLE 6-continued (J6)

SBF—N(Ar²)—[C₆H₄—N(Ar²)]₃—SBF

| Compound | Ar² |
|---|---|
| (J6-37) | (A8-3) |
| (J6-38) | (A9-1) |
| (J6-39) | (A9-2) |
| (J6-40) | (A9-3) |
| (J6-41) | (A10-1) |
| (J6-42) | (A10-2) |
| (J6-43) | (A10-3) |
| (J6-44) | (A11-1) |
| (J6-45) | (A11-2) |
| (J6-46) | (A11-3) |
| (J6-47) | (A12-1) |
| (J6-48) | (A12-2) |
| (J6-49) | (A12-3) |
| (J6-50) | (A12-4) |
| (J6-51) | (A12-5) |
| (J6-52) | (A12-6) |
| (J6-53) | (A12-7) |
| (J6-54) | (A12-8) |
| (J6-55) | (A12-9) |
| (J6-56) | (A12-10) |
| (J6-57) | (A12-11) |
| (J6-58) | (A13-1) |
| (J6-59) | (A13-2) |
| (J6-60) | (A13-3) |
| (J6-61) | (A13-4) |
| (J6-62) | (A13-5) |
| (J6-63) | (A13-6) |
| (J6-64) | (A13-7) |
| (J6-65) | (A13-8) |
| (J6-66) | (A13-9) |
| (J6-67) | (A13-10) |
| (J6-68) | (A13-11) |
| (J6-69) | (A13-12) |
| (J6-70) | (A13-13) |
| (J6-71) | (A13-14) |
| (J6-72) | (A13-15) |
| (J6-73) | (A13-16) |
| (J6-74) | (A13-17) |
| (J6-75) | (A13-18) |
| (J6-76) | (A13-19) |
| (J6-77) | (A13-20) |
| (J6-78) | (A13-21) |
| (J6-79) | (A13-22) |
| (J6-80) | (A13-23) |
| (J6-81) | (A13-24) |
| (J6-82) | (A14-1) |
| (J6-83) | (A14-2) |
| (J6-84) | (A14-3) |
| (J6-85) | (A14-4) |
| (J6-86) | (A15-1) |
| (J6-87) | (A15-2) |
| (J6-88) | (A15-3) |
| (J6-89) | (A15-4) |
| (J6-90) | (A17-1) |
| (J6-91) | (A17-2) |
| (J6-92) | (A17-3) |
| (J6-93) | (A17-4) |
| (J6-94) | (A17-5) |
| (J6-95) | (A17-6) |
| (J6-96) | (A17-7) |
| (J6-97) | (A17-8) |
| (J6-98) | (A17-9) |
| (J6-99) | (A17-10) |
| (J6-100) | (A17-11) |
| (J6-101) | (A17-12) |
| (J6-102) | (A18-1) |
| (J6-103) | (A18-2) |

TABLE 7

(J7)

| Compound | $R^{155}$ |
|---|---|
| (J7-1) | (N1) |
| (J7-2) | (N2) |
| (J7-3) | (N3) |
| (J7-4) | (N4) |
| (J7-5) | (N5) |
| (J7-6) | (N6) |
| (J7-7) | (N7) |
| (J7-8) | (N8) |
| (J7-9) | (N9) |
| (J7-10) | (N10) |
| (J7-11) | (N11) |
| (J7-12) | (N12) |
| (J7-13) | (N13) |
| (J7-14) | (N14) |
| (J7-15) | (N15) |
| (J7-16) | (N16) |
| (J7-17) | (N17) |
| (J7-18) | (N18) |
| (J7-19) | (N19) |
| (J7-20) | (N20) |
| (J7-21) | (N21) |
| (J7-22) | (N22) |
| (J7-23) | (N23) |
| (J7-24) | (N24) |
| (J7-25) | (N25) |
| (J7-26) | (N26) |
| (J7-27) | (N27) |
| (J7-28) | (N28) |
| (J7-29) | (N29) |
| (J7-30) | (N30) |
| (J7-31) | (N31) |
| (J7-32) | (N32) |
| (J7-33) | (N33) |
| (J7-34) | (N34) |
| (J7-35) | (N35) |
| (J7-36) | (N36) |
| (J7-37) | (N37) |
| (J7-38) | (N38) |
| (J7-39) | (N39) |
| (J7-40) | (N40) |
| (J7-41) | (N41) |
| (J7-42) | (N42) |
| (J7-43) | (N43) |
| (J7-44) | (N44) |
| (J7-45) | (N45) |
| (J7-46) | (N46) |
| (J7-47) | (N47) |
| (J7-48) | (N48) |
| (J7-49) | (N49) |
| (J7-50) | (N50) |
| (J7-51) | (N51) |
| (J7-52) | (N52) |
| (J7-53) | (N53) |
| (J7-54) | (N54) |
| (J7-55) | (N55) |
| (J7-56) | (N56) |
| (J7-57) | (N57) |
| (J7-58) | (N58) |
| (J7-59) | (N59) |
| (J7-60) | (N60) |
| (J7-61) | (N61) |
| (J7-62) | (N62) |
| (J7-63) | (N63) |

TABLE 7-continued

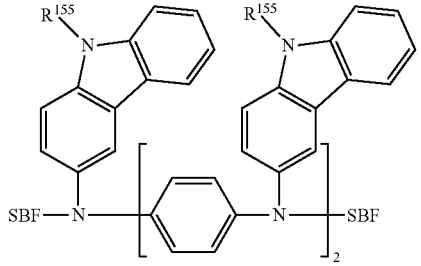

(J7)

| Compound | R^{155} |
|---|---|
| (J7-64) | (N64) |
| (J7-65) | (N65) |
| (J7-66) | (N66) |
| (J7-67) | (N67) |
| (J7-68) | (N68) |
| (J7-69) | (N69) |
| (J7-70) | (N70) |
| (J7-71) | (N71) |
| (J7-72) | (N72) |
| (J7-73) | (N73) |
| (J7-74) | (N74) |
| (J7-75) | (N75) |
| (J7-76) | (N76) |
| (J7-77) | (N77) |
| (J7-78) | (N78) |
| (J7-79) | —H |
| (J7-80) | —Me |
| (J7-81) | —Et |
| (J7-82) | —Pr$^n$ |
| (J7-83) | —Pr$^i$ |
| (J7-84) | —Bu$^n$ |
| (J7-85) | —Bu$^i$ |
| (J7-86) | —Bu$^s$ |
| (J7-87) | —Bu$^t$ |

TABLE 8

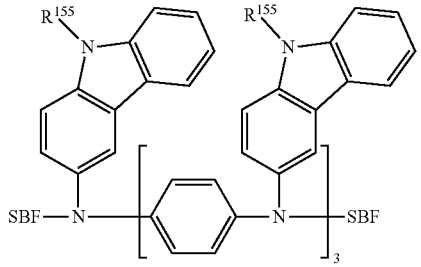

(J8)

| Compound | R^{155} |
|---|---|
| (J8-1) | (N1) |
| (J8-2) | (N2) |
| (J8-3) | (N3) |
| (J8-4) | (N4) |
| (J8-5) | (N5) |
| (J8-6) | (N6) |
| (J8-7) | (N7) |
| (J8-8) | (N8) |
| (J8-9) | (N9) |
| (J8-10) | (N10) |
| (J8-11) | (N11) |
| (J8-12) | (N12) |
| (J8-13) | (N13) |
| (J8-14) | (N14) |
| (J8-15) | (N15) |
| (J8-16) | (N16) |
| (J8-17) | (N17) |
| (J8-18) | (N18) |

TABLE 8-continued

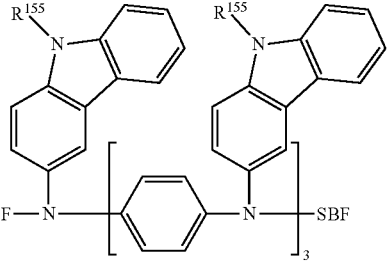

(J8)

| Compound | R^{155} |
|---|---|
| (J8-19) | (N19) |
| (J8-20) | (N20) |
| (J8-21) | (N21) |
| (J8-22) | (N22) |
| (J8-23) | (N23) |
| (J8-24) | (N24) |
| (J8-25) | (N25) |
| (J8-26) | (N26) |
| (J8-27) | (N27) |
| (J8-28) | (N28) |
| (J8-29) | (N29) |
| (J8-30) | (N30) |
| (J8-31) | (N31) |
| (J8-32) | (N32) |
| (J8-33) | (N33) |
| (J8-34) | (N34) |
| (J8-35) | (N35) |
| (J8-36) | (N36) |
| (J8-37) | (N37) |
| (J8-38) | (N38) |
| (J8-39) | (N39) |
| (J8-40) | (N40) |
| (J8-41) | (N41) |
| (J8-42) | (N42) |
| (J8-43) | (N43) |
| (J8-44) | (N44) |
| (J8-45) | (N45) |
| (J8-46) | (N46) |
| (J8-47) | (N47) |
| (J8-48) | (N48) |
| (J8-49) | (N49) |
| (J8-50) | (N50) |
| (J8-51) | (N51) |
| (J8-52) | (N52) |
| (J8-53) | (N53) |
| (J8-54) | (N54) |
| (J8-55) | (N55) |
| (J8-56) | (N56) |
| (J8-57) | (N57) |
| (J8-58) | (N58) |
| (J8-59) | (N59) |
| (J8-60) | (N60) |
| (J8-61) | (N61) |
| (J8-62) | (N62) |
| (J8-63) | (N63) |
| (J8-64) | (N64) |
| (J8-65) | (N65) |
| (J8-66) | (N66) |
| (J8-67) | (N67) |
| (J8-58) | (N68) |
| (J8-69) | (N69) |
| (J8-70) | (N70) |
| (J8-71) | (N71) |
| (J8-72) | (N72) |
| (J8-73) | (N73) |
| (J8-74) | (N74) |
| (J8-75) | (N75) |
| (J8-76) | (N76) |
| (J8-77) | (N77) |
| (J8-78) | (N78) |
| (J8-79) | —H |
| (J8-80) | —Me |
| (J8-81) | —Et |

TABLE 8-continued

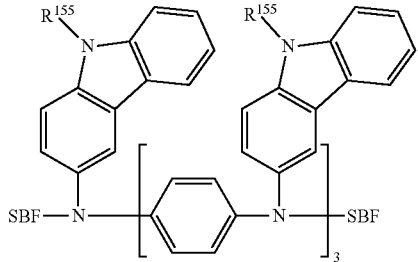
(J8)

| Compound | $R^{155}$ |
|---|---|
| (J8-82) | —Pr$^n$ |
| (J8-83) | —Pr$^i$ |
| (J8-84) | —Bu$^n$ |
| (J8-85) | —Bu$^i$ |
| (J8-86) | —Bu$^s$ |
| (J8-87) | —Bu$^t$ |

TABLE 9

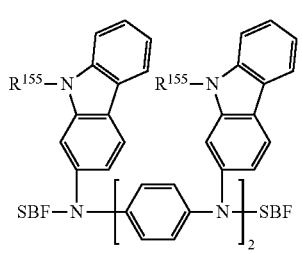
(J9)

| Compound | $R^{155}$ |
|---|---|
| (J9-1) | (N1) |
| (J9-2) | (N2) |
| (J9-3) | (N3) |
| (J9-4) | (N4) |
| (J9-5) | (N5) |
| (J9-6) | (N6) |
| (J9-7) | (N7) |
| (J9-8) | (N8) |
| (J9-9) | (N9) |
| (J9-10) | (N10) |
| (J9-11) | (N11) |
| (J9-12) | (N12) |
| (J9-13) | (N13) |
| (J9-14) | (N14) |
| (J9-15) | (N15) |
| (J9-16) | (N16) |
| (J9-17) | (N17) |
| (J9-18) | (N18) |
| (J9-19) | (N19) |
| (J9-20) | (N20) |
| (J9-21) | (N21) |
| (J9-22) | (N22) |
| (J9-23) | (N23) |
| (J9-24) | (N24) |
| (J9-25) | (N25) |
| (J9-26) | (N26) |
| (J9-27) | (N27) |
| (J9-28) | (N28) |
| (J9-29) | (N29) |
| (J9-30) | (N30) |
| (J9-31) | (N31) |
| (J9-32) | (N32) |
| (J9-33) | (N33) |
| (J9-34) | (N34) |
| (J9-35) | (N35) |
| (J9-36) | (N36) |
| (J9-37) | (N37) |

TABLE 9-continued

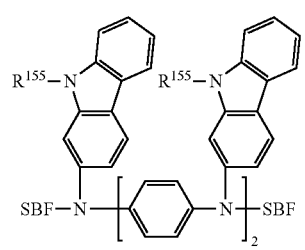
(J9)

| Compound | $R^{155}$ |
|---|---|
| (J9-38) | (N38) |
| (J9-39) | (N39) |
| (J9-40) | (N40) |
| (J9-41) | (N41) |
| (J9-42) | (N42) |
| (J9-43) | (N43) |
| (J9-44) | (N44) |
| (J9-45) | (N45) |
| (J9-46) | (N46) |
| (J9-47) | (N47) |
| (J9-48) | (N48) |
| (J9-49) | (N49) |
| (J9-50) | (N50) |
| (J9-51) | (N51) |
| (J9-52) | (N52) |
| (J9-53) | (N53) |
| (J9-54) | (N54) |
| (J9-55) | (N55) |
| (J9-56) | (N56) |
| (J9-57) | (N57) |
| (J9-58) | (N58) |
| (J9-59) | (N59) |
| (J9-60) | (N60) |
| (J9-61) | (N61) |
| (J9-62) | (N62) |
| (J9-63) | (N63) |
| (J9-64) | (N64) |
| (J9-65) | (N65) |
| (J9-66) | (N66) |
| (J9-67) | (N67) |
| (J9-68) | (N68) |
| (J9-69) | (N69) |
| (J9-70) | (N70) |
| (J9-71) | (N71) |
| (J9-72) | (N72) |
| (J9-73) | (N73) |
| (J9-74) | (N74) |
| (J9-75) | (N75) |
| (J9-76) | (N76) |
| (J9-77) | (N77) |
| (J9-78) | (N78) |
| (J9-79) | —H |
| (J9-80) | —Me |
| (J9-81) | —Et |
| (J9-82) | —Pr$^n$ |
| (J9-83) | —Pr$^i$ |
| (J9-84) | —Bu$^n$ |
| (J9-85) | —Bu$^i$ |
| (J9-86) | —Bu$^s$ |
| (J9-87) | —Bu$^t$ |

TABLE 10
(J10)
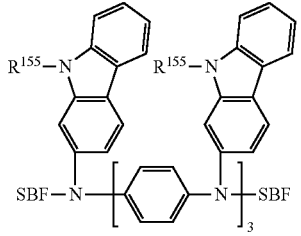
| Compound | R[155] |
|---|---|
| (J10-1) | (N1) |
| (J10-2) | (N2) |
| (J10-3) | (N3) |
| (J10-4) | (N4) |
| (J10-5) | (N5) |
| (J10-6) | (N6) |
| (J10-7) | (N7) |
| (J10-8) | (N8) |
| (J10-9) | (N9) |
| (J10-10) | (N10) |
| (J10-11) | (N11) |
| (J10-12) | (N12) |
| (J10-13) | (N13) |
| (J10-14) | (N14) |
| (J10-15) | (N15) |
| (J10-16) | (N16) |
| (J10-17) | (N17) |
| (J10-18) | (N18) |
| (J10-19) | (N19) |
| (J10-20) | (N20) |
| (J10-21) | (N21) |
| (J10-22) | (N22) |
| (J10-23) | (N23) |
| (J10-24) | (N24) |
| (J10-25) | (N25) |
| (J10-26) | (N26) |
| (J10-27) | (N27) |
| (J10-28) | (N28) |
| (J10-29) | (N29) |
| (J10-30) | (N30) |
| (J10-31) | (N31) |
| (J10-32) | (N32) |
| (J10-33) | (N33) |
| (J10-34) | (N34) |
| (J10-35) | (N35) |
| (J10-36) | (N36) |
| (J10-37) | (N37) |
| (J10-38) | (N38) |
| (J10-39) | (N39) |
| (J10-40) | (N40) |
| (J10-41) | (N41) |
| (J10-42) | (N42) |
| (J10-43) | (N43) |
| (J10-44) | (N44) |
| (J10-45) | (N45) |
| (J10-46) | (N46) |
| (J10-47) | (N47) |
| (J10-48) | (N48) |
| (J10-49) | (N49) |
| (J10-50) | (N50) |
| (J10-51) | (N51) |
| (J10-52) | (N52) |
| (J10-53) | (N53) |
| (J10-54) | (N54) |
| (J10-55) | (N55) |
| (J10-56) | (N56) |
| (J10-57) | (N57) |
| (J10-58) | (N58) |
| (J10-59) | (N59) |
| (J10-60) | (N60) |
| (J10-61) | (N61) |
| (J10-62) | (N62) |
| (J10-63) | (N63) |
| (J10-64) | (N64) |
| (J10-65) | (N65) |
TABLE 10-continued
(J10)
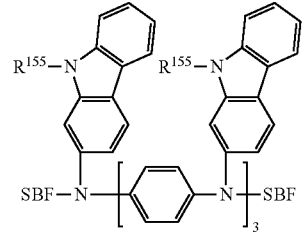
| Compound | R[155] |
|---|---|
| (J10-66) | (N66) |
| (J10-67) | (N67) |
| (J10-68) | (N68) |
| (J10-69) | (N69) |
| (J10-70) | (N70) |
| (J10-71) | (N71) |
| (J10-72) | (N72) |
| (J10-73) | (N73) |
| (J10-74) | (N74) |
| (J10-75) | (N75) |
| (J10-76) | (N76) |
| (J10-77) | (N77) |
| (J10-78) | (N78) |
| (J10-79) | —H |
| (J10-80) | —Me |
| (J10-81) | —Et |
| (J10-82) | —Pr[n] |
| (J10-83) | —Pr[i] |
| (J10-84) | —Bu[n] |
| (J10-85) | —Bu[i] |
| (J10-86) | —Bu[s] |
| (J10-87) | —Bu[t] |
TABLE 11
(J11)
| Compound | R[155] |
|---|---|
| (J11-1) | (N1) |
| (J11-2) | (N2) |
| (J11-3) | (N3) |
| (J11-4) | (N4) |
| (J11-5) | (N5) |
| (J11-6) | (N6) |
| (J11-7) | (N7) |
| (J11-8) | (N8) |
| (J11-9) | (N9) |
| (J11-10) | (N10) |
| (J11-11) | (N11) |
| (J11-12) | (N12) |
| (J11-13) | (N13) |
| (J11-14) | (N14) |
| (J11-15) | (N15) |
| (J11-16) | (N16) |
| (J11-17) | (N17) |
| (J11-18) | (N18) |
| (J11-19) | (N19) |
| (J11-20) | (N20) |
| (J11-21) | (N21) |
| (J11-22) | (N22) |
| (J11-23) | (N23) |

TABLE 11-continued

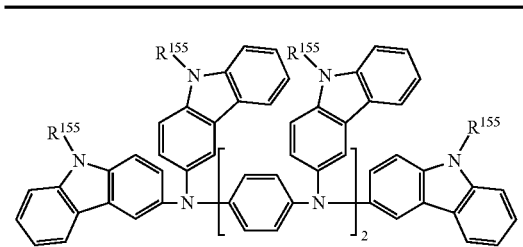

(J11)

| Compound | R¹⁵⁵ |
|---|---|
| (J11-24) | (N24) |
| (J11-25) | (N25) |
| (J11-26) | (N26) |
| (J11-27) | (N27) |
| (J11-28) | (N28) |
| (J11-29) | (N29) |
| (J11-30) | (N30) |
| (J11-31) | (N31) |
| (J11-32) | (N32) |
| (J11-33) | (N33) |
| (J11-34) | (N34) |
| (J11-35) | (N35) |
| (J11-36) | (N36) |
| (J11-37) | (N37) |
| (J11-38) | (N38) |
| (J11-39) | (N39) |
| (J11-40) | (N40) |
| (J11-41) | (N41) |
| (J11-42) | (N42) |
| (J11-43) | (N43) |
| (J11-44) | (N44) |
| (J11-45) | (N45) |
| (J11-46) | (N46) |
| (J11-47) | (N47) |
| (J11-48) | (N48) |
| (J11-49) | (N49) |
| (J11-50) | (N50) |
| (J11-51) | (N51) |
| (J11-52) | (N52) |
| (J11-53) | (N53) |
| (J11-54) | (N54) |
| (J11-55) | (N55) |
| (J11-56) | (N56) |
| (J11-57) | (N57) |
| (J11-58) | (N58) |
| (J11-59) | (N59) |
| (J11-60) | (N60) |
| (J11-61) | (N61) |
| (J11-62) | (N62) |
| (J11-63) | (N63) |
| (J11-64) | (N64) |
| (J11-65) | (N65) |
| (J11-66) | (N66) |
| (J11-67) | (N67) |
| (J11-68) | (N68) |
| (J11-69) | (N69) |
| (J11-70) | (N70) |
| (J11-71) | (N71) |
| (J11-72) | (N72) |
| (J11-73) | (N73) |
| (J11-74) | (N74) |
| (J11-75) | (N75) |
| (J11-76) | (N76) |
| (J11-77) | (N77) |
| (J11-78) | (N78) |
| (J11-79) | —H |
| (J11-80) | —Me |
| (J11-81) | —Et |
| (J11-82) | —Prⁿ |
| (J11-83) | —Prⁱ |
| (J11-84) | —Buⁿ |
| (J11-85) | —Buⁱ |
| (J11-86) | —Buˢ |
| (J11-87) | —Buᵗ |

TABLE 12

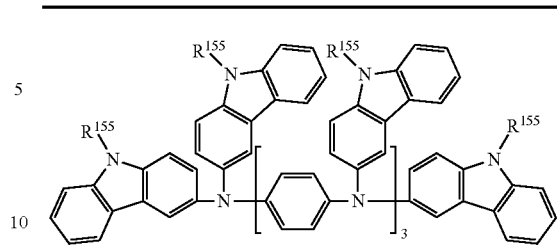

(J12)

| Compound | R¹⁵⁵ |
|---|---|
| (J12-1) | (N1) |
| (J12-2) | (N2) |
| (J12-3) | (N3) |
| (J12-4) | (N4) |
| (J12-5) | (N5) |
| (J12-6) | (N6) |
| (J12-7) | (N7) |
| (J12-8) | (N8) |
| (J12-9) | (N9) |
| (J12-10) | (N10) |
| (J12-11) | (N11) |
| (J12-12) | (N12) |
| (J12-13) | (N13) |
| (J12-14) | (N14) |
| (J12-15) | (N15) |
| (J12-16) | (N16) |
| (J12-17) | (N17) |
| (J12-18) | (N18) |
| (J12-19) | (N19) |
| (J12-20) | (N20) |
| (J12-21) | (N21) |
| (J12-22) | (N22) |
| (J12-23) | (N23) |
| (J12-24) | (N24) |
| (J12-25) | (N25) |
| (J12-26) | (N26) |
| (J12-27) | (N27) |
| (J12-28) | (N28) |
| (J12-29) | (N29) |
| (J12-30) | (N30) |
| (J12-31) | (N31) |
| (J12-32) | (N32) |
| (J12-33) | (N33) |
| (J12-34) | (N34) |
| (J12-35) | (N35) |
| (J12-36) | (N36) |
| (J12-37) | (N37) |
| (J12-38) | (N38) |
| (J12-39) | (N39) |
| (J12-40) | (N40) |
| (J12-41) | (N41) |
| (J12-42) | (N42) |
| (J12-43) | (N43) |
| (J12-44) | (N44) |
| (J12-45) | (N45) |
| (J12-46) | (N46) |
| (J12-47) | (N47) |
| (J12-48) | (N48) |
| (J12-49) | (N49) |
| (J12-50) | (N50) |
| (J12-51) | (N51) |
| (J12-52) | (N52) |
| (J12-53) | (N53) |
| (J12-54) | (N54) |
| (J12-55) | (N55) |
| (J12-56) | (N56) |
| (J12-57) | (N57) |
| (J12-58) | (N58) |
| (J12-59) | (N59) |
| (J12-60) | (N60) |
| (J12-61) | (N61) |
| (J12-62) | (N62) |
| (J12-63) | (N63) |
| (J12-64) | (N64) |
| (J12-65) | (N65) |
| (J12-66) | (N66) |

TABLE 12-continued

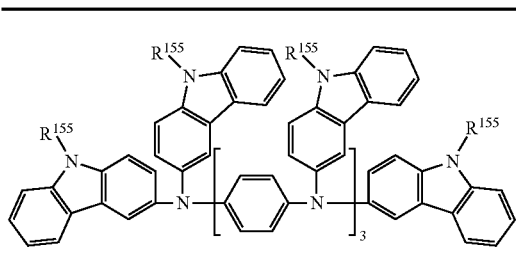

(J12)

| Compound | R[155] |
|---|---|
| (J12-67) | (N67) |
| (J12-68) | (N68) |
| (J12-69) | (N69) |
| (J12-70) | (N70) |
| (J12-71) | (N71) |
| (J12-72) | (N72) |
| (J12-73) | (N73) |
| (J12-74) | (N74) |
| (J12-15) | (N75) |
| (J12-76) | (N76) |
| (J12-77) | (N77) |
| (J12-78) | (N78) |
| (J12-79) | —H |
| (J12-80) | —Me |
| (J12-81) | —Et |
| (J12-82) | —Pr[n] |
| (J12-83) | —Pr[i] |
| (J12-84) | —Bu[n] |
| (J12-85) | —Bu[i] |
| (J12-86) | —Bu[s] |
| (J12-87) | —Bu[t] |

TABLE 13

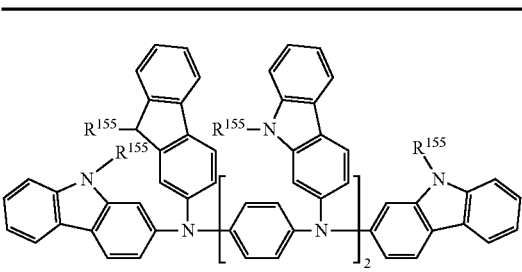

(J13)

| Compound | R[155] |
|---|---|
| (J13-1) | (N1) |
| (J13-2) | (N2) |
| (J13-3) | (N3) |
| (J13-4) | (N4) |
| (J13-5) | (N5) |
| (J13-6) | (N6) |
| (J13-7) | (N7) |
| (J13-8) | (N8) |
| (J13-9) | (N9) |
| (J13-10) | (N10) |
| (J13-11) | (N11) |
| (J13-12) | (N12) |
| (J13-13) | (N13) |
| (J13-14) | (N14) |
| (J13-15) | (N15) |
| (J13-16) | (N16) |
| (J13-17) | (N17) |
| (J13-18) | (N18) |
| (J13-19) | (N19) |
| (J13-20) | (N20) |
| (J13-21) | (N21) |
| (J13-22) | (N22) |
| (J13-23) | (N23) |
| (J13-24) | (N24) |
| (J13-25) | (N25) |

TABLE 13-continued

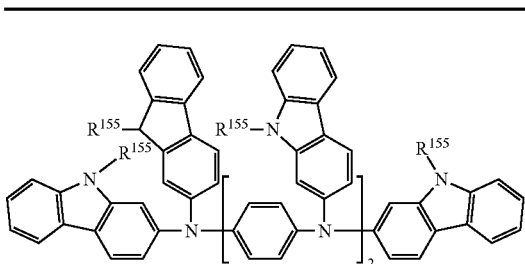

(J13)

| Compound | R[155] |
|---|---|
| (J13-26) | (N26) |
| (J13-27) | (N27) |
| (J13-28) | (N28) |
| (J13-29) | (N29) |
| (J13-30) | (N30) |
| (J13-31) | (N31) |
| (J13-32) | (N32) |
| (J13-33) | (N33) |
| (J13-34) | (N34) |
| (J13-35) | (N35) |
| (J13-36) | (N36) |
| (J13-37) | (N37) |
| (J13-38) | (N38) |
| (J13-39) | (N39) |
| (J13-40) | (N40) |
| (J13-41) | (N41) |
| (J13-42) | (N42) |
| (J13-43) | (N43) |
| (J13-44) | (N44) |
| (J13-45) | (N45) |
| (J13-46) | (N46) |
| (J13-47) | (N47) |
| (J13-48) | (N48) |
| (J13-49) | (N49) |
| (J13-50) | (N50) |
| (J13-51) | (N51) |
| (J13-52) | (N52) |
| (J13-53) | (N53) |
| (J13-54) | (N54) |
| (J13-55) | (N55) |
| (J13-56) | (N56) |
| (J13-57) | (N57) |
| (J13-58) | (N58) |
| (J13-59) | (N59) |
| (J13-60) | (N60) |
| (J13-61) | (N61) |
| (J13-62) | (N62) |
| (J13-63) | (N63) |
| (J13-64) | (N64) |
| (J13-65) | (N65) |
| (J13-66) | (N66) |
| (J13-67) | (N67) |
| (J13-68) | (N68) |
| (J13-69) | (N69) |
| (J13-70) | (N70) |
| (J13-71) | (N71) |
| (J13-72) | (N72) |
| (J13-73) | (N73) |
| (J13-74) | (N74) |
| (J13-75) | (N75) |
| (J13-76) | (N76) |
| (J13-77) | (N77) |
| (J13-78) | (N78) |
| (J13-79) | —H |
| (J13-80) | —Me |
| (J13-81) | —Et |
| (J13-82) | —Pr[n] |
| (J13-83) | —Pr[i] |
| (J13-84) | —Bu[n] |
| (J13-85) | —Bu[i] |
| (J13-86) | —Bu[s] |
| (J13-87) | —Bu[t] |

TABLE 14

(J14)

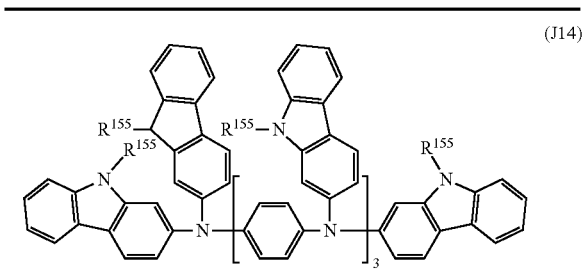

| Compound | R¹⁵⁵ |
|---|---|
| (J14-1) | (N1) |
| (J14-2) | (N2) |
| (J14-3) | (N3) |
| (J14-4) | (N4) |
| (J14-5) | (N5) |
| (J14-6) | (N6) |
| (J14-7) | (N7) |
| (J14-8) | (N8) |
| (J14-9) | (N9) |
| (J14-10) | (N10) |
| (J14-11) | (N11) |
| (J14-12) | (N12) |
| (J14-13) | (N13) |
| (J14-14) | (N14) |
| (J14-15) | (N15) |
| (J14-16) | (N16) |
| (J14-17) | (N17) |
| (J14-18) | (N18) |
| (J14-19) | (N19) |
| (J14-20) | (N20) |
| (J14-21) | (N21) |
| (J14-22) | (N22) |
| (J14-23) | (N23) |
| (J14-24) | (N24) |
| (J14-25) | (N25) |
| (J14-26) | (N26) |
| (J14-27) | (N27) |
| (J14-28) | (N28) |
| (J14-29) | (N29) |
| (J14-30) | (N30) |
| (J14-31) | (N31) |
| (J14-32) | (N32) |
| (J14-33) | (N33) |
| (J14-34) | (N34) |
| (J14-35) | (N35) |
| (J14-36) | (N36) |
| (J14-37) | (N37) |
| (J14-38) | (N38) |
| (J14-39) | (N39) |
| (J14-40) | (N40) |
| (J14-41) | (N41) |
| (J14-42) | (N42) |
| (J14-43) | (N43) |
| (J14-44) | (N44) |
| (J14-45) | (N45) |
| (J14-46) | (N46) |
| (J14-47) | (N47) |
| (J14-48) | (N48) |
| (J14-49) | (N49) |
| (J14-50) | (N50) |
| (J14-51) | (N51) |
| (J14-52) | (N52) |
| (J14-53) | (N53) |
| (J14-54) | (N54) |
| (J14-55) | (N55) |
| (J14-56) | (N56) |
| (J14-57) | (N57) |
| (J14-58) | (N58) |
| (J14-59) | (N59) |
| (J14-60) | (N60) |
| (J14-61) | (N61) |
| (J14-82) | (N62) |
| (J14-63) | (N63) |
| (J14-64) | (N64) |
| (J14-65) | (N65) |

TABLE 14-continued (J14)

| Compound | R¹⁵⁵ |
|---|---|
| (J14-66) | (N66) |
| (J14-67) | (N67) |
| (J14-68) | (N68) |
| (J14-69) | (N69) |
| (J14-70) | (N70) |
| (J14-71) | (N71) |
| (J14-72) | (N72) |
| (J14-73) | (N73) |
| (J14-74) | (N74) |
| (J14-75) | (N75) |
| (J14-76) | (N76) |
| (J14-77) | (N77) |
| (J14-78) | (N78) |
| (J14-79) | —H |
| (J14-80) | —Me |
| (J14-81) | —Et |
| (J14-82) | —Pr$^n$ |
| (J14-83) | —Pr$^i$ |
| (J14-84) | —Bu$^n$ |
| (J14-85) | —Bu$^i$ |
| (J14-86) | —Bu$^s$ |
| (J14-87) | —Bu$^t$ |

TABLE 15

(J15)

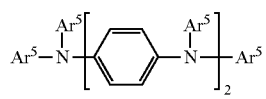

| Compound | Ar⁵ |
|---|---|
| (J15-1) | (A1-1) |
| (J15-2) | (A1-2) |
| (J15-3) | (A2-1) |
| (J15-4) | (A2-2) |
| (J15-5) | (A2-3) |
| (J15-6) | (A2-4) |
| (J15-7) | (A2-5) |
| (J15-8) | (A3-1) |
| (J15-9) | (A3-2) |
| (J15-10) | (A3-3) |
| (J15-11) | (A4-1) |
| (J15-12) | (A4-2) |
| (J15-13) | (A4-3) |
| (J15-14) | (A5-1) |
| (J15-15) | (A5-2) |
| (J15-16) | (A5-3) |
| (J15-17) | (A6-1) |
| (J15-18) | (A6-2) |
| (J15-19) | (A6-3) |
| (J15-20) | (A6-4) |
| (J15-21) | (A6-5) |
| (J15-22) | (A6-6) |
| (J15-23) | (A6-7) |
| (J15-24) | (A6-8) |
| (J15-25) | (A6-9) |
| (J15-26) | (A6-10) |
| (J15-27) | (A6-11) |
| (J15-28) | (A6-12) |
| (J15-29) | (A6-13) |

TABLE 15-continued

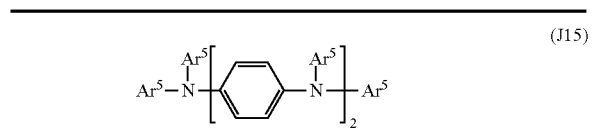
(J15)

| Compound | Ar⁵ |
|---|---|
| (J15-30) | (A6-14) |
| (J15-31) | (A6-15) |
| (J15-32) | (A7-1) |
| (J15-33) | (A7-2) |
| (J15-34) | (A7-3) |
| (J15-35) | (A8-1) |
| (J15-36) | (A8-2) |
| (J15-37) | (A8-3) |
| (J15-38) | (A9-1) |
| (J15-39) | (A9-2) |
| (J15-40) | (A9-3) |
| (J15-41) | (A10-1) |
| (J15-42) | (A10-2) |
| (J15-43) | (A10-3) |
| (J15-44) | (A11-1) |
| (J15-45) | (A11-2) |
| (J15-46) | (A11-3) |
| (J15-47) | (A12-1) |
| (J15-48) | (A12-2) |
| (J15-49) | (A12-3) |
| (J15-50) | (A12-4) |
| (J15-51) | (A12-5) |
| (J15-52) | (A12-6) |
| (J15-53) | (A12-7) |
| (J15-54) | (A12-8) |
| (J15-55) | (A12-9) |
| (J15-56) | (A12-10) |
| (J15-57) | (A12-11) |
| (J15-58) | (A13-1) |
| (J15-59) | (A13-2) |
| (J15-60) | (A13-3) |
| (J15-61) | (A13-4) |
| (J15-62) | (A13-5) |
| (J15-63) | (A13-6) |
| (J15-64) | (A13-7) |
| (J15-65) | (A13-8) |
| (J15-66) | (A13-9) |
| (J15-67) | (A13-10) |
| (J15-68) | (A13-11) |
| (J15-69) | (A13-12) |
| (J15-70) | (A13-13) |
| (J15-71) | (A13-14) |
| (J15-72) | (A13-15) |
| (J15-73) | (A13-16) |
| (J15-74) | (A13-17) |
| (J15-75) | (A13-18) |
| (J15-76) | (A13-19) |
| (J15-77) | (A13-20) |
| (J15-78) | (A13-21) |
| (J15-79) | (A13-22) |
| (J15-80) | (A13-23) |
| (J15-81) | (A13-24) |
| (J15-82) | (A14-1) |
| (J15-83) | (A14-2) |
| (J15-84) | (A14-3) |
| (J15-85) | (A14-4) |
| (J15-86) | (A15-1) |
| (J15-87) | (A15-2) |
| (J15-88) | (A15-3) |
| (J15-89) | (A15-4) |
| (J15-90) | (A17-1) |
| (J15-91) | (A17-2) |
| (J15-92) | (A17-3) |
| (J15-93) | (A17-4) |
| (J15-94) | (A17-5) |
| (J15-95) | (A17-6) |
| (J15-96) | (A17-7) |
| (J15-97) | (A17-8) |
| (J15-98) | (A17-9) |
| (J15-99) | (A17-10) |
| (J15-100) | (A17-11) |

TABLE 15-continued

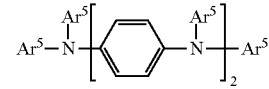
(J15)

| Compound | Ar⁵ |
|---|---|
| (J15-101) | (A17-12) |
| (J15-102) | (A18-1) |
| (J15-103) | (A18-2) |

TABLE 16

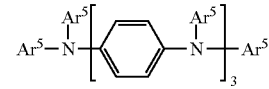
(J16)

| Compound | Ar⁵ |
|---|---|
| (J16-1) | (A1-1) |
| (J16-2) | (A1-2) |
| (J16-3) | (A2-1) |
| (J16-4) | (A2-2) |
| (J16-5) | (A2-3) |
| (J16-6) | (A2-4) |
| (J16-7) | (A2-5) |
| (J16-8) | (A3-1) |
| (J16-9) | (A3-2) |
| (J16-10) | (A3-3) |
| (J16-11) | (A4-1) |
| (J16-12) | (A4-2) |
| (J16-13) | (A4-3) |
| (J16-14) | (A5-1) |
| (J16-15) | (A5-2) |
| (J16-16) | (A5-3) |
| (J16-17) | (A6-1) |
| (J16-18) | (A6-2) |
| (J16-19) | (A6-3) |
| (J16-20) | (A6-4) |
| (J16-21) | (A6-5) |
| (J16-22) | (A6-6) |
| (J16-23) | (A6-7) |
| (J16-24) | (A6-8) |
| (J16-25) | (A6-9) |
| (J16-26) | (A6-10) |
| (J16-27) | (A6-11) |
| (J16-28) | (A6-12) |
| (J16-29) | (A6-13) |
| (J16-30) | (A6-14) |
| (J16-31) | (A6-15) |
| (J16-32) | (A7-1) |
| (J16-33) | (A7-2) |
| (J16-34) | (A7-3) |
| (J16-35) | (A8-1) |
| (J16-36) | (A8-2) |
| (J16-37) | (A8-3) |
| (J16-38) | (A9-1) |
| (J16-39) | (A9-2) |
| (J16-40) | (A9-3) |
| (J16-41) | (A10-1) |
| (J16-42) | (A10-2) |
| (J16-43) | (A10-3) |
| (J16-44) | (A11-1) |
| (J16-45) | (A11-2) |
| (J16-46) | (A11-3) |
| (J16-47) | (A12-1) |
| (J16-48) | (A12-2) |
| (J16-49) | (A12-3) |
| (J16-50) | (A12-4) |
| (J16-51) | (A12-5) |
| (J16-52) | (A12-6) |
| (J16-53) | (A12-7) |
| (J16-54) | (A12-8) |
| (J16-55) | (A12-9) |

TABLE 16-continued (J16)

Ar⁵—N(Ar⁵)—[phenyl]—N(Ar⁵)—Ar⁵ ]₃

| Compound | Ar⁵ |
|---|---|
| (J16-56) | (A12-10) |
| (J16-57) | (A12-11) |
| (J16-58) | (A13-1) |
| (J16-59) | (A13-2) |
| (J16-60) | (A13-3) |
| (J16-61) | (A13-4) |
| (J16-62) | (A13-5) |
| (J16-63) | (A13-6) |
| (J16-64) | (A13-7) |
| (J16-65) | (A13-8) |
| (J16-66) | (A13-9) |
| (J16-67) | (A13-10) |
| (J16-68) | (A13-11) |
| (J16-69) | (A13-12) |
| (J16-70) | (A13-13) |
| (J16-71) | (A13-14) |
| (J16-72) | (A13-15) |
| (J16-73) | (A13-16) |
| (J16-74) | (A13-17) |
| (J16-75) | (A13-18) |
| (J16-76) | (A13-19) |
| (J16-77) | (A13-20) |
| (J16-78) | (A13-21) |
| (J16-79) | (A13-22) |
| (J16-80) | (A13-23) |
| (J16-81) | (A13-24) |
| (J16-82) | (A14-1) |
| (J16-83) | (A14-2) |
| (J16-84) | (A14-3) |
| (J16-85) | (A14-4) |
| (J16-86) | (A15-1) |
| (J16-87) | (A15-2) |
| (J16-88) | (A15-3) |
| (J16-89) | (A15-4) |
| (J16-90) | (A17-1) |
| (J16-91) | (A17-2) |
| (J16-92) | (A17-3) |
| (J16-93) | (A17-4) |
| (J16-94) | (A17-5) |
| (J16-95) | (A17-6) |
| (J16-96) | (A17-7) |
| (J16-97) | (A17-8) |
| (J16-98) | (A17-9) |
| (J16-99) | (A17-10) |
| (J16-100) | (A17-11) |
| (J16-101) | (A17-12) |
| (J16-102) | (A18-1) |
| (J16-103) | (A18-2) |

TABLE 17

(J17)

H—[phenyl—N(Ar₃)—]₂—[biphenyl]—[N(Ar₃)—phenyl]₂—H

| Compound | Ar³ |
|---|---|
| (J17-1) | (C1') |
| (J17-2) | (C2') |
| (J17-3) | (C3') |
| (J17-4) | (C4') |
| (J17-5) | (C5') |
| (J17-6) | (C6') |
| (J17-7) | (C7') |
| (J17-8) | (C8') |

TABLE 18

(J18)

H—[phenyl—N(Ar₃)—phenyl—N(Ar₃)—phenyl]—H

| Compound | Ar³ |
|---|---|
| (J18-1) | (C1') |
| (J18-2) | (C2') |
| (J18-3) | (C3') |
| (J18-4) | (C4') |
| (J18-5) | (C5') |
| (J18-6) | (C6') |
| (J18-7) | (C7') |
| (J18-8) | (C8') |

In this invention, the ratio between the compound of formula (1) and the charge-transporting compound, expressed as the molar ratio (compound of formula (1)): (charge-transporting compound), may be set to from about 1:0.1 to about 1:10.

From the standpoint of enhancing charge transportability, the charge-transporting material of the invention may include a dopant substance.

The dopant substance is not particularly limited; any inorganic dopant substance or organic dopant substance may be used.

The inorganic and organic dopant substances may be of a single type used alone or may be of two or more types used in combination.

In this invention, heteropolyacids are especially preferred as inorganic dopant substances.

"Heteropolyacid" refers to a polyacid having a structure in which a heteroatom is positioned at the center of the molecule—typically the Keggin-type chemical structure shown in formula (H1) or the Dawson-type chemical structure shown in formula (H2), and which is obtained by the condensation of an isopolyacid that is an oxoacid of vanadium (V), molybdenum (Mo), tungsten (W) or the like with an oxoacid of a different element. Examples of such oxoacids of a different element include primarily oxoacids of silicon (Si), phosphorus (P) and arsenic (As).

Chemical Formula 44 is shown in FIG. 4(A) and FIG. 4(B) of the drawings.

Examples of heteropolyacids include phosphomolybdic acid, silicomolybdic acid, phosphotungstic acid, silicotungstic acid and phosphotungstomolybdic acid. These may be used singly, or two or more may be used in combination. The heteropolyacid used in this invention may be acquired as a commercial product or may be synthesized by a known method.

In particular, when one heteropolyacid is used, this one heteropolyacid is preferably phosphotungstic acid or phosphomolybdic acid, and most preferably phosphotungstic acid. When two or more heteropolyacids are used, one of the two or more heteropolyacids is preferably phosphotungstic acid or phosphomolybdic acid, and more preferably phosphotungstic acid.

Even a heteropolyacid having, in quantitative analysis such as elemental analysis, numbers for the elements which are higher or lower than in the structure indicated by the general formula may be used in this invention, provided it was acquired as a commercial product or was suitably synthesized according to a known method of synthesis.

For example, phosphotungstic acid is generally represented by the chemical formula $H_3(PW_{12}O_{40})\cdot nH_2O$ and phosphomolybdic acid is generally represented by the chemical formula $H_3(PMo_{12}O_{40}) \cdot nH_2O$. In quantitative analysis, regardless of whether the numbers for the elements P (phosphorus), O (oxygen) and W (tungsten) or Mo (molybdenum) within these formulas are high or low, so long as the heteropolyacid was acquired as a commercial product or suitably synthesized by a known method of synthesis, it may be used in this invention. In such cases, the mass of the heteropolyacid specified in this invention refers not to the mass of pure phosphotungstic acid within the product of synthesis or the commercial product (phosphotungstic acid content), but rather, in the form that is available as a commercial product or the form that can be isolated by a known method of synthesis, to the total mass in a state that includes water of hydration and other impurities.

When a heteropolyacid is included in the charge-transporting material of the invention, although the content thereof varies depending on such factors as the type and amount of the charge-transporting compound and the desired charge transportability and so cannot be strictly specified, when expressed as a mass ratio relative to unity (1) for the charge-transporting substance, the content is generally in the range of 0.1 to 10.

Exemplary organic dopant substances include tetracyanoquinodimethane derivatives, benzoquinone derivatives and arylsulfonic acid compounds, with tetracyanoquinodimethane derivatives and benzoquinone derivatives being especially preferred.

Specific examples of tetracyanoquinodimethane derivatives include 7,7,8,8-tetracyanoquinodimethane (TCNQ) and halotetracyanoquinodimethanes of formula (H3).

Specific examples of benzoquinone derivatives include tetrafluoro-1,4-benzoquinone (F4BQ), tetrachloro-1,4-benzoquinone (chloranil), tetrabromo-1,4-benzoquinone and 2,3-dichloro-5,6-dicyano-1,4-benzoquinone (DDQ).

[Chemical Formula 45]

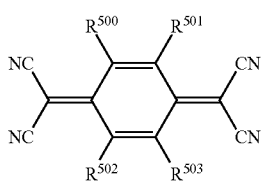

(H3)

In the formula, $R^{500}$ to $R^{503}$ are each independently a hydrogen atom or a halogen atom, with at least one being a halogen atom, preferably at least two being halogen atoms, more preferably at least three being halogen atoms, and most preferably all four being halogen atoms.

The halogen atoms are exemplified in the same way as above, although they are preferably fluorine atoms or chlorine atoms, and more preferably fluorine atoms.

Illustrative examples of halotetracyanoquinodimethanes include 2-fluoro-7,7,8,8-tetracyanoquinodimethane, 2-chloro-7,7,8,8-tetracyanoquinodimethane, 2,5-difluoro-7,7,8,8-tetracyanoquinodimethane, 2,5-dichloro-7,7,8,8-tetracyanoquinodimethane, 2,3,5,6-tetrachloro-7,7,8,8-tetracyanoquinodimethane and 2,3,5,6-tetrafluoro-7,7,8,8-tetracyanoquinodimethane (F4TCNQ).

When a tetracyanoquinodimethane derivative or a benzoquinone derivative is included in the charge-transporting material of the invention, although the content thereof varies depending on such factors as the type and amount of the charge-transporting compound and the desired charge transportability and so cannot be strictly specified, expressed as a molar ratio relative to unity (1) for the charge-transporting substance, the content is typically in the range of 0.0001 to 100 equivalents, preferably in the range of 0.01 to 50 equivalents, and more preferably in the range of 1 to 20 equivalents.

Examples of arylsulfonic acid compounds include benzenesulfonic acid, tosylic acid, p-styrenesulfonic acid, 2-naphthalenesulfonic acid, 4-hydroxybenzenesulfonic acid, 5-sulfosalicyclic acid, p-dodecylbenzenesulfonic acid, dihexylbenzenesulfonic acid, 2,5-dihexylbenzenesulfonic acid, dibutylnaphthalenesulfonic acid, 6,7-dibutyl-2-naphthalenesulfonic acid, dodecylnaphthalenesulfonic acid, 3-dodecyl-2-naphthalenesulfonic acid, hexylnaphthalenesulfonic acid, 4-hexyl-1-naphthalenesulfonic acid, octylnaphthalenesulfonic acid, 2-octyl-1-naphthalenesulfonic acid, hexylnaphthalenesulfonic acid, 7-hexyl-1-naphthalenesulfonic acid, 6-hexyl-2-naphthalenesulfonic acid, dinonylnaphthalenesulfonic acid, 2,7-dinonyl-4-naphthalenesulfonic acid, dinonylnaphthalenedisulfonic acid, 2,7-dinonyl-4,5-naphthalenedisulfonic acid, the 1,4-benzodioxanedisulfonic acid compounds mentioned in WO 2005/000832, the arylsulfonic acid compounds mentioned in WO 2006/025342 and the arylsulfonic acid compounds mentioned in WO 2009/096352.

Examples of arylsulfonic acid compounds that are preferred as the dopant substance in this invention include arylsulfonic acid compounds of formula (H4) or (H5).

[Chemical Formula 46]

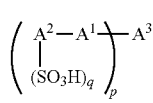

(H4)

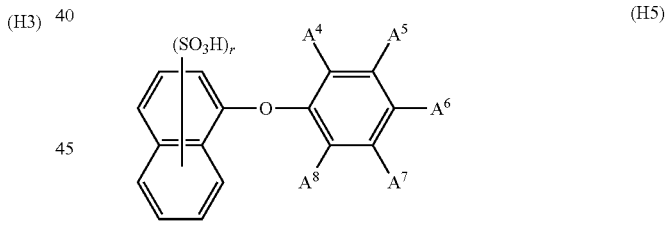

(H5)

$A^1$ represents oxygen or sulfur, with oxygen being preferred.

$A^2$ represents a naphthalene ring or an anthracene ring, with a naphthalene ring being preferred.

$A^3$ represents a divalent to tetravalent perfluorobiphenyl group and the subscript p represents the number of bonds between $A^1$ and $A^3$, this being an integer that satisfies the condition $2 \leq p \leq 4$. $A^3$ is preferably a perfluorobiphenyldiyl group, especially a perfluorobiphenyl-4,4'-diyl group, and p is preferably 2.

The subscript q represents the number of sulfonic acid groups that are bonded to $A^2$, this being an integer that satisfies the condition $1 \leq q \leq 4$, and is most preferably 2.

$A^4$ to $A^8$ are each independently a hydrogen atom, a halogen atom, a cyano group, an alkyl group of 1 to 20 carbon atoms, a halogenated alkyl group of 1 to 20 carbon atoms, or a halogenated alkenyl group of 2 to 20 carbon atoms. At least three of $A^4$ to $A^8$ are halogen atoms.

Illustrative examples of halogenated alkyl groups of 1 to 20 carbon atoms include trifluoromethyl, 2,2,2-trifluoroethyl, 1,1,2,2,2-pentafluoroethyl, 3,3,3-trifluoropropyl, 2,2,3,3,3-pentafluoropropyl, 1,1,2,2,3,3,3-heptafluoropropyl, 4,4,4-trifluorobutyl, 3,3,4,4,4-pentafluorobutyl, 2,2,3,3,4,4,4-heptafluorobutyl and 1,1,2,2,3,3,4,4,4-nonafluorobutyl groups.

Illustrative examples of halogenated alkenyl groups of 2 to 20 carbon atoms include perfluorovinyl, perfluoropropenyl (allyl) and perfluorobutenyl groups.

Aside from this, the halogen atoms and alkyl groups of 1 to 20 carbons are exemplified in the same way as above, although the halogen atoms are preferably fluorine atoms.

Of these, $A^4$ to $A^8$ are each preferably a hydrogen atom, a halogen atom, a cyano group, an alkyl group of 1 to 10 carbon atoms, a halogenated alkyl group of 1 to 10 carbon atoms, or a halogenated alkenyl group of 2 to 10 carbon atoms, with at least three of $A^4$ to $A^8$ being fluorine atoms;

As used herein, "perfluoroalkyl group" refers to an alkyl group in which all the hydrogen atoms are substituted with fluorine atoms, and "perfluoroalkenyl group" refers to an alkenyl group in which all the hydrogen atoms are substituted with fluorine atoms.

The subscript r represents the number of sulfonic acid groups bonded to the naphthalene ring, this being an integer that satisfies the condition $1 \leq r \leq 4$, preferably from 2 to 4, and more preferably 2.

The molecular weight of the arylsulfonic acid compound used as a dopant substance is not particularly limited. However, in order to increase the solubility of the charge-transporting material of the invention in an organic solvent, the molecular weight is preferably not more than 2,000, and more preferably not more than 1,500.

Examples of suitable arylsulfonic acid compounds include, but are not limited to, the following.

[Chemical Formula 47]

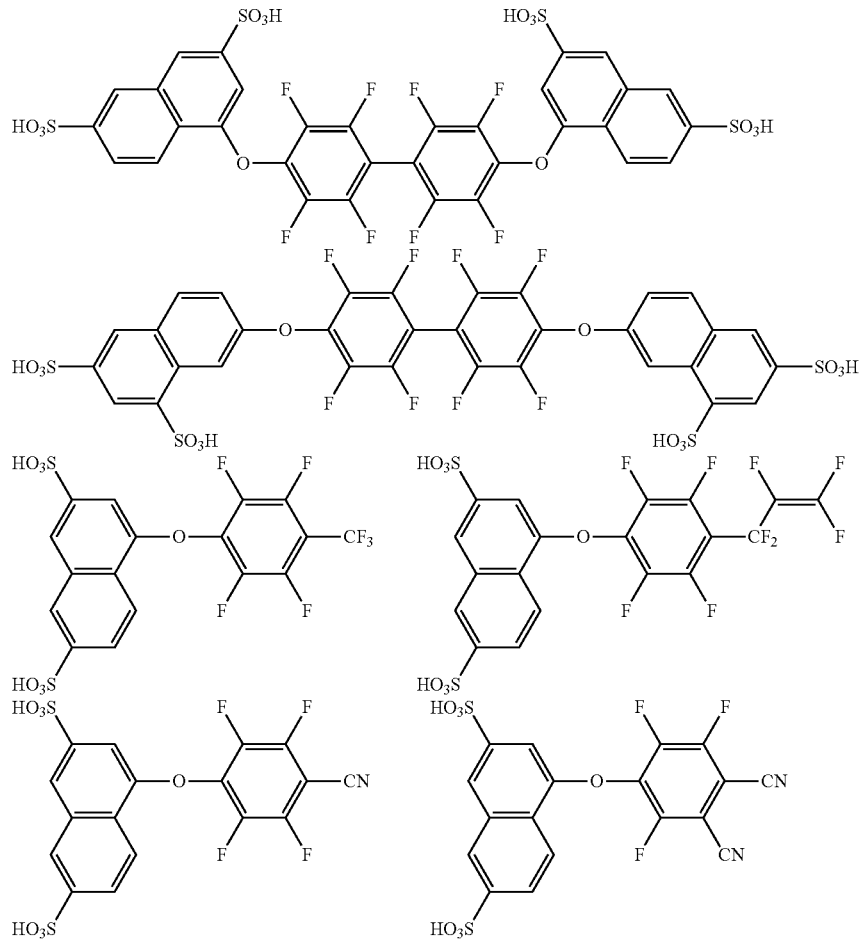

more preferably a hydrogen atom, a fluorine atom, a cyano group, an alkyl group of 1 to 5 carbon atoms, a fluorinated alkyl group of 1 to 5 carbon atoms, or a fluorinated alkenyl group of 2 to 5 carbon atoms, with at least three of $A^4$ to $A^8$ being fluorine atoms; and even more preferably a hydrogen atom, a fluorine atom, a cyano group, a perfluoroalkyl group of 1 to 5 carbon atoms, or a perfluoroalkenyl group of 1 to 5 carbon atoms, with $A^4$, $A^5$ and $A^8$ being fluorine atoms.

When an arylsulfonic acid compound is included in the charge-transporting material of the invention, although the content thereof varies depending on such factors as the type and amount of the charge-transporting compound and the desired charge transportability and so cannot be strictly specified, when expressed as a molar ratio relative to unity (1) for the charge-transporting substance, the content is generally in the range of 0.1 to 10 equivalents, preferably in the range of 0.5 to 5 equivalents, and even more preferably in the range of 0.8 to 3 equivalents.

A commercial product may be used as the arylsulfonic acid compound, although it is also possible to synthesize the arylsulfonic acid compound by a known method used in, for example, WO 2006/025342 or WO 2009/096352.

The charge-transporting varnish of the invention includes the above-described charge-transporting material of the invention and an organic solvent, the charge-transporting material being dissolved in the organic solvent.

A high-solvency solvent capable of dissolving well the charge-transporting substance and the dopant substance may be used as the organic solvent when preparing the charge-transporting varnish.

Examples of such high-solvency solvents include, but are not limited to, organic solvents such as cyclohexanone, N,N-dimethylformamide, N,N-dimethylacetamide, N-methylpyrrolidone, 1,3-dimethyl-2-imidazolidinone and diethylene glycol monomethyl ether. These solvents may be used singly or two or more may be mixed and used together. The amount used may be set to from 5 to 100 wt % of the total solvent used in the varnish.

In this invention, by including in the varnish at least one high-viscosity organic solvent with a viscosity at 25° C. of 10 to 200 mPa·s, especially 35 to 150 mPa·s, and a boiling point at normal pressure (atmospheric pressure) of 50 to 300° C., especially 150 to 250° C., adjustment of the varnish viscosity is easy. As a result, it is possible to prepare a varnish which is suitable for the coating method and reproducibly gives thin films having a high flatness.

Illustrative examples of high-viscosity organic solvents include, but are not limited to, cyclohexanol, ethylene glycol, ethylene glycol diglycidyl ether, 1,3-octylene glycol, diethylene glycol, dipropylene glycol, triethylene glycol, tripropylene glycol, 1,3-butanediol, 2,3-butanediol, 1,4-butanediol, propylene glycol and hexylene glycol. These solvents may be used singly, or two or more may be mixed and used together.

The proportion in which a high-viscosity organic solvent is added relative to the overall solvent used in the inventive varnish is preferably in a range where solids do not precipitate out. The proportion of such addition is preferably from 5 to 90 wt %, provided that no precipitation of solids occurs.

In addition, other solvents may be admixed in a proportion with respect to the overall solvent used in the varnish of 1 to 90 mass %, and preferably 1 to 50 mass %, for such purposes as to enhance the substrate wettability by the varnish, adjust the surface tension of the solvent, adjust the polarity, and adjust the boiling point.

Illustrative examples of such solvents include, but are not limited to, propylene glycol monomethyl ether, ethylene glycol monobutyl ether, diethylene glycol diethyl ether, diethylene glycol dimethyl ether, diethylene glycol monoethyl ether acetate, diethylene glycol monobutyl ether acetate, dipropylene glycol monomethyl ether, propylene glycol monomethyl ether acetate, diethylene glycol monoethyl ether, diacetone alcohol, γ-butyrolactone, ethyl lactate and n-hexyl acetate. These solvents may be used singly or two or more may be mixed and used together.

The charge-transporting varnish of the invention may additionally include an organosilane compound. By including an organosilane compound, in cases where a thin film obtained from the varnish is used as a hole-injecting layer in an organic EL device, the ability to inject holes into a layer that is stacked so as to be in contact with the hole injecting layer on the side opposite from the anode—be it a hole-transporting layer or a light-emitting layer—can be increased.

The organosilane compound is exemplified by dialkoxysilane compounds, trialkoxysilane compounds and tetraalkoxysilane compounds. These may be used singly, or two or more may be used in combination.

In this invention, the organosilane compound preferably includes one compound selected from dialkoxysilane compounds and trialkoxysilane compounds, more preferably includes a trialkoxysilane compound, and even more preferably includes a fluorine atom-containing trialkoxysilane compound.

These alkoxysilane compounds are exemplified by compounds of formulas (S1) to (S3).

$$\mathrm{Si(OR)_4} \tag{S1}$$

$$\mathrm{SiR'(OR)_3} \tag{S2}$$

$$\mathrm{Si(R')_2(OR)_2} \tag{S3}$$

In these formulas, each R is independently an alkyl group of 1 to 20 carbon atoms which may be substituted with $Z^6$, an alkenyl group of 2 to 20 carbon atoms which may be substituted with $Z^6$, an alkynyl group of 2 to 20 carbon atoms which may be substituted with $Z^6$, an aryl group of 6 to 20 carbon atoms which may be substituted with $Z^7$, or a heteroaryl group of 2 to 20 carbon atoms which may be substituted with $Z^7$. Each R' is independently an alkyl group of 1 to 20 carbon atoms which may be substituted with $Z^6$, an alkenyl group of 2 to 20 carbon atoms which may be substituted with $Z^8$, an alkynyl group of 2 to 20 carbon atoms which may be substituted with $Z^8$, an aryl group of 6 to 20 carbon atoms which may be substituted with $Z^9$, or a heteroaryl group of 2 to 20 carbon atoms which may be substituted with $Z^9$.

$Z^6$ is a halogen atom, an aryl group of 6 to 20 carbon atoms which may be substituted with $Z^{10}$, or a heteroaryl group of 2 to 20 carbon atoms which may be substituted with $Z^{10}$. $Z^7$ is a halogen atom, an alkyl group of 1 to 20 carbon atoms which may be substituted with $Z^{10}$, an alkenyl group of 2 to 20 carbon atoms which may be substituted with $Z^{10}$, or an alkynyl group of 2 to 20 carbon atoms which may be substituted with $Z^{10}$.

$Z^8$ is a halogen atom, an aryl group of 6 to 20 carbon atoms which may be substituted with $Z^{10}$, a heteroaryl group of 2 to 20 carbon atoms which may be substituted with $Z^{10}$, an epoxycyclohexyl group, a glycidoxy group, a methacryloxy group, an acryloxy group, a ureido group ($-\mathrm{NHCONH_2}$), a thiol group, an isocyanate group ($-\mathrm{NCO}$), an amino group, a $-\mathrm{NHY^1}$ group, or a $-\mathrm{NY^2Y^3}$ group. $Z^9$ is a halogen atom, an alkyl group of 1 to 20 carbon atoms which may be substituted with $Z^{10}$, an alkenyl group of 2 to 20 carbon atoms which may be substituted with $Z^{10}$, an alkynyl group of 2 to 20 carbon atoms which may be substituted with $Z^{10}$, an epoxycyclohexyl group, a glycidoxy group, a methacryloxy group, an acryloxy group, a ureido group ($-\mathrm{NHCONH_2}$), a thiol group, an isocyanate group ($-\mathrm{NCO}$), an amino group, a $-\mathrm{NHY^1}$ group or a $-\mathrm{NY^2Y^3}$ group, with $Y^1$ to $Y^3$ each being independently an alkyl group of 1 to 20 carbon atoms which may be substituted with $Z^{10}$, an alkenyl group of 2 to 20 carbon atoms which may be substituted with $Z^{10}$, an alkynyl group of 2 to 20 carbon atoms which may be substituted with $Z^{10}$, an aryl group of 6 to 20 carbon atoms which may be substituted with $Z^{10}$, or a heteroaryl group of 2 to 20 carbon atoms which may be substituted with $Z^{10}$.

$Z^{10}$ is a halogen atom, an amino group, a nitro group, a cyano group or a thiol group.

In formulas (S1) to (S3), the halogen atom, alkyl group of 1 to 20 carbon atoms, alkenyl group of 2 to 20 carbon atoms, alkynyl group of 2 to 20 carbon atoms, aryl group of 6 to 20 carbon atoms and heteroaryl group of 2 to 20 carbon atoms are exemplified in the same way as above.

In R and R', the number of carbon atoms on the alkyl, alkenyl and alkynyl groups is preferably 10 or less, more preferably 6 or less, and even more preferably 4 or less.

Also, the number of carbon atoms on the aryl and heteroaryl groups is preferably 14 or less, more preferably 10 or less, and even more preferably 6 or less.

R is preferably an alkyl group of 1 to 20 carbon atoms or alkenyl group of 2 to 20 carbon atoms which may be substituted with $Z^6$, or an aryl group of 6 to 20 carbon atoms which may be substituted with $Z^7$; more preferably an alkyl group of 1 to 6 carbon atoms or alkenyl group of 2 to 6 carbon atoms which may be substituted with $Z^6$, or a phenyl group which may be substituted with $Z^7$; even more preferably an alkyl group of 1 to 4 carbon atoms which may be substituted with $Z^6$ or a phenyl group which may be substituted with $Z^7$; and still more preferably a methyl group or ethyl group which may be substituted with $Z^6$.

R' is preferably an alkyl group of 1 to 20 carbon atoms which may be substituted with $Z^8$, or an aryl group of 6 to 20 carbon atoms which may be substituted with $Z^9$; more preferably an alkyl group of 1 to 10 carbon atoms which may be substituted with $Z^8$, or an aryl group of 6 to 14 carbon atoms which may be substituted with $Z^9$; even more preferably an alkyl group of 1 to 6 carbon atoms which may be substituted with $Z^8$, or an aryl group of 6 to 10 carbon atoms which may be substituted with $Z^9$; and still more preferably an alkyl group of 1 to 4 carbon atoms which may be substituted with $Z^8$, or a phenyl group which may be substituted with $Z^9$.

The plurality of R moieties may all be the same or different, and the plurality of R' moieties may likewise all be the same or different.

$Z^6$ is preferably a halogen atom or an aryl group of 6 to 20 carbon atoms which may be substituted with $Z^{10}$, more preferably a fluorine atom or a phenyl group which may be substituted with $Z^{10}$, and most preferably does not exist (i.e., is non-substituting).

$Z^7$ is preferably a halogen atom or an alkyl group of 6 to 20 carbon atoms which may be substituted with $Z^{10}$, more preferably a fluorine atom or an alkyl group of 1 to 10 carbon atoms which may be substituted with $Z^{10}$, and most preferably does not exist (i.e., is non-substituting).

$Z^8$ is preferably a halogen atom, a phenyl group which may be substituted with $Z^{10}$, a furanyl group which may be substituted with $Z^{10}$, an epoxycyclohexyl group, a glycidoxy group, a methacryloxy group, an acryloxy group, a ureido group, a thiol group, an isocyanate group, an amino group, a phenylamino group which may be substituted with $Z^{10}$, or a diphenylamino group which may be substituted with $Z^{10}$; more preferably a halogen atom; and even more preferably a fluorine atom or does not exist (i.e., is non-substituting).

$Z^9$ is preferably a halogen atom, an alkyl group of 1 to 20 carbon atoms which may be substituted with $Z^{10}$, a furanyl group which may be substituted with $Z^{10}$, an epoxycyclohexyl group, a glycidoxy group, a methacryloxy group, an acryloxy group, a ureido group, a thiol group, an isocyanate group, an amino group, a phenylamino group which may be substituted with $Z^{10}$, or a diphenylamino group which may be substituted with $Z^{10}$; more preferably a halogen atom; and even more preferably a fluorine atom or does not exist (i.e., is non-substituting).

$Z^{10}$ is preferably a halogen atom, and more preferably a fluorine atom or does not exist (i.e., is non-substituting).

Examples of organosilane compounds that may be used in this invention include, but are not limited to, the following.

Specific examples of dialkoxysilane compounds include dimethyldimethoxysilane, dimethyldiethoxysilane, methylethyldimethoxysilane, diethyldimethoxysilane, diethyldiethoxysilane, methylpropyldimethoxysilane, methylpropyldiethoxysilane, diisopropyldimethoxysilane, phenylmethyldimethoxysilane, vinylmethyldimethoxysilane, 3-glycidoxypropylmethyldimethoxysilane, 3-glycidoxypropylmethyldiethoxysilane, 3-(3,4-epoxycyclohexyl)ethylmethyldimethoxysilane, 3-methacryloxypropylmethyldimethoxysilane, 3-methacryloxypropylmethyldiethoxysilane, 3-mercaptopropylmethyldimethoxysilane, γ-aminopropylmethyldiethoxysilane, N-(2-aminoethyl)aminopropylmethyldimethoxysilane and 3,3,3-trifluoropropylmethyldimethoxysilane.

Specific examples of trialkoxysilane compounds include methyltrimethoxysilane, methyltriethoxysilane, ethyltrimethoxysilane, ethyltriethoxysilane, propyltrimethoxysilane, propyltriethoxysilane, butyltrimethoxysilane, butyltriethoxysilane, pentyltrimethoxysilane, pentyltriethoxysilane, heptyltrimethoxysilane, heptyltriethoxysilane, octyltrimethoxysilane, octyltriethoxysilane, dodecyltrimethoxysilane, dodecyltriethoxysilane, hexadecyltrimethoxysilane, hexadecyltriethoxysilane, octadecyltrimethoxysilane, octadecyltriethoxysilane, phenyltrimethoxysilane, phenyltriethoxysilane, vinyltrimethoxysilane, vinyltriethoxysilane, γ-aminopropyltrimethoxysilane, 3-aminopropyltriethoxysilane, γ-glycidoxypropyltrimethoxysilane, 3-glycidoxypropyltriethoxysilane, γ-methacryloxypropyltrimethoxysilane, γ-methacryloxypropyltriethoxysilane, triethoxy(4-(trifluoromethyl)phenyl)silane, dodecyltriethoxysilane, 3,3,3-trifluoropropyltrimethoxysilane, (triethoxysilyl)cyclohexane, perfluorooctylethyltriethoxysilane, triethoxyfluorosilane, tridecafluoro-1,1,2,2-tetrahydrooctyltriethoxysilane, pentafluorophenyltrimethoxysilane, pentafluorophenyltriethoxysilane, 3-(heptafluoroisopropoxy)propyltriethoxysilane, heptadecafluoro-1,1,2,2-totrahydrodocyltriethoxysilane, triethoxy-2-thienylsilane and 3-(triethoxysilyl)furan.

Exemplary tetraalkoxysilane compounds include tetraethoxysilanes, tetramethoxysilanes and tetrapropoxysilanes.

Of these, 3,3,3-trifluoropropylmethyldimethoxysilane, triethoxy(4-(trifluoromethyl)phenyl)silane, 3,3,3-trifluoropropyltrimethoxysilane, perfluorooctylethyltriethoxysilane, pentafluorophenyltrimethoxysilane and pentafluorophenyltriethoxysilane are preferred.

The organosilane compound also is exemplified by organosilane compounds consisting of a polymer.

Preferred examples of such polymers are organosilane compounds that consist of a polymer having a weight-average molecular weight of 500 to 10,000 and have been prepared beforehand by hydrolytic condensation of an alkoxysilane compound. The alkoxysilane compound is exemplified by at least one selected from among those of formulas (S4) and (S5).

From the standpoint of further increasing the molecular weight of the polymer, it is especially preferable to include a trialkoxysilane compound of formula (S4).

$$SiR''(OR''')_3 \qquad (S4)$$

$$Si(R'')_2(OR''')_2 \qquad (S5)$$

Here, each R″ is independently an alkyl group of 1 to 20 carbon atoms which is substituted with $Z^{11}$ or an aryl group of 6 to 20 carbon atoms which is substituted with $Z^{12}$; each R‴ is independently an alkyl group of 1 to 20 carbon atoms which may be substituted with $Z^{13}$; $Z^{11}$ is a halogen atom, a cyano group, a nitro group, an alkoxy group of 1 to 20 carbon atoms which is substituted with $Z^{13}$, an aryl group of 6 to 20 carbon atoms which is substituted with $Z^{13}$, or a heteroaryl group of 2 to 20 carbon atoms which is substituted with $Z^{13}$; $Z^{12}$ is a halogen atom, a cyano group, a nitro group or an alkyl group of 2 to 20 carbon atoms which is substituted with $Z^{13}$; and $Z^{13}$ is a halogen atom, a cyano group or a nitro group.

Illustrative examples of alkoxy groups of 1 to 20 carbon atoms include linear or branched alkyl groups of 1 to 20 carbon atoms, such as methoxy, ethoxy, n-propoxy, isopropoxy, n-butyloxy, isobutyloxy, s-butyloxy, t-butyloxy, n-pentyloxy, n-hexyloxy, n-heptyloxy, n-octyloxy, n-nonyloxy and n-decyloxy groups; and cyclic alkyl groups of 3 to 20 carbon atoms, such as cyclopropyloxy, cyclobutyloxy, cyclopentyloxy, cyclohexyloxy, cycloheptyloxy, cyclooctyloxy, cyclononyloxy and cyclodecyloxy groups.

In addition, halogen atoms, alkyl groups of 1 to 20 carbon atoms, aryl groups of 6 to 20 carbon atoms and heteroaryl groups of 2 to 20 carbon atoms are exemplified in the same way as mentioned above.

In R″ and R‴, the number of carbon atoms on the alkyl group is preferably not more than 10, more preferably not more than 6, and even more preferably not more than 4.

The number of carbon atoms on the aryl group and the heteroaryl group is preferably not more than 14, more preferably not more than 10, and even more preferably not more than 6.

$Z^{11}$ and $Z^{12}$ are preferably halogen atoms, and most preferably fluorine atoms. $Z^{13}$ preferably does not exist in R‴ (i.e., is non-substituting), and is preferably a halogen atom, and most preferably a fluorine atom, in $Z^{11}$ and $Z^{12}$.

The alkyl group of 1 to 20 carbon atoms that is substituted with $Z^{13}$ is exemplified by the above alkyl groups of 1 to 20 carbon atoms in which at least one hydrogen atom is substituted with $Z^{13}$. Illustrative examples include halogenated alkyl groups such as chloromethyl, dichloromethyl, trichloromethyl, bromomethyl, dibromomethyl, tribromomethyl, fluoromethyl, difluoromethyl, trifluoromethyl, 2,2,2-trichloroethyl, pentachloroethyl, 2,2,2-tribromoethyl, pentabromoethyl, 2,2,2-trifluoroethyl, pentafluoroethyl, 3,3,3-trichloropropyl, 2,2,3,3-tetrachloropropyl, 2,2,3,3-pentachloropropyl, heptachloropropyl, heptachloroisopropyl, 3,3,3-tribromopropyl, 2,2,3,3-tetrabromopropyl, 2,2,3,3,3-pentabromopropyl, heptabromopropyl, heptabromoisopropyl, 3,3,3-trifluoropropyl, 2,2,3,3-tetrafluoropropyl, 2,2,3,3,3-pentafluoropropyl, heptafluoropropyl, heptafluoroisopropyl, 2,2,2-trichloro-1-(trichloromethyl)ethyl, 2,2,2-tribromo-1-(tribromomethyl)ethyl, 2,2,2-trifluoro-1-(trifluoromethyl)ethyl, 4,4,4-trichlorobutyl, nonachlorobutyl, 4,4,4-tribromobutyl, nonabromobutyl, 4,4,4-trifluorobutyl, nonafluorobutyl, 2,2,3,3,4,4,5,5-octachloropentyl, 2,2,3,3,4,4,5,5,5-nonachloropentyl, undecachloropentyl, 2,2,3,3,4,4,5,5-octabromopentyl, 2,2,3,3,4,4,5,5,5-nonabromopentyl, undecabromopentyl, 2,2,3,3,4,4,5,5-octafluoropentyl, 2,2,3,3,4,4,5,5,5-nonafluoropentyl, undecafluoropentyl, 3,3,4,4,5,5,6,6,6-nonachlorohexyl, 2,2,3,3,4,4,5,5,6,6-decachlorohexyl, 2,2,3,3,4,4,5,5,6,6,6-undecachlorohexyl, tridecachlorohexyl, 3,3,4,4,5,5,6,6-nonabromohexyl, 2,2,3,3,4,4,5,5,6,6-decabromohexyl, 2,2,3,3,4,4,5,5,6,6,6-undecabromohexyl, tridecabromohexyl, 3,3,4,4,5,5,6,6,6-nonafluorohexyl, 2,2,3,3,4,4,5,5,6,6-decafluorohexyl, 2,2,3,3,4,4,5,5,6,6,6-undecafluorohexyl, tridecafluorohexyl, tridecachloro-1,1,2,2-tetrahydrooctyl, perchlorooctyl, tridecabromo-1,1,2,2-tetrahydrooctyl, perbromooctyl, tridecafluoro-1,1,2,2-tetrahydrooctyl, perfluorooctyl, heptadecachloro-1,1,2,2-tetrahydrodecyl, heptadecabromo-1,1,2,2-tetrahydrodecyl and heptadecafluoro-1,1,2,2-tetrahydrodecyl groups; cyanoalkyl groups such as cyanomethyl, 2-cyanoethyl, 3-cyanopropyl and 4-cyanobutyl groups; and nitroalkyl groups such as nitromethyl, 2-nitroethyl, 3-nitropropyl and 4-nitrobutyl groups. A halogenated alkyl group is preferred, and a fluorinated alkyl group is more preferred.

The alkyl group of 1 to 20 carbon atoms that is substituted with $Z^{11}$ is exemplified by groups in which at least one hydrogen atom on the earlier described alkyl group of 1 to 20 carbon atoms is substituted with $Z^{11}$. Illustrative examples include, in addition to the above alkyl group of 1 to 20 carbon atoms that is substituted with $Z^{13}$: 3-(heptafluoroisopropoxy)propyl and 4-trifluoromethylphenylmethyl groups. In this case as well, alkyl groups substituted with an alkoxy, aryl or heteroaryl group having a halogen atom are preferred, and alkyl groups substituted with an alkoxy, aryl or heteroaryl group having a fluorine atom are more preferred.

The alkoxy group of 1 to 20 carbon atoms that is substituted with $Z^{13}$ is exemplified by groups obtained by excluding the hydrogen atom on a hydroxyl group from an alcohol having the above-mentioned alkyl group of 1 to 20 carbon atoms that is substituted with $Z^{13}$. Illustrative examples include chloromethoxy, dichloromethoxy, trichloromethoxy, bromomethoxy, dibromomethoxy, tribromomethoxy, fluoromethoxy, difluoromethoxy, trifluoromethoxy, 2,2,2-trichloroethoxy, pentachloroethoxy, 2,2,2-tribromoethoxy, pentabromoethoxy, 2,2,2-trifluoroethoxy, pentafluoroethoxy, 3,3,3-trichloropropoxy, 2,2,3,3-tetrachloropropoxy, 2,2,3,3,3-pentchloropropoxy, heptachloropropoxy, heptachloroisopropoxy, 3,3,3-tribromopropoxy, 2,2,3,3-tetrabromopropoxy, 2,2,3,3,3-heptabromopropoxy, heptabromopropoxy, heptabromoisopropoxy, 3,3,3-trifluoropropoxy, 2,2,3,3-tetrafluoropropoxy, 2,2,3,3,3-pentafluoropropoxy, heptafluoropropoxy and heptafluoroisopropoxy groups. Halogenated alkoxy groups are preferred, and fluorinated alkoxy groups are more preferred.

The aryl group of 6 to 20 carbon atoms that is substituted with $Z^{13}$ is exemplified by groups in which at least one hydrogen atom on the earlier described aryl group of 6 to 20 carbon atoms is substituted with $Z^{13}$. Illustrative examples include halogenated aryl groups such as 4-chlorophenyl, 4-bromophenyl, 4-fluorophenyl, 2,4-dichlorophenyl, 2,4-dibromophenyl, 2,4-difluorophenyl, pentachlorophenyl, pentabromophenyl and pentafluorophenyl groups; cyanoaryl groups such as 4-cyanophenyl, 2,4-dicyanophenyl and 2,4,6-tricyanophenyl groups; and nitroaryl groups such as 4-nitrophenyl, 2,4-dinitrophenyl and 2,4,6-trinitrophenyl groups. Halogenated aryl groups are preferred, and fluorinated aryl groups are more preferred.

The aryl group of 6 to 20 carbon atoms that is substituted with $Z^{12}$ is exemplified by, in addition to the above-mentioned aryl group of 6 to 20 carbon atoms that is substituted with $Z^{13}$, aryl groups having a halogenated alkyl group, such as 4-trichloromethylphenyl, 4-tribromomethylphenyl and 4-trifluoromethylphenyl groups. Aryl groups having a fluorinated alkyl group are preferred.

The heteroaryl group of 2 to 20 carbon atoms that is substituted with $Z^{13}$ is exemplified by groups in which at least one hydrogen atom on the earlier described heteroaryl group of 2 to 20 carbon atoms is substituted with $Z^{13}$. Illustrative examples include halogenated thienyl groups such as 5-chlorothiophen-2-yl, 5-bromothiophen-2-yl, 5-fluorothiophen-2-yl, 5-chlorothiophen-3-yl, 5-bromothiophen-3-yl and 5-fluorothiophen-3-yl groups; cyanothienyl groups such as 5-cyanothiophen-2-yl and 5-cyanothiophen-3-yl groups; nitrothionyl groups such as 5-nitrothiophen-2-yl and 5-nitrothiophen-3-yl groups; halogenated furanyl groups such as 5-chlorofuran-2-yl, 5-bromofuran-2-yl, 5-fluorofuran-2-yl, 5-chlorofuran-3-yl, 5-bromofuran-3-yl and 5-fluorofuran-3-yl groups; cyanofuranyl groups such as 5-cyanofuran-2-yl and 5-cyanofuran-3-yl groups; nitrofuranyl groups such as 5-nitrofuran-2-yl and 5-nitrofuran-3-yl groups; halogenated pyridyl groups such as 6-chloropyridin-2-yl, 6-bromopyridin-2-yl, 6-fluoropyridin-2-yl, 6-chloropyridin-3-yl, 6-bromopyridin-3-yl, 6-fluoropyridin-3-yl, 6-chloropyridin-4-yl, 6-bromopyridin-4-yl and 6-fluoropyridin-4-yl groups; cyanopyridyl groups such as 6-cyanopyridin-2-yl, 6-cyanopyridin-3-yl and 6-cyanopyridin-4-yl groups; and nitropyridyl groups such as 6-nitropyridin-2-yl, 6-nitropyridin-3-yl and 6-nitropyridin-4-yl groups.

Illustrative examples of trialkoxysilanes of above formula (S4) include triethoxy(4-(trifluoromethyl)phenyl)silane, 3,3,3-trifluoropropyltrimethoxysilane, perfluorooctyltriethoxysilane, tridecafluoro-1,1,2,2-tetrahydrooctyltriethoxysilane, pentafluorophenyltrimethoxysilane, pentafluorophenyltriethoxysilane, 3-(heptafluoroisopropoxy)propyltriethoxysilane and heptadecafluoro-1,1,2,2-tetrahydrodecyltriethoxysilane.

An example of a dialkoxysilane of above formula (S5) is 3,3,3-trifluoropropylmethyldimethoxysilane.

When synthesizing the organosilane compound (polymer) used in this invention, at least one compound selected from among alkoxysilane compounds of formulas (S6) to (S8) may be used together with alkoxysilane compounds of above formulas (S4) and/or (S5). In particular, to further increase the molecular weight of the resulting polymer, it is preferable to use a tetraalkoxysilane compound of formula (S6).

Si(OR'''')$_4$ (S6)

Si(R'''')$_2$(OR'''')$_2$ (S7)

SiR''''(OR'''')$_3$ (S8)

Here, each R'''' is independently an alkyl group of 1 to 20 carbon atoms which may be substituted with $Z^{13}$; each R'''' is independently an alkyl group of 1 to 20 carbon atoms, an alkenyl group of 2 to 20 carbon atoms which may be substituted with $Z^{14}$, an alkynyl group of 2 to 20 carbon atoms which may be substituted with $Z^{14}$, an aryl group of 6 to 20 carbon atoms, or a heteroaryl group of 2 to 20 carbon atoms which may be substituted with $Z^{15}$; $Z^{14}$ is a halogen atom, a nitro group, a cyano group, a hydroxyl group, a thiol group, an aryl group of 6 to 20 carbon atoms which may be substituted with $Z^{16}$, or a heteroaryl group of 2 to 20 carbon atoms which may be substituted with $Z^{16}$; $Z^{15}$ is a halogen atom, a nitro group, a cyano group, a hydroxyl group, a thiol group, an alkyl group of 1 to 20 carbon atoms which may be substituted with $Z^{16}$, an alkenyl group of 1 to 20 carbon atoms which may be substituted with $Z^{16}$, or an alkynyl group of 1 to 20 carbon atoms which may be substituted with $Z^{16}$; and $Z^{16}$ is a halogen atom, a nitro group, a cyano group, a hydroxyl group or a thiol group. Here, $Z^{13}$ has the same meaning as above.

The foregoing halogen atom, alkyl group of 1 to 20 carbon atoms, alkenyl group of 2 to 20 carbons, alkynyl group of 2 to 20 carbon atoms, aryl group of 6 to 20 carbon atoms and heteroaryl group of 2 to 20 carbon atoms are exemplified in the same way as above.

In R'''' and R'''', the number of carbon atoms on the alkyl, alkenyl and alkynyl groups is preferably not more than 10, more preferably not more than 6, and even more preferably not more than 4.

The number of carbon atoms on the aryl group and the heteroaryl group is preferably not more than 14, more preferably not more than 10, and even more preferably not more than 6.

R'''' is preferably an alkyl group of 1 to 6 carbon atoms, more preferably an alkyl group of 1 to 4 carbon atoms, and even more preferably a methyl or ethyl group.

R'''' is preferably an alkyl group of 1 to 20 carbon atoms or an aryl group of 6 to 20 carbon atoms; more preferably an alkyl group of 1 to 10 carbon atoms or an aryl group of 6 to 14 carbon atoms; even more preferably an alkyl group of 1 to 6 carbon atoms or an aryl group of 6 to 10 carbon atoms; and still more preferably an alkyl group of 1 to 4 carbon atoms or a phenyl group.

Also, a plurality of R'''' groups may all be the same or may differ. Likewise, a plurality of R'''' groups may all be the same or may differ.

$Z^{13}$ is preferably a halogen atom, more preferably a fluorine atom, and most preferably does not exist (i.e., is non-substituting).

$Z^{14}$ is preferably a halogen atom, a phenyl group which may be substituted with $Z^{16}$, or a furanyl group which may be substituted with $Z^{16}$; more preferably a halogen atom; and even more preferably a fluorine atom or does not exist (i.e., is non-substituting).

$Z^{15}$ is preferably a halogen atom, an alkyl group of 1 to 20 carbon atoms which may be substituted with $Z^{16}$, or a furanyl group which may be substituted with $Z^{16}$; more preferably a halogen atom; and even more preferably a fluorine atom or does not exist (i.e., is non-substituting).

$Z^{16}$ is preferably a halogen atom, and is more preferably a fluorine atom or does not exist (i.e., is non-substituting).

Illustrative examples of tetraalkoxysilane compounds of above formula (S6) include tetraethoxysilane, tetramethoxysilane and tetrapropoxysilane.

Illustrative examples of dialkoxysilane compounds of above formula (S7) include dimethyldimethoxysilane, dimethyldiethoxysilane, methylethyldimethoxysilane, diethyldimethoxysilane, diethyldiethoxysilane, methylpropyldimethoxysilane, methylpropyldiethoxysilane, diisopropyldimethoxysilane, phenylmethyldimethoxysilane and vinylmethyldimethoxysilane.

Illustrative examples of trialkoxysilane compounds of above formula (S8) include methyltrimethoxysilane, methyltriethoxysilane, ethyltrimethoxysilane, ethyltriethoxysilane, propyltrimethoxysilane, propyltriethoxysilane, butyltrimethoxysilane, butyltriethoxysilane, pentyltrimethoxysilane, pentyltriethoxysilane, heptyltrimethoxysilane, heptyltriethoxysilane, octyltrimethoxysilane, octyltriethoxysilane, dodecyltrimethoxysilane, dodecyltriethoxysilane, hexadecyltrimethoxysilane, hexadecyltriethoxysilane, octadecyltrimethoxysilane, octadecyltriethoxysilane, phenyltrimethoxysilane, phenyltriethoxysilane, vinyltrimethoxysilane, vinyltriethoxysilane, triethoxy-2-thienylsilane and 3-(triethoxysilyl)furan.

The organosilane compound consisting of the above polymer can be obtained by, for example, (partial) hydrolytic condensation of one, or a mixture of two or more, of the alkoxysilane compounds described above in the presence of water.

A common technique may be used without particular limitation as the method of hydrolysis. For example, this may be a technique in which an alkoxysilane compound is treated for 1 to 24 hours at about 20 to 100° C. in an aqueous solvent. In this case, an acid or a base may be used as the catalyst.

When the charge-transporting varnish of this invention includes an organosilane compound, the content thereof is generally about 0.1 to 50 wt %, based on the weight of the charge-transporting substances (in cases where a dopant substance is included, the combined weight of the charge-transporting substances and the dopant substance). However, from the standpoint of suppressing a decline in the charge transportability of the resulting thin film and increasing the ability to inject holes into a layer that is stacked so as to be in contact with, on the cathode side, a hole-injecting layer or the like consisting of a thin film obtained from the varnish, the content is preferably about 0.5 to 40 wt %, more preferably about 0.8 to 30 wt %, and even more preferably about 1 to 20 wt %.

The varnish of the invention has a viscosity which is suitably set in accordance with the thickness and other properties of the thin films to be produced and the solids concentration, but is generally from 1 to 50 mPa·s at 25° C., and has a surface tension which is generally from 20 to 50 mN/m.

The solids concentration of the charge-transporting varnish is suitably set while taking into account such factors as the viscosity and surface tension of the varnish and such properties of the thin film to be produced as its thickness, but is generally from about 0.1 to about 10.0 wt %. To improve the ease of applying the varnish, the solids concentration is preferably about 0.5 to 5.0 wt %, and more preferably about 1.0 to 3.0 wt %.

The method of preparing the varnish is exemplified by, but not particularly limited to, a method in which the compound of formula (1) is first dissolved in a solvent, after which the charge-transporting compound is added to the solution; and a method in which a mixture of the compound of formula (1) and the charge-transporting compound is dissolved in a solvent.

In cases where there are a plurality of organic solvents, for example, the compound of formula (1) and the charge-transporting compound may first be dissolved in a solvent that dissolves them well, after which the other solvent or solvents may be added thereto, or, alternatively, the compound of formula (1) and the charge-transporting compound may be dissolved one after the other or at the same time in a mixture of the plurality of organic solvents.

In this invention, from the standpoint of reproducibly obtaining high-flatness thin-films, after the compound of formula (1), the charge-transporting compound and the like have been dissolved in an organic solvent, it is desirable for the charge-transporting varnish to be filtered using, for example, a submicron-order filter.

A charge-transporting thin-film can be formed on a substrate by applying the above-described charge-transporting varnish onto a substrate and baking the applied varnish.

Examples of methods for applying the varnish include, but are not particularly limited to, dipping, spin coating, transfer printing, roll coating, brush coating, ink-jet printing, spraying and slit coating. It is preferable to adjust the viscosity and surface tension of the varnish according to the method of application.

When using the varnish of the invention, the baking atmosphere is not particularly limited. Thin films having a uniform film surface and a high charge transportability can be obtained not only in an open-air atmosphere, but even in an inert gas such as nitrogen or in a vacuum. Depending on the type of charge-transporting compound and the like used together with the compound of formula (1), baking the varnish in an open-air atmosphere sometimes enables thin films having a higher charge transportability to be reproducibly obtained.

The baking temperature is suitably set in the range of about 100 to 260° C. while taking into account such factors as the intended use of the resulting thin film, the degree of charge transportability to be imparted to the thin film, and the type and boiling point of the solvent. When the thin film thus obtained is to be used as a hole-injecting layer in an organic EL device, the baking temperature is preferably about 140 to 250° C., and more preferably about 145 to 240° C.

During baking, a temperature change in two or more steps may be applied for such purposes as to achieve more uniform film formability or to induce the reaction to proceed on the substrate. Heating may be carried out using a suitable apparatus such as a hot plate or an oven.

The thickness of the charge-transporting thin film is not particularly limited. However, when the thin film is to be used as a hole-injecting layer, a hole-transporting layer or a hole-injecting-and-transporting layer in an organic EL device, a film thickness of from 5 to 200 nm is preferred. Methods for changing the film thickness include, for example, changing the solids concentration in the varnish and changing the amount of solution on the substrate during application.

The organic EL device of the invention has a pair of electrodes and also has, between these electrodes, the above-described charge-transporting thin film of the invention.

Typical organic EL device configurations include, but are not limited to, those of (a) to (f) below. In these configurations, where necessary, an electron-blocking layer or the like may be provided between the light-emitting layer and the anode, and a hole-blocking layer or the like may be provided between the light-emitting layer and the cathode. Alternatively, the hole-injecting layer, hole-transporting layer or hole-injecting-and-transporting layer may also have the function of, for example, an electron-blocking layer; and the electron-injecting layer, electron-transporting layer or electron-injecting-and-transporting layer may also have the function of, for example, a hole-blocking layer.

(a) anode/hole-injecting layer/hole-transporting layer/light-emitting layer/electron-transporting layer/electron-injecting layer/cathode (b) anode/hole-injecting layer/hole-transporting layer/light-emitting layer/electron-injecting-and-transporting layer/cathode (c) anode/hole-injecting-and-transporting layer/light-emitting layer/electron-transporting layer/electron-injecting layer/cathode (d) anode/hole-injecting-and-transporting layer/light-emitting layer/electron-injecting-and-transporting layer/cathode (e) anode/hole-injecting layer/hole-transporting layer/light-emitting layer/cathode (f) anode/hole-injecting-and-transporting layer/light-emitting layer/cathode As used herein, "hole-injecting layer," "hole-transporting layer" and "hole-injecting-and-transporting layer" refer to layers which are formed between the light-emitting layer and the anode and which have the function of transporting holes from the anode to the light-emitting layer. When only one layer of hole-transporting material is provided between the light-emitting layer and the anode, this is a "hole-injecting-and-transporting layer"; when two or more layers of hole-transporting material are provided between the light-emitting layer and the anode, the layer that is closer to the anode is a "hole-injecting layer" and the other layer is a "hole-transporting layer." In particular, thin films having not only an ability to receive holes from the anode but also an excellent ability to inject holes into a hole-transporting (light-emitting) layer may be used as the hole-injecting (transporting) layer.

In addition, "electron-injecting layer," "electron-transporting layer" and "electron-injecting-and-transporting layer" refer to layers which are formed between the light-emitting layer and the cathode and which have the function of transporting electrons from the cathode to the light-emitting layer. When only one layer of electron-transporting material is provided between the light-emitting layer and the cathode, this is an "electron-injecting-and-transporting layer"; when two or more layers of electron-transporting material are provided between the light-emitting layer and the cathode, the layer that is closer to the cathode is an "electron-injecting layer" and the other layer is an "electron-transporting layer."

The "light-emitting layer" is an organic layer having a light-emitting function. When a doping system is used, this layer includes a host material and a dopant material. The function of the host material is primarily to promote the recombination of electrons and holes and to confine the resulting excitons within the emissive layer. The function of the dopant material is to cause the excitons obtained by recombination to efficiently luminesce. In the case of a phosphorescent device, the host material functions primarily to confine within the light-emitting layer the excitons generated by the dopant.

The charge-transporting thin-film of the invention can preferably be used as a hole-injecting layer, a hole-transporting layer or a hole-transporting-and-injecting layer, and can more preferably be used as a hole-injecting layer, in an organic EL device.

The materials and method employed to fabricate an organic EL device using the charge-transporting varnish of the invention are exemplified by, but not limited to, those described below.

The electrode substrate to be used is preferably cleaned beforehand by liquid washing with, for example, a cleaning agent, alcohol or pure water. When the substrate is an anode substrate, it is preferably subjected to surface treatment such as UV/ozone treatment or oxygen-plasma treatment just prior to use. However, surface treatment need not be carried out if the anode material is composed primarily of organic substances.

An example of a method of fabricating an organic EL device in which a thin-film obtained from the charge-transporting varnish of the invention serves as a hole-injecting layer is described below.

In this method, a hole-injecting layer is formed on an electrode by applying the charge-transporting varnish of the invention onto an anode substrate, and baking the applied varnish.

A hole-transporting layer, light-emitting layer, electron-transporting layer, electron-injecting layer and cathode are then provided in this order on the hole-injecting layer. The hole-transporting layer, light-emitting layer, electron-transporting layer and electron-injecting layer may be formed by either a vapor deposition process or a coating process (wet process), depending on the properties of the material to be used.

Illustrative examples of anode materials include transparent electrodes such as indium-tin oxide (ITO) and indium-zinc oxide (IZO), and metal anodes made of a metal such as aluminum or an alloy of such a metal. An anode material on which planarizing treatment has been carried out is preferred. Use can also be made of polythiophene derivatives and polyaniline derivatives having high charge transportability.

Examples of other metals making up the metal anode include, but are not limited to, scandium, titanium, vanadium, chromium, manganese, iron, cobalt, nickel, copper, zinc, gallium, yttrium, zirconium, niobium, molybdenum, ruthenium, rhodium, palladium, cadmium, indium, scandium, lanthanum, cerium, praseodymium, neodymium, promethium, samarium, europium, gadolinium, terbium, dysprosium, holmium, erbium, thulium, ytterbium, hafnium, thallium, tungsten, rhenium, osmium, iridium, platinum, gold, titanium, lead, bismuth, and alloys thereof.

Specific examples of hole-transporting layer-forming materials include the following hole-transporting low-molecular-weight materials: triarylamines such as (triphenylamine) dimer derivatives,
[(triphenylamine) dimer] spirodimer,
N,N'-bis(naphthalen-1-yl)-N,N'-bis(phenyl)benzidine (α-NPD),
N,N'-bis(naphthalen-2-yl)-N,N'-bis(phenyl)benzidine,
N,N'-bis(3-methylphenyl)-N,N'-bis(phenyl)benzidine,
N,N'-bis(3-methylphenyl)-N,N'-bis(phenyl)-9,9-spirobifluorene,
N,N'-bis(naphthalen-1-yl)-N,N'-bis(phenyl)-9,9-spirobifluorene,
N,N'-bis(3-methylphenyl)-N,N'-bis(phenyl)-9,9-dimethylfluorene,
N,N'-bis(naphthalen-1-yl)-N,N'-bis(phenyl)-9,9-dimethylfluorene,
N,N'-bis(3-methylphenyl)-N,N'-bis(phenyl)-9,9-diphenylfluorene,
N,N'-bis(naphthalen-1-yl)-N,N'-bis(phenyl)-9,9-diphenylfluorene,
N,N'-bis(naphthalen-1-yl)-N,N'-bis(phenyl)-2,2'-dimethylbenzidine,
2,2',7,7'-tetrakis(N,N-diphenylamino)-9,9-spirobifluorene,
9,9-bis[4-(N,N-bis-biphenyl-4-yl-amino)phenyl]-9H-fluorene,
9,9-bis[4-(N,N-bis-naphthalen-2-yl-amino)phenyl]-9H-fluorene,
9,9-bis[4-(N-naphthalen-1-yl-N-phenylamino)phenyl]-9H-fluorene,
2,2',7,7'-tetrakis[N-naphthalenyl(phenyl)amino]-9,9-spirobifluorene,
N,N'-bis(phenanthren-9-yl)-N,N'-bis(phenyl)benzidine,
2,2'-bis[N,N-bis(biphenyl-4-yl)amino]-9,9-spirobifluorene,
2,2'-bis(N,N-diphenylamino)-9,9-spirobifluorene,
di[4-(N,N-di(p-tolyl)amino)phenyl]cyclohexane,
2,2',7,7'-tetra(N,N-di(p-tolyl))amino-9,9-spirobifluorene,
N,N,N',N'-tetra-naphthalen-2-yl-benzidine,
N,N,N',N'-tetra(3-methylphenyl)-3,3'-dimethylbenzidine,
N,N'-di(naphthalenyl)-N,N'-di(naphthalen-2-yl)benzidine,
N,N,N',N'-tetra(naphthalenyl)-benzidine,
N,N'-di(naphthalen-2-yl)-N,N'-diphenylbenzidine-1-4-diamine,
$N^1,N^4$-diphenyl-$N^1,N^4$-di(m-tolyl)benzene-1,4-diamine,
$N^2,N^2,N^6,N^6$-tetraphenylnaphthalene-2,6-diamino,
tris(4-(quinolin-8-yl)phenyl)amine,
2,2'-bis(3-(N,N-di(p-tolyl)amino)phenyl)biphenyl,
4,4',4''-tris[3-methylphenyl(phenyl)amino]triphenylamine (m-MTDATA) and 4,4',4''-tris[1-naphthyl(phenyl)amino]triphenylamine (1-TNATA); and oligothiophenes such as 5,5''-bis-{4-[bis(4-methylphenyl)amino]phenyl}-2,2':5',2''-terthiophene (BMA-3T).

Specific examples of light-emitting layer-forming materials include
tris(8-quinolinolate) aluminum(III) ($Alq_3$),
bis(8-quinolinolate) zinc(II) ($Znq_2$),
bis(2-methyl-8-quinolinolate)-4-(p-phenylphenolate) aluminum(III) (BAlq),
4,4'-bis(2,2-diphenylvinyl)biphenyl,
9,10-di(naphthalen-2-yl)anthracene,
2-t-butyl-9,10-di(naphthalen-2-yl)anthracene,
2,7-bis[9,9-di(4-methylphenyl)-fluoren-2-yl]-9,9-di(4-methylphenyl)fluorene,
2-methyl-9,10-bis(naphthalen-2-yl)anthracene,
2-(9,9-spirobifluoren-2-yl)-9,9-spirobifluorene,
2,7-bis(9,9-spirobifluoren-2-yl)-9,9-spirobifluorene,
2-[9,9-di(4-methylphenyl)-fluoren-2-yl]-9,9-di(4-methylphenyl)fluorene,
2,2'-dipyrenyl-9,9-spirobifluorene,
1,3,5-tris(pyren-1-yl)benzene,
9,9-bis[4-(pyrenyl)phenyl]-9H-fluorene,
2,2'-bi(9,10-diphenylanthracene),
2,7-dipyrenyl-9,9-spirobifluorene,
1,4-di(pyren-1-yl)benzene, 1,3-di(pyren-1-yl)benzene,
6,13-di(biphenyl-4-yl)pentacene,
3,9-di(naphthalen-2-yl)perylene,
3,10-di(naphthalen-2-yl)perylene,
tris[4-(pyrenyl)-phenyl]amine,
10,10'-di(biphenyl-4-yl)-9,9'-bianthracene,
N,N'-di(naphthalen-1-yl)-N,N'-diphenyl[1,1':4',1'':4'',1'''-quaterphenyl]-4,4'''-diamine,
4,4'-di[10-(naphthalen-1-yl)anthracen-9-yl]biphenyl,
dibenzo{[f,f']-4,4',7,7'-tetraphenyl}diindeno[1,2,3-cd:1',2',3'-lm]perylene,
1-(7-(9,9'-bianthracen-10-yl)-9,9-dimethyl-9H-fluoren-2-yl)pyrene,
1-(7-(9,9'-bianthracen-10-yl)-9,9-dihexyl-9H-fluoren-2-yl)pyrene,
1,3-bis(carbazol-9-yl)benzene,
1,3,5-tris(carbazol-9-yl)benzene,
4,4',4''-tris(carbazol-9-yl)triphenylamine,
4,4'-bis(carbazol-9-yl)biphenyl (CBP),
4,4'-bis(carbazol-9-yl)-2,2'-dimethylbiphenyl,
2,7-bis(carbazol-9-yl)-9,9-dimethylfluorene,
2,2',7,7'-tetrakis(carbazol-9-yl)-9,9-spirobifluorene,
2,7-bis(carbazol-9-yl)-9,9-di(p-tolyl)fluorene,
9,9-bis[4-(carbazol-9-yl)-phenyl]fluorene,
2,7-bis(carbazol-9-yl)-9,9-spirobifluorene,
1,4-bis(triphenylsilyl)benzene,
1,3-bis(triphenylsilyl)benzene,
bis(4-N,N-diethylamino-2-methylphenyl)-4-methylphenyl-methane,
2,7-bis(carbazol-9-yl)-9,9-dioctylfluorene,
4,4''-di(triphenylsilyl)-p-terphenyl,
4,4'-di(triphenylsilyl)biphenyl,
9-(4-t-butylphenyl)-3,6-bis(triphenylsilyl)-9H-carbazole,
9-(4-t-butylphenyl)-3,6-ditrityl-9H-carbazole,
9-(4-t-butylphenyl)-3,6-bis(9-(4-methoxyphenyl)-9H-fluoren-9-yl)-9H-carbazole,
2,6-bis(3-(9H-carbazol-9-yl)phenyl)pyridine,
triphenyl(4-(9-phenyl-9H-fluoren-9-yl)phenyl)silane,
9,9-dimethyl-N,N-diphenyl-7-(4-(1-phenyl-1H-benzo[d]imidazol-2-yl)phenyl)-9H-fluoren-2-amine,
3,5-bis(3-(9H-carbazol-9-yl)phenyl)pyridine,
9,9-spirobifluoren-2-yl-diphenyl-phosphine oxide,
9,9'-(5-triphenylsilyl)-1,3-phenylene)bis(9H-carbazole),
3-(2,7-bis(diphenylphosphoryl)-9-phenyl-9H-fluoren-9-yl)-9-phenyl-9H-carbazole,
4,4,8,8,12,12-hexa(p-tolyl)-4H-8H-12H-12C-azadibenzo[cd,mn]-pyrene,
4,7-di(9H-carbazol-9-yl)-1,10-phenanthroline,
2,2'-bis(4-(carbazol-9-yl)phenyl)biphenyl,
2,8-bis(diphenylphosphoryl)dibenzo[b,d]thiophene,
bis(2-methylphenyl)diphenylsilane,
bis[3,5-di(9H-carbazol-9-yl)phenyl]diphenylsilane,
3,6-bis(carbazol-9-yl)-9-(2-ethyl-hexyl)-9H-carbazole,
3-(diphenylphosphoryl)-9-(4-(diphenylphosphoryl)phenyl)-9H-carbazole and
3,6-bis[(3,5-diphenyl)phenyl]-9-phenylcarbazole.

A light-emitting layer may be formed by co-vapor deposition of any of these materials with a light-emitting dopant.

Specific examples of light-emitting dopants include
3-(2-benzothiazolyl)-7-(diethylamino)coumarin,
2,3,6,7-tetrahydro-1,1,7,7-tetramethyl-1H,5H,11H-10-(2-benzothiazolyl)quinolidino[9,9a,1gh]coumarin,
quinacridone, N,N'-dimethyl-quinacridone,
tris(2-phenylpyridine) iridium(III) ($Ir(ppy)_3$),
bis(2-phenylpyridine)(acetylacetonate) iridium(III) ($Ir(ppy)_2(acac)$),
tris[2-(p-tolyl)pyridine) iridium(III) ($Ir(mppy)_3$),
9,10-bis[N,N-di(p-tolyl)amino]anthracene,
9,10-bis[phenyl(m-tolyl)amino]anthracene,
bis[2-(2-hydroxyphenyl)benzothiazolate] zinc(II),
$N^{10},N^{10},N^{10'},N^{10'}$-tetra(p-tolyl)-9,9'-bianthracene-10,10'-diamine,
$N^{10},N^{10},N^{10'},N^{10'}$-tetraphenyl-9,9'-bianthracene-10,10'-diamine,
$N^{10},N^{10'}$-diphenyl-$N^{10},N^{10'}$-dinaphthalenyl-9,9'-bianthracene-10,10'-diamine,
4,4'-bis(9-ethyl-3-carbazovinylene)-1,1'-biphenyl,
perylene, 2,5,8,11-tetra-t-butylperylene,
1,4-bis[2-(3-N-ethylcarbazolyl)vinyl]benzene,
4,4'-bis[4-(di-p-tolylamino)styryl]biphenyl,
4-(di-p-tolylamino)-4'-[(di-p-tolylamino)styryl]stilbene,
bis[3,5-difluoro-2-(2-pyridyl)phenyl-(2-carboxypyridyl)]
4,4'-bis[4-(diphenylamino)styryl]biphenyl,
bis(2,4-difluorophenylpyridinato)tetrakis(1-pyrazolyl)borate iridium(III),
N,N'-bis(naphthalen-2-yl)-N,N'-bis(phenyl)-tris(9,9-dimethylfluorenylene),
2,7-bis{2-[phenyl(m-tolyl)amino]-9,9-dimethylfluoren-7-yl}-9,9-dimethyl-fluorene,
N-(4-((E)-2-(6((E)-4-(diphenylamino)styryl)naphthalen-2-yl)vinyl)phenyl)-N-phenylbenzenamine,
fac-iridium(III) tris(1-phenyl-3-methylbenzimidazolin-2-ylidene-C,$C^{2'}$),
mer-iridium(III) tris(1-phenyl-3-methylbenzimidazolin-2-ylidene-C,$C^{2'}$),
2,7-bis[4-(diphenylamino)styryl]-9,9-spirobifluorene,
6-methyl-2-(4-(9-(4-(6-methylbenzo[d]thiazol-2-yl)phenyl)-anthracen-10-yl)phenyl)benzo[d]thiazole,
1,4-di[4-(N,N-diphenyl)amino]styrylbenzene,
1,4-bis(4-(9H-carbazol-9-yl)styryl)benzene,
(E)-6-(4-(diphenylamino)styryl)-N,N-diphenylnaphthalen-2-amine,
bis(2,4-difluorophenylpyridinato)(5-(pyridin-2-yl)-1H-tetrazolate) iridium(III),
bis(3-trifluoromethyl-5-(2-pyridyl)pyrazole)((2,4-difluorobenzyl)diphenylphosphinate) iridium(III),
bis(3-trifluoromethyl-5-(2-pyridyl)pyrazolate)(benzyl-diphenylphosphinate) iridium(III), bis(1-(2,4-difluorobenzyl)-3-methylbenzimidazolium)(3-(trifluoromethyl)-5-(2-pyridyl)-1,2,4-triazolate) iridium (III),
bis(3-trifluoromethyl-5-(2-pyridyl)pyrazolate)(4',6'-difluorophenylpyridinate) iridium(III),
bis(4',6'-difluorophenylpyridinato)(3,5-bis(trifluoromethyl)-2-(2'-pyridyl)pyrrolate) iridium(III),
bis(4',6'-difluorophenylpyridinato)(3-(trifluoromethyl)-5-(2-pyridyl)-1,2,4-triazolate) iridium (III),
(Z)-6-mesityl-N-(6-mesitylquinolin-2(1H)-ylidene)quinoline-2-amine-$BF_2$,
(E)-2-(2-(4-(dimethylamino)styryl)-6-methyl-4H-pyran-4-ylidene)malononitrile,
4-(dicyanomethylene)-2-methyl-6-julolidyl-9-enyl-4-H-pyran,
4-(dicyanomethylene)-2-methyl-6-(1,1,7,7-tetramethyl-julolidyl-9-enyl)-4H-pyran,
4-(dicyanomethylene)-2-t-butyl-6-(1,1,7,7-tetramethyl-julolidin-4-ylvinyl)-4H-pyran,
tris(dibenzoylmethane)phenanthroline europium(III),
5,6,11,12-tetraphenylnaphthacene,
bis(2-benzo[b]thiophen-2-yl-pyridine)(acetylacetonate) iridium(III),
tris(1-phenylisoquinoline) iridium(III),
bis(1-phenylisoquinoline)(acetylacetonate) iridium(III),
bis[1-(9,9-dimethyl-9H-fluoren-2-yl)isoquinoline]-(acetylacetonate) iridium(III),
bis[2-(9,9-dimethyl-9H-fluoren-2-yl)quinoline]-(acetylacetonate) iridium(III),
tris[4,4'-di-t-butyl-(2,2')-bipyridine] ruthenium(III).bis(hexafluorophosphate),
tris(2-phenylquinoline) iridium(III),
bis(2-phenylquinoline)(acetylacetonate) iridium(III),
2,8-di-t-butyl-5,11-bis(4-t-butylphenyl)-6,12-diphenyltetracene,
bis(2-phenylbenzothiazolate)(acetylacetonate) iridium(III),
platinum 5,10,15,20-tetraphenyltetrabenzoporphyrin,
osmium(II) bis(3-trifluoromethyl-5-(2-pyridine)pyrazolate)-dimethylphenylphosphine,
osmium(II) bis(3-trifluoromethyl)-5-(4-t-butylpyridyl)-1,2,4-triazolate)diphenylmethylphosphine,
osmium(II) bis(3-(trifluoromethyl)-5-(2-pyridyl)-1,2,4-triazole)dimethylphenylphosphine,
osmium(II) bis(3-(trifluoromethyl)-5-(4-t-butylpyridyl)-1,2,4-triazolate)dimethylphenylphosphine,
bis[2-(4-n-hexylphenyl)quinoline](acetylacetonate) iridium (III),
tris[2-(4-n-hexylphenyl)quinoline] iridium(III),
tris[2-phenyl-4-methylquinoline] iridium(III),
bis(2-phenylquinoline)(2-(3-methylphenyl)pyridinate) iridium(III),
bis(2-(9,9-diethyl-fluoren-2-yl)-1-phenyl-1H-benzo[d]-imidazolato)(acetylacetonate) iridium(III),
bis(2-phenylpyridine)(3-(pyridin-2-yl)-2H-chromen-9-onate) iridium(III),
bis(2-phenylquinoline)(2,2,6,6-tetramethylheptane-3,5-dionate) iridium(III),
bis(phenylisoquinoline)(2,2,6,6-tetramethylheptane-3,5-dionate) iridium(III),
iridium(III) bis(4-phenylthieno[3,2-c]pyridinato-N,$C^{2'}$)-acetylacetonate,
(E)-2-(2-t-butyl-6-(2-(2,6,6-trimethyl-2,4,5,6-tetrahydro-1H-pyrrolo[3,2,1-ij]quinolin-8-yl)vinyl)-4H-pyran-4-ylidene)-malononitrile,
bis(3-trifluoromethyl-5-(1-isoquinolyl)pyrazolate)(methyldiphenylphosphine) ruthenium,
bis[(4-n-hexylphenyl)isoquinoline](acetylacetonate) iridium(III),
platinum(II) octaethylporphin,
bis(2-methyldibenzo[f,h]quinoxaline)(acetylacetonate) iridium(III) and
tris[(4-n-hexylphenyl)isoquinoline] iridium(III).

Specific examples of electron-transporting layer-forming materials include
lithium 8-hydroxyquinolinate,
2,2',2"-(1,3,5-benzinetriyl)-tris(1-phenyl-1-H-benzimidazole),
2-(4-biphenyl)-5-(4-t-butylphenyl)-1,3,4-oxadiazole,
2,9-dimethyl-4,7-diphenyl-1,10-phenanthroline,
4,7-diphenyl-1,10-phenanthroline,
bis(2-methyl-8-quinolinolate)-4-(phenylphenolato)aluminum,
1,3-bis[2-(2,2'-bipyridin-6-yl)-1,3,4-oxadiazo-5-yl]benzene,
6,6'-bis[5-(biphenyl-4-yl)-1,3,4-oxadiazo-2-yl]-2,2'-bipyridine,
3-(4-biphenyl)-4-phenyl-5-t-butylphenyl-1,2,4-triazole,
4-(naphthalen-1-yl)-3,5-diphenyl-4H-1,2,4-triazole,
2,9-bis(naphthalen-2-yl)-4,7-diphenyl-1,10-phenanthroline,
2,7-bis[2-(2,2'-bipyridin-6-yl)-1,3,4-oxadiazo-5-yl]-9,9-dimethylfluorene,
1,3-bis[2-(4-t-butylphenyl)-1,3,4-oxadiazo-5-yl]benzene,
tris(2,4,6-trimethyl-3-(pyridin-3-yl)phenyl)borane,
1-methyl-2-(4-(naphthalen-2-yl)phenyl)-1H-imidazo-[4,5f][1,10]phenanthroline,
2-(naphthalen-2-yl)-4,7-diphenyl-1,10-phenanthroline,
phenyldipyrenylphosphine oxide,
3,3',5,5'-tetra[(m-pyridyl)-phen-3-yl]biphenyl,
1,3,5-tris[(3-pyridyl)-phen-3-yl]benzene,
4,4'-bis(4,6-diphenyl-1,3,5-triazin-2-yl)biphenyl,
1,3-bis[3,5-di(pyridin-3-yl)phenyl]benzene,
bis(10-hydroxybenzo[h]quinolinato)beryllium,
diphenylbis(4-(pyridin-3-yl)phenyl)silane and
3,5-di(pyren-1-yl)pyridine.

Examples of electron-injecting layer-forming materials include lithium oxide ($Li_2O$), magnesium oxide (MgO), alumina ($Al_2O_3$), lithium fluoride (LiF), sodium fluoride (NaF), magnesium fluoride ($MgF_2$), cesium fluoride (CsF), strontium fluoride ($SrF_2$), molybdenum trioxide ($MoO_3$), aluminum, Li(acac), lithium acetate and lithium benzoate.

Examples of cathode materials include aluminum, magnesium-silver alloys, aluminum-lithium alloys, lithium, sodium, potassium and cesium.

Another example of a method of fabricating an organic EL device having a hole-injecting layer consisting of a thin film obtained from the charge-transporting varnish of the invention is as follows.

An organic EL device having a charge-transporting thin film formed using the charge-transporting varnish of the invention can be produced by, in fabrication of the EL device as described above, successively forming a hole-transporting layer (referred to below as a "hole-transporting polymer layer") and a light-emitting layer (referred to below as a "light-emitting polymer layer") instead of carrying out vacuum evaporation operations for a hole-transporting layer, a light-emitting layer, an electron-transporting layer and an electron-injecting layer.

Specifically, the charge-transporting varnish of the invention is applied onto an anode substrate, and a hole-injecting layer is formed by the above-described method. A hole-transporting polymer layer and a light-emitting polymer layer are then successively formed thereon, following which a cathode material is vapor-deposited on top, thereby giving an organic EL device.

The cathode and anode materials used here may be similar to those described above, and similar cleaning treatment and surface treatment may be carried out.

The method of forming the hole-transporting polymer layer and the light-emitting polymer layer is exemplified by a film-forming method that involves adding a solvent to a hole-transporting polymer material or a light-emitting polymer material, or to the material obtained by adding a dopant to these, thereby dissolving or uniformly dispersing the material, and then applying the resulting solution or dispersion onto, respectively, the hole-injecting layer or the hole-transporting polymer layer and subsequently baking the applied layer.

Examples of hole-transporting polymer materials include
poly[(9,9-dihexylfluorenyl-2,7-diyl)-co-(N,N'-bis{p-butylphenyl}-1,4-diaminophenylene)],
poly[(9,9-dioctylfluorenyl-2,7-diyl)-co-(N,N'-bis{p-butylphenyl}-1,1'-biphenylene-4,4-diamine)],
poly[(9,9-bis{1'-penten-5'-yl}fluorenyl-2,7-diyl)-co-(N,N'-bis{p-butylphenyl}-1,4-diaminophenylene)],
poly[N,N'-bis(4-butylphenyl)-N,N'-bis(phenyl)-benzidine] end-capped with polysilsesquioxane and
poly[(9,9-dioctylfluorenyl-2,7-diyl)-co-(4,4'-(N-(p-butylphenyl))diphenylamine)].

Examples of light-emitting polymer materials include polyfluorene derivatives such as poly(9,9-dialkylfluorene) (PDAF), poly(phenylene vinylene) derivatives such as poly (2-methoxy-5-(2'-ethylhexoxy)-1,4-phenylene vinylene) (MEH-PPV), polythiophene derivatives such as poly(3-alkylthiophene) (PAT), and polyvinylcarbazole (PVCz).

Examples of the solvent include toluene, xylene and chloroform. Examples of the method of dissolution or uniform dispersion include stirring, stirring under applied heat, and ultrasonic dispersion.

Examples of the coating method include, but are not particularly limited to, inkjet printing, spraying, dipping, spin coating, transfer printing, roll coating and brush coating. Coating is preferably carried out in an inert gas atmosphere such as nitrogen or argon.

Examples of the baking method include methods that involve heating in an oven or on a hot plate, either within an inert gas atmosphere or in a vacuum.

An example is described below of a method of fabricating an organic EL device having a hole-transporting layer consisting of a thin film obtained from the charge-transporting varnish of the invention.

A hole-injecting layer is formed on an anode substrate. The charge-transporting varnish of the invention is applied onto this layer and baked by the above-described method, thereby producing a hole-transporting layer.

A light-emitting layer, an electron-transporting layer, an electron-injecting layer and a cathode are provided in this order on the hole-transporting layer. Methods of forming the light-emitting layer, electron-transporting layer and electron-injecting layer, and specific examples of each, are exemplified in the same way as above. The hole-injecting layer may be formed by a vapor deposition process or a coating process (wet process), depending on the properties, etc. of the material used.

Illustrative examples of materials that form a hole-injecting layer include
copper phthalocyanine, titanium oxide phthalocyanine, platinum phthalocyanine,
pyrazino[2,3-f][1,10]phenanthroline-2,3-dicarbonitrile,
N,N,N',N'-tetrakis(4-methoxyphenyl)benzidine,
2,7-bis[N,N-bis(4-methoxy-phenyl)amino]-9,9-spirobifluorene,
2,2'-bis[N,N-bis(4-methoxy-phenyl)amino]-9,9-spirobifluorene,
N,N'-diphenyl-N,N'-di[4-(N,N-ditolylamino)phenyl]benzidine,
N,N'-diphenyl-N,N'-di[4-(N,N-diphenylamino)phenyl]benzidine,
$N^4,N^{4'}$-(biphenyl-4,4-diyl)bis($N^4,N^{4'},N^{4'}$-triphenylbiphenyl-4,4'-diamine),
$N^1,N^{1'}$-(biphenyl-4,4'-diyl)bis($N^1$-phenyl-$N^4,N^{4'}$-di-m-tolylbenzene-1,4-diamine), and
the charge-transporting materials mentioned in WO 2004/043117, WO 2004/105446, WO 2005/000832, WO 2005/043962, WO 2005/042621, WO 2005/107335, WO 2006/006459, WO 2006/025342, WO 2006/137473, WO 2007/049631, WO 2007/099808, WO 2008/010474, WO 2008/032617, WO 2008/032616, WO 2008/129947, WO 2009/096352, WO 2010/041701, WO 2010/058777, WO 2010/058776, WO 2013/042623, WO 2013/129249, WO 2014/115865, WO 2014/132917, WO 2014/141998 and WO 2014/132834.

The anode material, the light-emitting layer, the light-emitting dopant, the materials which form the electron-transporting layer and the electron-blocking layer, and the cathode material are exemplified in the same way as above.

An example is described below of a method of fabricating an organic EL device having a hole-injecting-and-transporting layer consisting of a thin film obtained from the charge-transporting varnish of the invention.

A hole-injecting-and-transporting layer is formed on an anode substrate, and a light-emitting layer, an electron-transporting layer, an electron-injecting layer and a cathode are provided in this order on the a hole-injecting-and-transporting layer. Methods of forming the light-emitting layer, electron-transporting layer and electron-injecting layer, and specific examples of each, are exemplified in the same way as above.

The anode material, the light-emitting layer, the light-emitting dopant, materials which form the electron-transporting layer and the electron-blocking layer, and the cathode material are exemplified in the same way as above.

A hole-blocking layer, an electron-blocking layer or the like may be optionally provided between the electrodes and any of the above layers. By way of illustration, an example of a material that forms an electron-blocking layer is tris (phenylpyrazole)iridium.

The materials which make up the layers that form the anode, the cathode and the layers formed therebetween differ according to whether a device provided with a bottom emission structure or a top emission structure is to be fabricated, and so are suitably selected while taking this into account.

Generally, in an element having a bottom emission structure, a transparent anode is used on the substrate side and light is extracted from the substrate side, whereas in an element having a top emission structure, a reflective anode made of metal is used and light is extracted from a transparent electrode (cathode) in the opposite direction from the substrate. For example, with regard to the anode material, when fabricating a device having a bottom emission structure, a transparent anode of (ITO) or the like is used, and when fabricating a device having a top emission structure, a reflective anode of Al/Nd or the like is used.

To prevent a deterioration in characteristics, the organic EL device of the invention may be sealed in the usual manner with, if necessary, a desiccant or the like.

EXAMPLES

Synthesis Examples, Working Examples and Comparative Examples are given below to more concretely illustrate the invention, although the invention is not limited by these Examples. The equipment used was as follows.

(1) Molecular Weight Measurement:
  Room-temperature gel permeation chromatography (GPC) system (GPC-101) and Shodex column (KD-803L), from Showa Denko K.K.
  (Measurement Conditions)
  Column temperature: 40° C.
  Eluant: Tetrahydrofuran (THF), 10 mL/L
  Flow rate: 1.0 mL/min
  Standard samples for constructing calibration curve: SL-105 and standard samples of polystyrene (molecular weights: approx. 580, 2,970, 7,200, 19,900 and 52,400), all products of Showa Denko K.K.
(2) Substrate Cleaning:
  Substrate cleaning machine (reduced-pressure plasma system), from Choshu Industry Co., Ltd.
(3) Varnish Coating:
  MS-A100 Spin Coater, from Mikasa Co., Ltd.
(4) Film Thickness Measurement:
  Surfcorder ET-4000 microfigure measuring instrument, from Kosaka Laboratory, Ltd.
(5) Film Surface Examination:
  1LM21D Confocal Laser Microscope (real-time scanning laser microscope), from Lasertec Corporation
(6) EL Device Fabrication:
  C-E2L1G1-N Multifunction Vapor Deposition System, from Choshu Industry Co., Ltd.
(7) Measurement of EL Device Brightness:
  I-V-L Measurement System from Tech World, Inc.
(8) Measurement of EL Device Lifetime (Measurement of Brightness Half-Life):
  PEL-105S Organic EL Brightness Life Evaluation System, from EHC K.K.

[1] Compound Synthesis

Synthesis Example 1

The thiophene derivative of the formula (TP1) below (which compound is referred to below as "TP1") was synthesized by the following method.

[Chemical Formula 48]

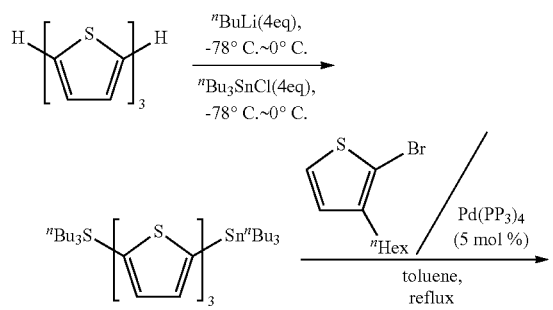

-continued

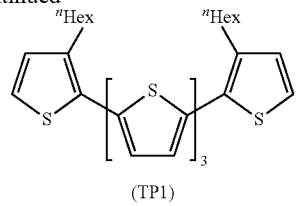

(TP1)

A flask was charged with 2.01 g of terthiophene and 50 mL of tetrahydrofuran under a nitrogen atmosphere and then cooled to −78° C. An n-hexane solution of n-butyllithium (1.64 M), 19.6 mL, was added dropwise thereto and stirred for 30 minutes while remaining at −78° C., following which the temperature was raised to 0° C. and the system was additionally stirred for 1 hour.

The system was then cooled again to −78° C. and stirred for 30 minutes. This was followed by the dropwise addition of 8.8 mL of tributylchlorostannane and 10 minutes of stirring, after which the temperature was raised to 0° C. and the system was additionally stirred for 30 minutes.

After stirring, the solvent was distilled off under reduced pressure from the reaction mixture, the residue thus obtained was added to toluene, insoluble matter was removed by filtration, and the solvent was distilled off under reduced pressure from the resulting filtrate, thereby giving 12.88 g of an oily matter containing a bisstannyl derivative of terthiophene (purity of this bisstannyl compound, 51.91%).

Next, under a nitrogen atmosphere, a separate flask was charged with, in order, 6.44 g of this oily matter containing the bisstannyl derivative of terthiophene, 2.41 g of 2-bromo-3-n-hexylthiophene, 24 mL of toluene and 0.23 g of tetrakis (triphenylphosphine)palladium, and the system was stirred for 4.5 hours under refluxing conditions.

The system was allowed to cool to room temperature and the solvent was distilled off under reduced pressure, following which insoluble matter was removed by filtration. The resulting filtrate was concentrated and purified by silica gel column chromatography, giving TP1 (amount: 1.29 g; yield: 55%; this being the total yield from two steps).

¹H-NMR (CDCl₃): 7.17 (d, J=5.1 Hz, 2H), 7.12 (d, J=3.9 Hz, 2H), 7.09 (s, 2H), 7.01 (d, J=3.9 Hz, 2H), 6.93 (d, J=5.1 Hz, 2H), 2.78 (t, J=7.7 Hz, 4H), 1.54-1.70 (m, 4H), 1.28-1.41 (m, 12H), 0.89 (t, J=7.0 Hz, 6H).

Synthesis Example 2

[Chemical Formula 49]

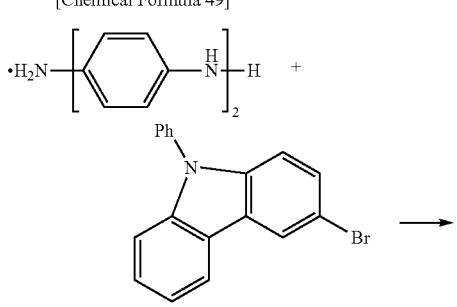

-continued

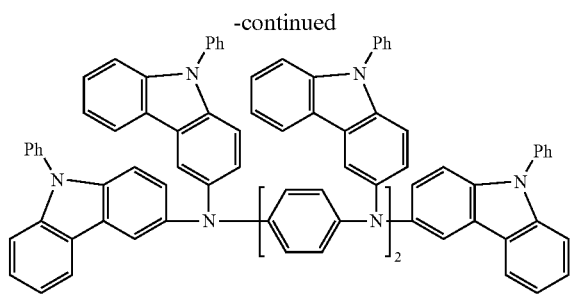

A flask was charged with 1.00 g of N1-(4-aminophenyl)-benzene-1,4-diamine, 8.89 g of 3-bromo-9-phenyl-9H-carbazole, 112 mg of palladium acetate and 3.47 g of t-butoxy sodium, following which the interior of the flask was flushed with nitrogen. To this was added 30 mL of toluene and 2.75 mL of a toluene solution of di-t-butyl(phenyl)phosphine (concentration, 81.0 g/L) that had been prepared beforehand, and the system was stirred for 6 hours at 90° C.

Following the completion of stirring, the reaction mixture was cooled to room temperature, and liquid-liquid extraction was carried out by mixing together the cooled reaction mixture, toluene and deionized water. The resulting organic phase was dried over sodium sulfate and concentrated. The liquid concentrate was filtered using silica gel, 0.2 g of activated carbon was added to the resulting filtrate, and the system was stirred at room temperature for 30 minutes.

Next, the activated carbon was removed by filtration, and the filtrate was concentrated. The liquid concentrate was added to a mixed solvent of methanol and ethyl acetate (500 mL/500 mL) and the resulting slurry was stirred overnight at room temperature, following which the slurry was filtered and the residue of filtration was recovered. The resulting residue was dried, giving the target aniline derivative (PCZ5) (amount, 5.88 g; yield, 83%).

$^1$H-NMR (300 MHz, THF-d8) δ [ppm]: 8.08 (d, J=7.7 Hz, 2H), 7.99 (d, J=7.7 Hz, 8H), 7.60-7.64 (m, 19H), 7.42-7.47 (m, 6H), 7.28-7.36 (m, 19H), 7.09-7.21 (m, 6H), 7.00 (m, 8H).

MALDI-TOF-MS, m/Z; found: 1404.68 ([M]$^+$ calculated: 1404.56).

[Synthesis Example 3] Synthesis of Organosilane Compound

An alkoxysilane monomer solution was prepared by mixing together the following in a 200 mL four-neck reaction flask equipped with a thermometer and a reflux condenser: 18.4 g of hexylene glycol, 6.1 g of butyl cellosolve, 23.3 g of tetraethoxysilane and 10.5 g of 3,3,3-trifluoropropyltrimethoxysilane.

To this solution was added dropwise, at room temperature and over a period of 30 minutes, a solution prepared beforehand by mixing together 9.2 g of hexylene glycol, 3.1 g of butyl cellosolve, 8.6 g of water and 0.7 g of oxalic acid as the catalyst, following which the system was stirred for another 30 minutes at room temperature. The system was then refluxed for 1 hour by heating on an oil bath, then allowed to cool, giving a polysiloxane solution having a concentration (SiO$_2$ basis) of 12 wt %.

The number-average molecular weight of the resulting polysiloxane was 2,500, and the weight-average molecular weight was 3,500.

Next, a polysiloxane solution having a concentration (SiO$_2$ basis) of 5 wt % was prepared by mixing together 10.0 g of the above polysiloxane solution, 42.0 g of hexylene glycol and 14.0 g of butyl cellosolve, and this polysiloxane solution was used to prepare a charge-transporting varnish.

[2] Preparation of Charge-Transporting Varnish

Working Example 1-1

The following were dissolved in 3.5 g of 1,3-dimethyl-2-imidazolidinone (abbreviated below as "DMI") under a nitrogen atmosphere: 0.024 g of TP1, 0.080 g of dipyrazino[2,3-f:2',3'-h]quinoxaline-2,3,6,7,10,11-hexacarbonitrile (from e-Ray Optoelectronic Technology Co., Ltd.; abbreviated below as "HAT-CN") and 0.104 g of phosphotungstic acid (Japan New Metals Co., Ltd.; abbreviated below as "PTA"). Next, 1.0 g of 2,3-butanediol (abbreviated below as "2,3-BD") and 0.5 g of dipropylene glycol monomethyl ether (abbreviated below as "DPM") were added to the resulting solution and stirring was carried out. Next, 0.003 g of 3,3,3-trifluoropropyltrimethoxysilane (Shin-Etsu Chemical Co., Ltd.) and 0.007 g of phenyltrimethoxysilane (Shin-Etsu Chemical Co., Ltd.) were added and stirring was carried out, thereby preparing a charge-transporting varnish.

Working Example 1-2

A charge-transporting varnish was prepared by dissolving 0.024 g of TP1 and 0.078 g of HAT-CN in 3.5 g of DMI under a nitrogen atmosphere, and then adding 1.0 g of 2,3-BD and 0.5 g of DPM to the resulting solution and stirring.

Working Example 1-3

A charge-transporting varnish was prepared by dissolving 0.088 g of PCZ5 and 0.120 g of HAT-CN in 7.0 g of DMI under a nitrogen atmosphere, and then adding 2.0 g of 2,3-BD and 1.0 g of DPM to the resulting solution and stirring.

Working Example 1-4

A charge-transporting varnish was prepared by dissolving 0.055 g of PCZ5 and 0.149 g of HAT-CN in 7.0 g of DMI under a nitrogen atmosphere, and then adding 2.0 g of 2,3-BD and 1.0 g of DPM to the resulting solution and stirring.

Working Example 1-5

A charge-transporting varnish was prepared by dissolving 0.088 g of PCZ5 and 0.120 g of HAT-CN in 7.0 g of DMI under a nitrogen atmosphere, adding 2.0 g of 2,3-BD and 1.0 g of DPM to the resulting solution and stirring, and then adding thereto 0.104 g of the polysiloxane solution prepared in Synthesis Example 3 and stirring.

Working Example 1-6

Aside from setting the amount of polysiloxane solution used to 0.208 g, a charge-transporting varnish was prepared in the same way as in Working Example 1-5.

Working Example 1-7

A charge-transporting varnish was prepared by dissolving 0.087 g of PCZ5, 0.119 g of HAT-CN and 0.103 g of PTA in 7.0 g of DMI under a nitrogen atmosphere, adding 2.0 g of 2,3-BD and 1.0 g of DPM to the resulting solution and stirring, and then adding thereto 0.007 g of 3,3,3-trifluoropropyltrimethoxysilane and 0.014 g of phenyltrimethoxysilane and stirring.

Working Example 1-8

A charge-transporting varnish was prepared by dissolving 0.176 g of PCZ5 and 0.240 g of HAT-CN in 7.0 g of DMI under a nitrogen atmosphere, adding 2.0 g of 2,3-BD and 1.0 g of DPM to the resulting solution and stirring, and then adding thereto 0.417 g of the polysiloxane solution prepared in Synthesis Example 3 and stirring.

Working Example 1-9

A charge-transporting varnish was prepared by dissolving 0.180 g of PCZ5, 0.245 g of HAT-CN and 0.213 g of PTA in 7.0 g of DMI under a nitrogen atmosphere, adding 2.0 g of 2,3-BD and 1.0 g of DPM to the resulting solution and stirring, and then adding thereto 0.014 g of 3,3,3-trifluoropropyltrimethoxysilane and 0.028 g of phenyltrimethoxysilane and stirring.

Working Example 1-10

A charge-transporting varnish was prepared by dissolving 0.074 g of PCZ5, 0.101 g of HAT-CN and 0.088 g of PTA in 3.0 g of DMI under a nitrogen atmosphere, adding 1.5 g of 2,3-BD and 0.5 g of DPM to the resulting solution and stirring, and then adding thereto 0.006 g of 3,3,3-trifluoropropyltrimethoxysilane and 0.012 g of phenyltrimethoxysilane and stirring.

Working Example 1-11

Aside from changing the amounts in which DMI, 2,3-BD and DPM were used to, respectively, 2.5 g, 2.0 g and 0.5 g, a charge-transporting varnish was prepared in the same way as in Working Example 1-10.

Working Example 1-12

Aside from changing the amounts in which DMI, 2,3-BD and DPM were used to, respectively, 2.5 g, 1.5 g and 1.0 g, a charge-transporting varnish was prepared in the same way as in Working Example 1-10.

Comparative Example 1-1

A charge-transporting varnish was prepared by dissolving 0.104 g of HAT-CN in 3.5 g of DMI under a nitrogen atmosphere, adding 1.0 g of 2,3-BD and 0.5 g of DPM to the resulting solution, and then stirring.

Comparative Example 1-2

A charge-transporting varnish was prepared by dissolving 0.104 g of HAT-CN and 0.104 g of PTA in 3.5 g of DMI, adding 1.0 g of 2,3-BD and 0.5 g of DPM to the resulting solution, and then stirring.

[3] Production of Charge-Transporting Thin Film and Examination of the Film Surface Working Example 2-1

The varnish obtained in Working Example 1-1 was coated onto an ITO substrate using a spin coater and was subsequently, in open air, pre-baked for 5 minutes at 50° C. and then subjected to a main bake for 15 minutes at 230° C., thereby forming a 30 nm thin film on an ITO substrate. A glass substrate with dimensions of 25 mm×25 mm×0.7 mm (t) and having ITO patterned on the surface to a film thickness of 150 nm was used as the ITO substrate. Here and below, prior to use, impurities on the surface were removed with an $O_2$ plasma cleaning system (150 W, 30 seconds).

Working Example 2-2

Aside from using the varnish obtained in Working Example 1-2 instead of the varnish obtained in Working Example 1-1, a thin film was formed in the same way as in Working Example 2-1.

Comparative Example 2-1

Aside from using the varnish obtained in Comparative Example 1-1 instead of the varnish obtained in Working Example 1-1 and carrying out a 10-minute bake at 150° C. instead of a 15-minute bake at 230° C., a thin film was formed in the same way as in Working Example 2-1. Measurement of the thickness of the thin-film formed was carried out. However, owing to large irregularities in the film surface, it was impossible to accurately measure the film thickness. Hence, the thickness of 30 nm for this thin film is an estimated value.

The surfaces of the thin films obtained in Working Example 2-1, Working Example 2-2 and Comparative Example 2-1 were examined using a confocal laser microscope. The results are shown in FIGS. 1 to 3.

Figure 1:
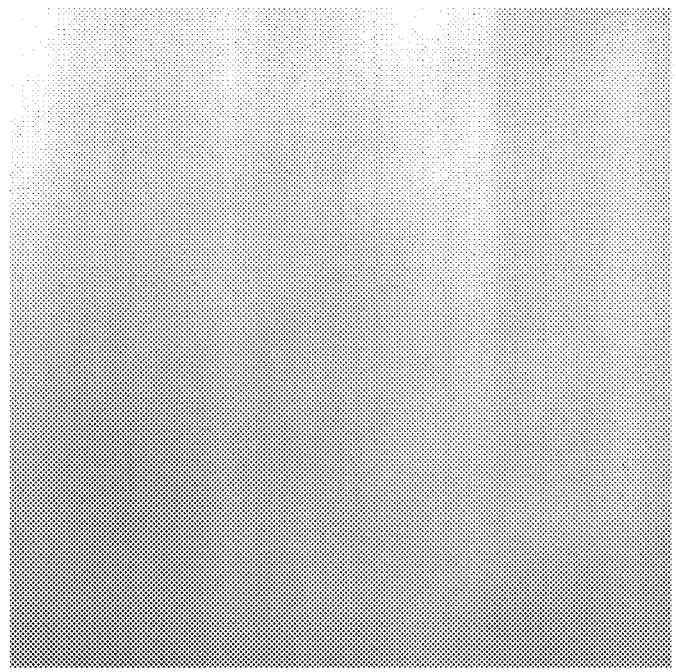
FIG. 1 shows a confocal laser microscopic image of the thin film produced in Working Example 2-1.
Figure 2:
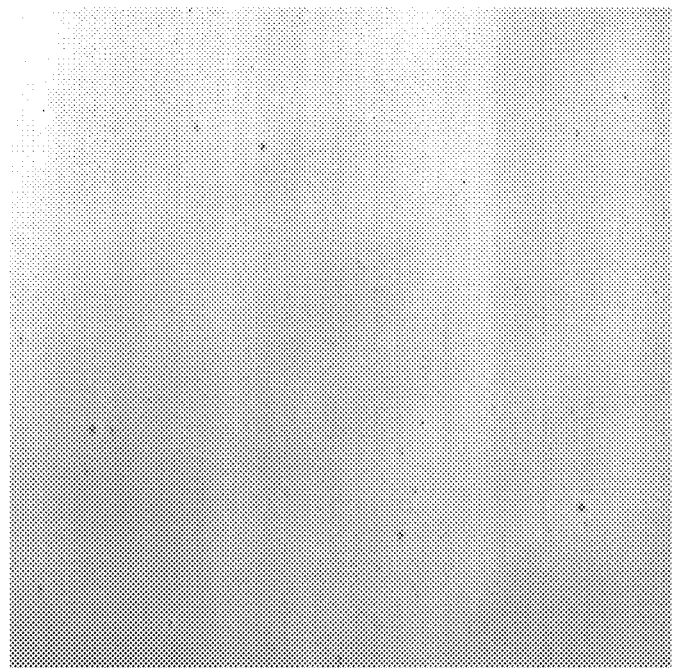
FIG. 2 shows a confocal laser microscopic image of the thin film produced in Working Example 2-2.
Figure 3:
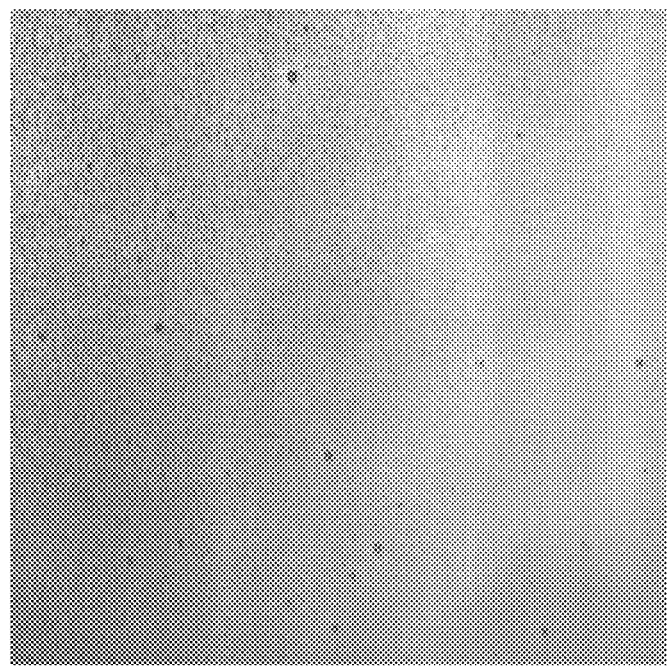
FIG. 3 shows a confocal laser microscopic image of the thin film produced in Comparative Example 2-1.

As is apparent from FIGS. 1 to 3, when the varnish from the Comparative Example was used, unevenness in the surface of the resulting thin film was observed and so a thin film having a high flatness was not obtained. By contrast, when varnishes according to the invention were used, substantially no surface unevenness was observed.

[4] Fabrication and Evaluation of Single-Layer Devices

Working Example 3-1

A uniform 30 nm thin film was formed on an ITO substrate by the same method as in Working Example 2-1.

Next, using a vapor deposition system, an aluminum thin film was formed on the resulting thin film-bearing ITO substrate, thereby giving a single-layer device. The thickness of the aluminum thin film was set to 120 nm and vapor deposition was carried out at a degree of vacuum of $1.3 \times 10^{-3}$ Pa and a deposition rate of 0.2 nm/s.

To prevent the device characteristics from deteriorating due to the influence of oxygen, moisture and the like in air, the device was sealed with sealing substrates, following which the characteristics were evaluated. Sealing was carried out by the following procedure. The device was placed between sealing substrates in a nitrogen atmosphere having an oxygen concentration of not more than 2 ppm and a dew point of not more than −85° C., and the sealing substrates were laminated together using an adhesive (MORESCO Moisture Cut WB90US(P), from Moresco Corporation). At this time, a desiccant (HD-071010W-40, from Dynic Corporation) was placed, together with the device, within the sealing substrates. The laminated sealing substrates were irradiated with UV light (wavelength, 365 nm; dosage, 6,000 mJ/cm$^2$), then annealed at 80° C. for 1 hour to cure the adhesive.

Comparative Example 3-1

A uniform 30 nm thin film was formed on an ITO substrate by the same method as in Comparative Example 2-1. A single-layer device was then fabricated in the same way as in Working Example 3-1.

Comparative Example 3-2

Aside from using the varnish obtained in Comparative Example 1-2 instead of the varnish obtained in Comparative Example 1-1, a single-layer device was fabricated in the same way as in Comparative Example 3-1.

The current density at a driving voltage of 3V was measured for the single-layer devices thus manufactured. The results are shown in Table 19.

TABLE 19

| | Current density (mA/cm$^2$) |
|---|---|
| Working Example 3-1 | 941 |
| Comparative Example 3-1 | 375 |
| Comparative Example 3-2 | 3 |

As shown in Table 19, the thin film produced from the varnish in the Working Example had an excellent charge transportability.

[5] Fabrication and Evaluation of Organic EL Devices

Working Example 4-1

A uniform 30 nm thin film was formed on an ITO substrate by the same method as in Working Example 2-1.

Using a vapor deposition system, a 30 nm film of α-NPD (N,N'-di(1-naphthyl)-N,N'-diphenylbenzidine) was then formed at a deposition rate of 0.2 nm/s on the ITO substrate where the thin film was formed. CBP and Ir(PPy)$_3$ were subsequently co-deposited. Co-deposition was carried out to a thickness of 40 nm while controlling the deposition rate so that the Ir(PPy)$_3$ concentration becomes 6%. Next, thin films of BAlq, lithium fluoride and aluminum were successively deposited, giving an organic EL device. At this time, vapor deposition was carried out at a rate of 0.2 nm/s for BAlq and aluminum, and at a rate of 0.02 nm/s for lithium fluoride. The film thicknesses were set to, respectively, 20 nm, 0.5 nm and 100 nm.

The devices were sealed by the same method as in Working Example 3-1.

[Chemical Formula 50]

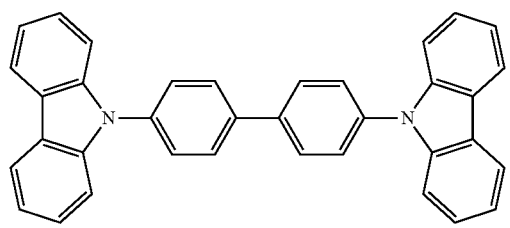

CBP

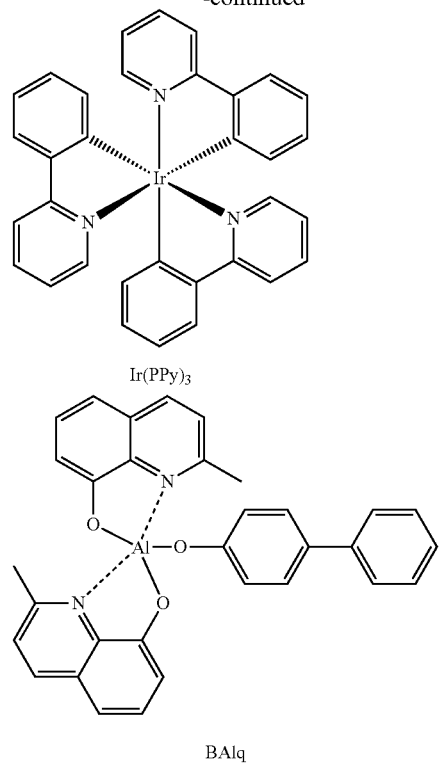

Ir(PPy)$_3$

BAlq

Working Example 4-2

Aside from using the varnish obtained in Working Example 1-2 instead of the varnish obtained in Working Example 1-1, an organic EL device was fabricated in the same way as in Working Example 4-1.

Working Example 4-3

Aside from using the varnish obtained in Working Example 1-3 instead of the varnish obtained in Working Example 1-1 and carrying out a 10-minute bake at 150° C. instead of a 15-minute bake at 230° C., an organic EL device was fabricated in the same way as in Working Example 4-1.

Working Example 4-4

Aside from using the varnish obtained in Working Example 1-4 instead of the varnish obtained in Working Example 1-1 and carrying out a 10-minute bake at 150° C. instead of a 15-minute bake at 230° C., an organic EL device was fabricated in the same way as in Working Example 4-1.

Working Example 4-5

Aside from using the varnish obtained in Working Example 1-5 instead of the varnish obtained in Working Example 1-1 and carrying out a 10-minute bake at 150° C. instead of a 15-minute bake at 230° C., an organic EL device was fabricated in the same way as in Working Example 4-1.

Working Example 4-6

Aside from using the varnish obtained in Working Example 1-6 instead of the varnish obtained in Working Example 1-1 and carrying out a 10-minute bake at 150° C. instead of a 15-minute bake at 230° C., an organic EL device was fabricated in the same way as in Working Example 4-1.

Working Example 4-7

Aside from using the varnish obtained in Working Example 1-7 instead of the varnish obtained in Working Example 1-1 and carrying out a 10-minute bake at 150° C. instead of a 15-minute bake at 230° C., an organic EL device was fabricated in the same way as in Working Example 4-1.

Working Example 4-8

Aside from using the varnish obtained in Working Example 1-8 instead of the varnish obtained in Working Example 1-1, carrying out a 10-minute bake at 150° C. instead of a 15-minute bake at 230° C. and setting the thickness of the thin film formed on the ITO substrate to 90 nm, an organic EL device was fabricated in the same way as in Working Example 4-1.

Working Example 4-9

Aside from using the varnish obtained in Working Example 1-9 instead of the varnish obtained in Working Example 1-1, carrying out a 10-minute bake at 150° C. instead of a 15-minute bake at 230° C. and setting the thickness of the thin film formed on the ITO substrate to 90 nm, an organic EL device was fabricated in the same way as in Working Example 4-1.

Working Example 4-10

Aside from using the varnish obtained in Working Example 1-10 instead of the varnish obtained in Working Example 1-1, carrying out a 10-minute bake at 150° C. instead of a 15-minute bake at 230° C. and setting the thickness of the thin film formed on the ITO substrate to 100 nm, an organic EL device was fabricated in the same way as in Working Example 4-1.

Working Example 4-11

Aside from using the varnish obtained in Working Example 1-11 instead of the varnish obtained in Working Example 1-1, carrying out a 10-minute bake at 150° C. instead of a 15-minute bake at 230° C. and setting the thickness of the thin film formed on the ITO substrate to 100 nm, an organic EL device was fabricated in the same way as in Working Example 4-1.

Working Example 4-12

Aside from using the varnish obtained in Working Example 1-12 instead of the varnish obtained in Working Example 1-1, carrying out a 10-minute bake at 150° C. instead of a 15-minute bake at 230° C. and setting the thickness of the thin film formed on the ITO substrate to 100 nm, an organic EL device was fabricated in the same way as in Working Example 4-1.

Working Example 4-13

Aside from setting the thickness of the thin film formed on the ITO substrate to 150 nm, an organic EL device was fabricated in the same way as in Working Example 4-8.

Comparative Example 4-1

A uniform 30 nm thin film was formed on an ITO substrate in the same way as in Comparative Example 2-1. An organic EL device was then fabricated by the same method as in Working Example 4-1.

Comparative Example 4-2

Aside from using the varnish obtained in Comparative Example 1-2 instead of the varnish obtained in Comparative Example 1-1, an organic EL device was fabricated in the same way as in Comparative Example 4-1.

The driving voltage, current density and current efficiency were measured when the EL devices fabricated were made to emit light at a brightness of 5,000 cd/m$^2$. The results are shown in Table 20.

TABLE 20

| | Film thickness (nm) | Driving voltage (V) | Current density (mA/cm$^2$) | Current efficiency (cd/A) |
|---|---|---|---|---|
| Working Example 4-1 | 30 | 9.37 | 20.1 | 24.9 |
| Working Example 4-2 | 30 | 9.86 | 34.4 | 14.6 |
| Working Example 4-3 | 30 | 9.34 | 10.8 | 27.7 |
| Working Example 4-4 | 30 | 9.73 | 11.1 | 27.1 |
| Working Example 4-5 | 30 | 9.71 | 18.6 | 26.8 |
| Working Example 4-6 | 30 | 9.75 | 18.3 | 27.3 |
| Working Example 4-7 | 30 | 9.91 | 18.7 | 26.8 |
| Working Example 4-8 | 90 | 9.92 | 17.0 | 29.5 |
| Working Example 4-9 | 90 | 9.89 | 20.0 | 25.0 |
| Working Example 4-10 | 100 | 9.80 | 17.7 | 28.3 |
| Working Example 4-11 | 100 | 9.76 | 17.5 | 28.6 |
| Working Example 4-12 | 100 | 9.73 | 17.2 | 29.0 |
| Working Example 4-13 | 150 | 9.91 | 17.8 | 28.1 |
| Comparative Example 4-1 | 30 | 13.04 | 24.7 | 20.3 |
| Comparative Example 4-2 | 30 | 15.04 | 26.4 | 19.0 |

As shown in Table 20, the organic EL devices in the Working Examples had low driving voltages and also had high current efficiencies.

As demonstrated above, by using a thin film obtained from a charge-transporting varnish of the invention as the hole-injecting layer of an organic EL device, it is possible to lower the driving voltage of the organic EL device.

Next, the brightness half-lives (initial brightness, 5,000 cd/m$^2$) of the devices in Working Example 4-1 and Working Examples 4-3 to 4-13 were measured. The results are shown in Table 21.

TABLE 21

| | Half-life (hours) |
|---|---|
| Working Example 4-1 | 429 |
| Working Example 4-3 | 380 |
| Working Example 4-4 | 346 |
| Working Example 4-5 | 387 |
| Working Example 4-6 | 367 |
| Working Example 4-7 | 484 |
| Working Example 4-8 | 449 |
| Working Example 4-9 | 483 |
| Working Example 4-10 | 560 |
| Working Example 4-11 | 539 |
| Working Example 4-12 | 590 |
| Working Example 4-13 | 522 |

As shown in Table 21, the organic EL devices in the Working Examples had excellent durabilities.

The invention claimed is:
1. A charge-transporting varnish which comprises a charge-transporting material and an organic solvent,
   wherein the charge-transporting material comprising a charge-transporting substance consisting of a compound of formula (1),

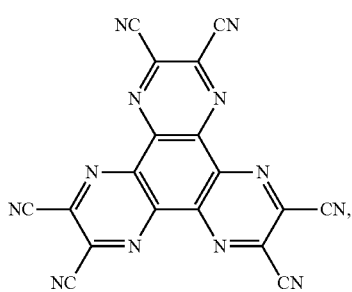

(1)

and a charge-transporting substance consisting of a charge-transporting compound having a molecular weight of 200 to 9,000 (exclusive of a compound of formula (1)) and a dopant substance, and
   wherein the charge-transporting material is dissolved in the organic solvent.
2. The charge-transporting varnish of claim 1, wherein the charge-transporting compound is at least one compound selected from the group consisting of arylamine derivatives, thiophene derivatives and pyrrole derivatives.
3. The charge-transporting varnish of claim 1, wherein the charge-transporting compound having a molecular weight of 200 to 9,000 is a compound of formula (2) or (3)

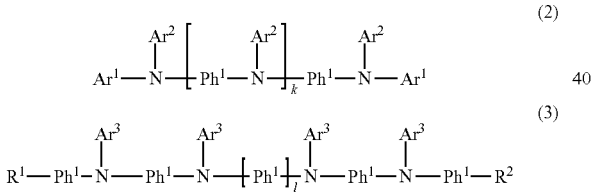

(2)
(3)

wherein, $R^1$ and $R^2$ are each independently a hydrogen atom, a halogen atom, a nitro group, a cyano group, or an alkyl group of 1 to 20 carbon atoms, alkenyl group of 2 to 20 carbon atoms, alkynyl group of 2 to 20 carbon atoms, aryl group of 6 to 20 carbon atoms or heteroaryl group of 2 to 20 carbon atoms which may be substituted with a halogen atom,
$Ph^1$ represents a group of the formula (P1)

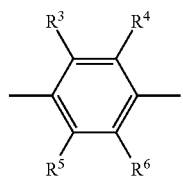

(P1)

wherein, $R^3$ to $R^6$ are each independently a hydrogen atom, a halogen atom, a nitro group, a cyano group, or an alkyl group of 1 to 20 carbon atoms, alkenyl group of 2 to 20 carbon atoms, alkynyl group of 2 to 20 carbon atoms, aryl group of 6 to 20 carbon atoms or heteroaryl group of 2 to 20 carbon atoms which may be substituted with a halogen atom,
$Ar^1$ is independently a group represented by any of formulas (B1) to (B11)

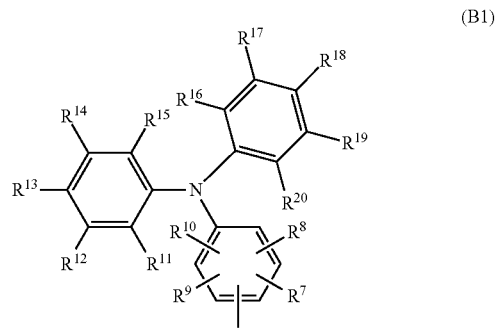

(B1)

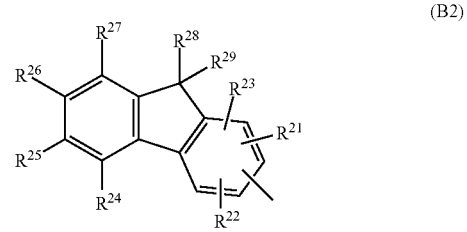

(B2)

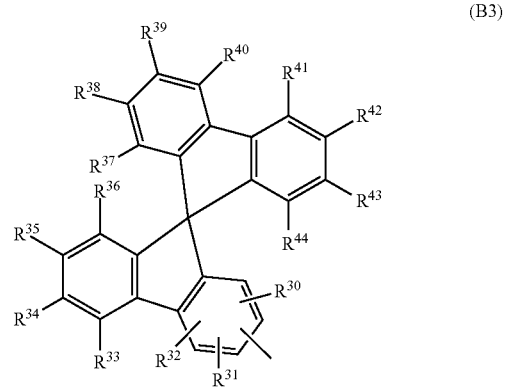

(B3)

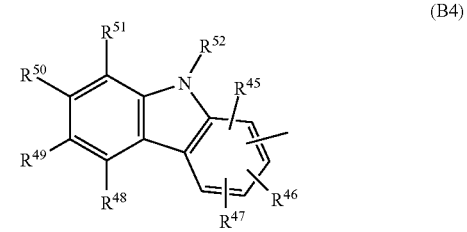

(B4)

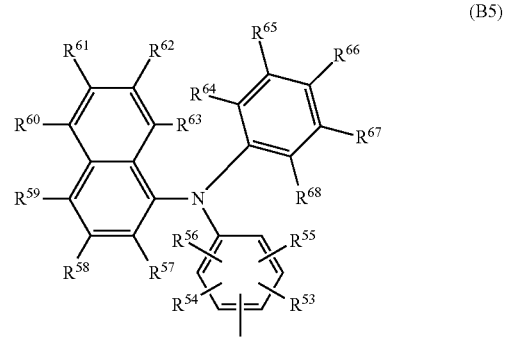

(B5)

-continued (B6) 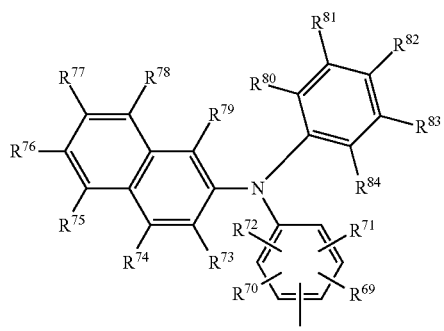

(B7) 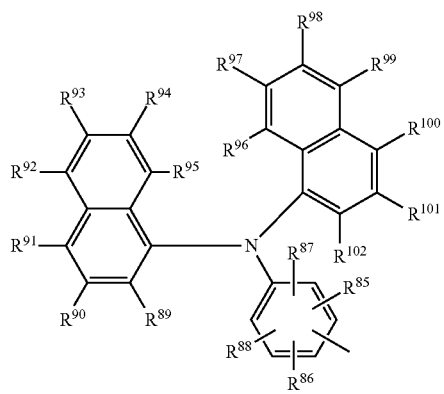

(B8) 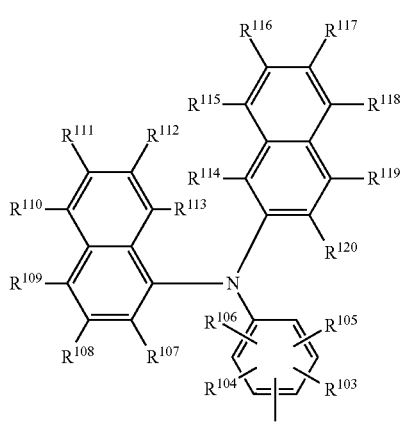

(B9) 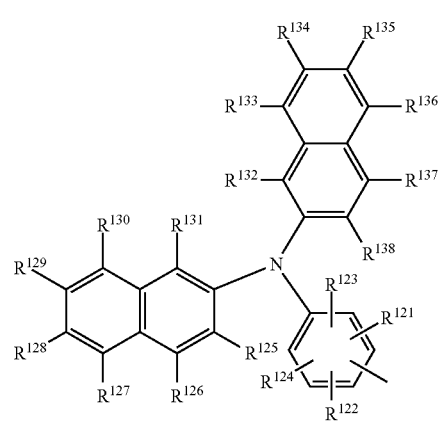

-continued (B10) 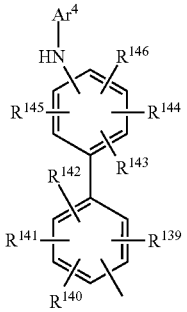

(B11) 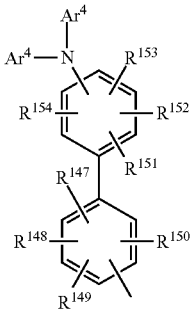

wherein, $R^7$ to $R^{27}$, $R^{30}$ to $R^{51}$ and $R^{53}$ to $R^{154}$ are each independently a hydrogen atom, a halogen atom, a nitro group, a cyano group, or a diphenylamino group, alkyl group of 1 to 20 carbon atoms, alkenyl group of 2 to 20 carbon atoms, alkynyl group of 2 to 20 carbon atoms, aryl group of 6 to 20 carbon atoms or heteroaryl group of 2 to 20 carbon atoms which may be substituted with a halogen atom; $R^{28}$ and $R^{29}$ are each independently an aryl group of 6 to 20 carbon atoms or a heteroaryl group of 2 to 20 carbon atoms which may be substituted with $Z^1$; $R^{52}$ is a hydrogen atom, an alkyl group of 1 to 20 carbon atoms, alkenyl group of 2 to 20 carbon atoms or alkynyl group of 2 to 20 carbon atoms which may be substituted with $Z^4$, or an aryl group of 6 to 20 carbons or heteroaryl group of 2 to 20 carbon atoms which may be substituted with $Z^1$; $Z^1$ is a halogen atom, a nitro group, a cyano group, or an alkyl group of 1 to 20 carbon atoms, alkenyl group of 2 to 20 carbon atoms or alkynyl group of 2 to 20 carbon atoms which may be substituted with $Z^2$; $Z^2$ is a halogen atom, a nitro group, a cyano group, or an aryl group of 6 to 20 carbon atoms or heteroaryl group of 2 to 20 carbon atoms which may be substituted with $Z^3$; $Z^3$ is a halogen atom, a nitro group or a cyano group; $Z^4$ is a halogen atom, a nitro group, a cyano group, or an aryl group of 6 to 20 carbon atoms or heteroaryl group of 2 to 20 carbon atoms which may be substituted with $Z^5$; $Z^5$ is a halogen atom, a nitro group, a cyano group, or an alkyl group of 1 to 20 carbon atoms, alkenyl group of 2 to 20 carbon atoms or alkynyl group of 2 to 20 carbon atoms which may be substituted with $Z^3$, and $Ar^4$ independently represents an aryl group of 6 to 20 carbon atoms which may be substituted with a di($C_{6-20}$ aryl)amino group, $Ar^2$ is independently a group of any one of formulas (A1) to (A18)

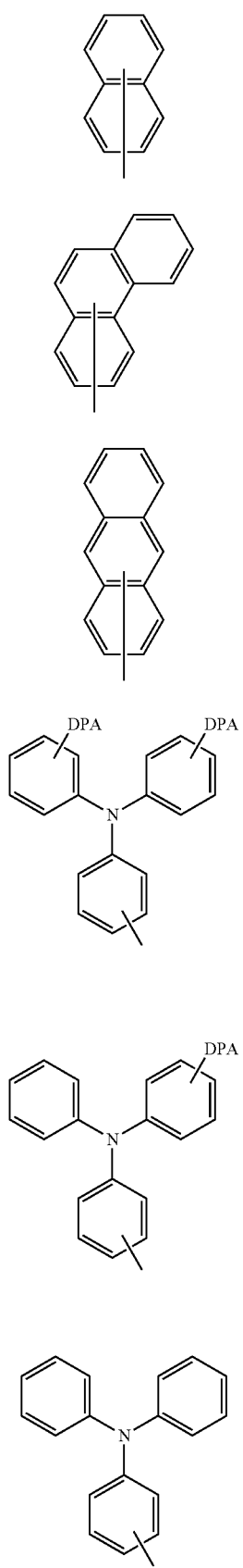
(A1)
(A2)
(A3)
(A4)
(A5)
(A6)
-continued
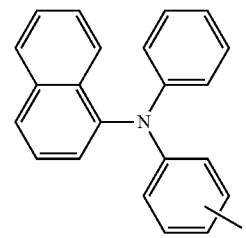
(A7)
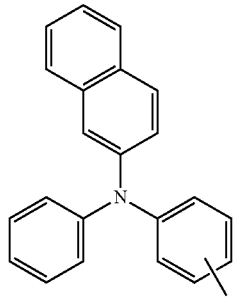
(A8)
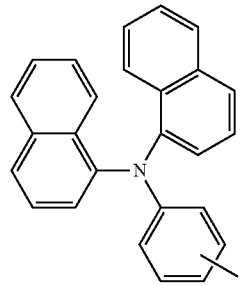
(A9)
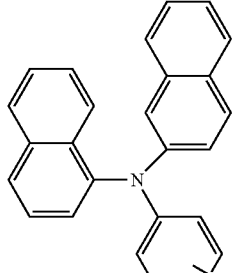
(A10)
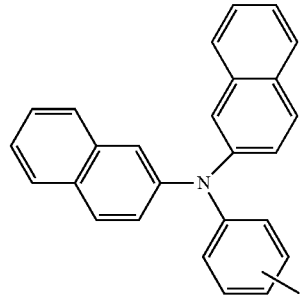
(A11)

(A12)
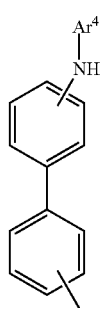

(A13)
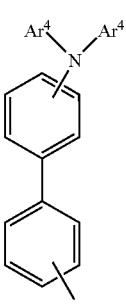

(A14)
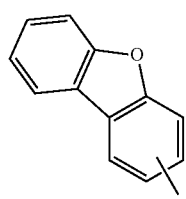

(A15)
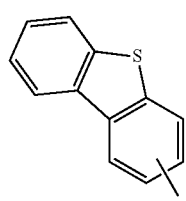

(A16)
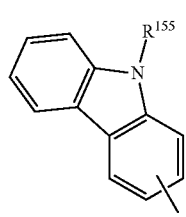

(A17)
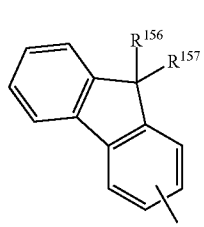

(A18)
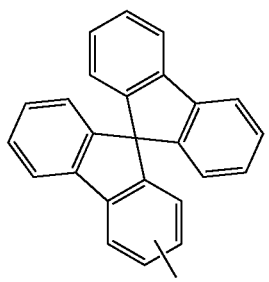

wherein, $R^{155}$ is a hydrogen atom, an alkyl group of 1 to 20 carbon atoms, alkenyl group of 2 to 20 carbon atoms or alkynyl group of 2 to 20 carbon atoms which may be substituted with $Z^4$, or an aryl group of 6 to 20 carbons or heteroaryl group of 2 to 20 carbon atoms which may be substituted with $Z^1$; $R^{156}$ and $R^{157}$ are each independently an aryl group of 6 to 20 carbon atoms or heteroaryl group of 2 to 20 carbon atoms which may be substituted with $Z^1$; DPA is a diphenylamino group; and $Ar^4$, $Z^1$ and $Z^3$ to $Z^5$ are as defined above, $Ar^3$ is a group having any of formulas (C1) to (C8)

(C1)
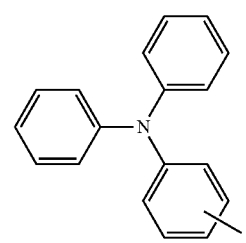

(C2)
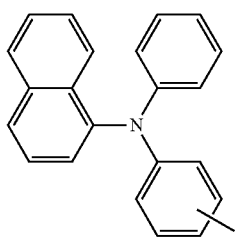

(C3)
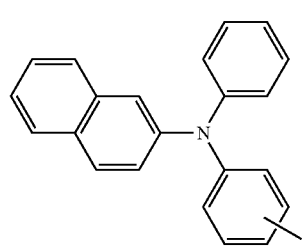

-continued

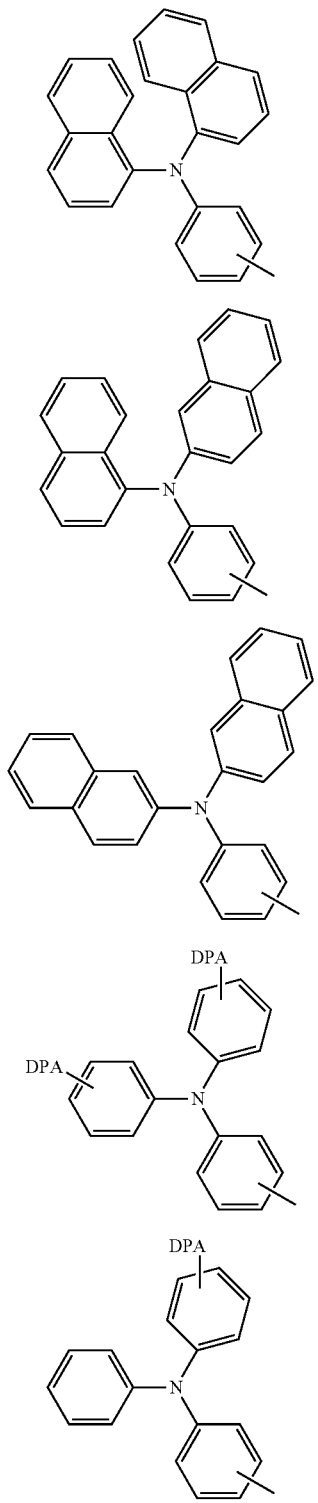

wherein, DPA is as defined above,
k is an integer from 1 to 10, and
l represents 1 or 2.

4. The charge-transporting varnish of claim 1 which further comprises an organosilane compound.

5. A charge-transporting thin film produced using the charge-transporting varnish of claim 1.

6. An organic electroluminescent device comprising the charge-transporting thin film of claim 5.

7. A method of producing a charge-transporting thin film, which method is characterized by applying the charge-transporting varnish of claim 1 onto a substrate, and drying the applied varnish.

8. A method for increasing the flatness of a charge-transporting thin film formed using a compound of formula (1)

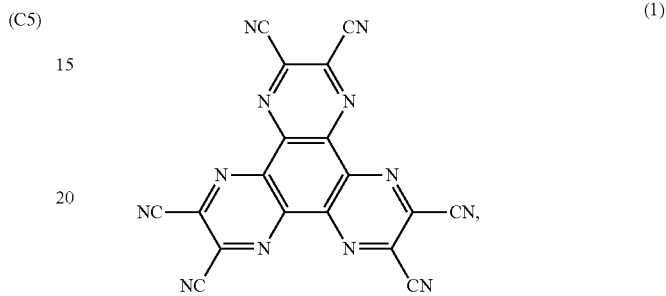

the method being characterized by using a charge-transporting varnish that includes a charge-transporting material containing a charge-transporting substance consisting of a compound of formula (1), a charge-transporting substance consisting of a charge-transporting compound having a molecular weight of 200 to 9,000 (exclusive of a compound of formula (1)) and a dopant substance and includes also an organic solvent, wherein the charge-transporting material is dissolved in the organic solvent.

9. A method for reducing the driving voltage of an organic electroluminescent device having an anode, a cathode, and a plurality of functional layers situated between these electrodes that include a light-emitting layer, a hole-injecting layer and a hole-transporting layer, the method being characterized by using a charge-transporting varnish that includes a charge-transporting material containing a charge-transporting substance consisting of a compound of formula (1), (1)

[structure of compound (1): hexaazatriphenylene hexacarbonitrile]

a charge-transporting substance consisting of a charge-transporting compound having a molecular weight of 200 to 9,000 (exclusive of a compound of formula (1)) and a dopant substance and includes also an organic solvent, wherein the charge-transporting material is dissolved in the organic solvent.

* * * * *